United States Patent
Walker et al.

(10) Patent No.: US 7,342,973 B2
(45) Date of Patent: Mar. 11, 2008

(54) METHOD AND APPARATUS FOR ADAPTING MULTI-BAND ULTRA-WIDEBAND SIGNALING TO INTERFERENCE SOURCES

(75) Inventors: Michael L. Walker, San Diego, CA (US); David S. Furuno, San Diego, CA (US); Stephan W. Gehring, Menlo Park, CA (US); Gerald D. Rogerson, Poway, CA (US); Susan C. Lin, San Diego, CA (US)

(73) Assignee: General Atomics, San Diego, CA (US)

( * ) Notice: Subject to any disclaimer, the term of this patent is extended or adjusted under 35 U.S.C. 154(b) by 872 days.

(21) Appl. No.: 10/371,064

(22) Filed: Feb. 20, 2003

(65) Prior Publication Data
US 2004/0048574 A1    Mar. 11, 2004

Related U.S. Application Data

(63) Continuation-in-part of application No. 10/255,111, filed on Sep. 26, 2002, now Pat. No. 6,895,059, and a continuation-in-part of application No. 10/255,103, filed on Sep. 26, 2002, now Pat. No. 6,781,470.

(60) Provisional application No. 60/359,147, filed on Feb. 20, 2002, provisional application No. 60/359,095, filed on Feb. 20, 2002, provisional application No. 60/359,094, filed on Feb. 20, 2002, provisional application No. 60/359,064, filed on Feb. 20, 2002, provisional application No. 60/359,046, filed on Feb. 20, 2002, provisional application No. 60/359,045, filed on Feb. 20, 2002, provisional application No. 60/359,044, filed on Feb. 20, 2002, provisional application No. 60/326,093, filed on Sep. 26, 2001.

(51) Int. Cl.
*H04K 1/00* (2006.01)
*H04B 7/02* (2006.01)

(52) U.S. Cl. ............... 375/260; 375/275; 375/267; 375/278; 370/441; 370/442

(58) Field of Classification Search ............ 375/260, 375/257, 295, 316, 265, 275, 139, 267, 278, 375/284, 285, 346, 348; 340/310.01; 455/101, 455/103; 370/441–442
See application file for complete search history.

(56) References Cited

U.S. PATENT DOCUMENTS 3,299,427 A    1/1967    Kondo et al.

(Continued)

FOREIGN PATENT DOCUMENTS

| WO | WO 01/22672 A1 | 3/2001 |
| WO | WO 01/39451 A1 | 5/2001 |
| WO | WO 02/31986 A2 | 4/2002 |

OTHER PUBLICATIONS

*PCT International Search Report*, United States International Search Authority (US/ISA), from corresponding PCT Application No. PCT/US03/05327, mailed Sep. 22, 2003, 5 pages.

(Continued)

*Primary Examiner*—David C. Payne
*Assistant Examiner*—Linda Wong
(74) *Attorney, Agent, or Firm*—Fitch, Even, Tabin & Flannery

(57) ABSTRACT

A method and apparatus for operation in a multi-frequency band system in the presence of an interference, the method comprising the steps of: receiving signaling in a plurality of wideband frequency sub-bands, each wideband frequency sub-band having a different center frequency, wherein a bandwidth of each wideband frequency sub-band is at least 2 percent of a center frequency of the wideband frequency sub-band; detecting an interfering signal having signal energy in a portion of a respective sub-band of the wideband frequency sub-bands; deciding to discontinue use of the respective sub-band; and instructing a transmitting device transmitting the signaling to transmit subsequent signaling in any except the respective sub-band of the plurality of wideband frequency sub-bands.

29 Claims, 43 Drawing Sheets

U.S. PATENT DOCUMENTS

| | | |
|---|---|---|
| 3,728,632 A | 4/1973 | Ross |
| 3,806,795 A | 4/1974 | Morey |
| 3,945,012 A | 3/1976 | Cooper |
| 4,105,950 A | 8/1978 | Dingwall |
| 4,309,703 A | 1/1982 | Blahut |
| 4,354,269 A | 10/1982 | Vries et al. |
| 4,486,882 A | 12/1984 | Piret et al. |
| 4,517,532 A | 5/1985 | Neidorff |
| 4,614,945 A | 9/1986 | Brunius et al. |
| 4,743,906 A | 5/1988 | Fullerton |
| 4,813,057 A | 3/1989 | Fullerton |
| 4,891,609 A | 1/1990 | Eilley |
| 4,978,927 A | 12/1990 | Hausman et al. |
| 4,979,186 A | 12/1990 | Fullerton |
| 4,980,897 A | 12/1990 | Decker et al. |
| 5,045,811 A | 9/1991 | Lewis |
| 5,050,188 A | 9/1991 | Dirr |
| 5,208,557 A | 5/1993 | Kersh, III |
| 5,262,735 A | 11/1993 | Hashimoto et al. |
| 5,274,629 A | 12/1993 | Helard et al. |
| 5,331,294 A | 7/1994 | Watanabe et al. |
| 5,345,471 A | 9/1994 | McEwan |
| 5,361,070 A | 11/1994 | McEwan |
| 5,363,108 A | 11/1994 | Fullerton |
| 5,418,499 A | 5/1995 | Nakao |
| 5,420,546 A | 5/1995 | Watanabe et al. |
| 5,455,593 A | 10/1995 | Ross |
| 5,465,076 A | 11/1995 | Yamauchi et al. |
| 5,471,176 A | 11/1995 | Henson et al. |
| 5,471,223 A | 11/1995 | McCorkle |
| 5,475,344 A | 12/1995 | Maneatis et al. |
| 5,475,677 A | 12/1995 | Arnold et al. |
| 5,504,783 A * | 4/1996 | Tomisato et al. ........... 375/267 |
| 5,523,758 A | 6/1996 | Harmuth |
| 5,523,760 A | 6/1996 | McEwan |
| 5,526,343 A | 6/1996 | Aizawa et al. |
| 5,553,064 A | 9/1996 | Paff et al. |
| 5,586,145 A | 12/1996 | Morgan et al. |
| 5,592,170 A | 1/1997 | Price et al. |
| 5,592,177 A | 1/1997 | Barrett |
| 5,648,967 A | 7/1997 | Schulz |
| 5,661,762 A | 8/1997 | Petranovich et al. |
| 5,666,382 A | 9/1997 | Thakore |
| 5,672,007 A * | 9/1997 | Brown et al. .................. 374/7 |
| 5,677,927 A | 10/1997 | Fullerton et al. |
| 5,710,765 A * | 1/1998 | Lee et al. ..................... 418/36 |
| 5,739,796 A | 4/1998 | Jasper et al. |
| 5,764,690 A * | 6/1998 | Blanchard et al. .......... 375/147 |
| 5,774,450 A | 6/1998 | Harada et al. |
| 5,790,527 A | 8/1998 | Janky et al. |
| 5,815,794 A | 9/1998 | Williams |
| 5,854,603 A | 12/1998 | Heger |
| 5,880,699 A | 3/1999 | McCorkle |
| 5,883,591 A | 3/1999 | McEwan |
| 5,901,172 A | 5/1999 | Fontana et al. |
| 5,952,956 A | 9/1999 | Fullerton |
| 5,963,581 A | 10/1999 | Fullerton et al. |
| 6,002,708 A | 12/1999 | Fleming et al. |
| 6,008,700 A | 12/1999 | Pietrzyk |
| 6,026,125 A | 2/2000 | Larrick, Jr. et al. |
| 6,031,862 A | 2/2000 | Fullerton et al. |
| 6,054,950 A | 4/2000 | Fontana |
| 6,061,406 A | 5/2000 | Carson et al. |
| 6,151,296 A | 11/2000 | Vijayan et al. |
| 6,154,501 A | 11/2000 | Friedman |
| 6,185,258 B1 | 2/2001 | Alamouti et al. |
| 6,191,724 B1 | 2/2001 | McEwan |
| 6,198,781 B1 | 3/2001 | Ohno et al. |
| 6,252,909 B1 | 6/2001 | Tzannes et al. |
| 6,275,544 B1 | 8/2001 | Aiello et al. |
| 6,289,038 B1 | 9/2001 | Park |
| 6,353,637 B1 * | 3/2002 | Mansour et al. ............ 375/260 |
| 6,377,566 B1 | 4/2002 | Cupo et al. |
| 6,407,986 B1 | 6/2002 | Dutta |
| 6,438,115 B1 | 8/2002 | Mazur et al. |
| 6,442,211 B1 | 8/2002 | Hampel et al. |
| 6,442,214 B1 | 8/2002 | Boleskei et al. |
| 6,445,425 B1 | 9/2002 | Limberg |
| 6,459,703 B1 | 10/2002 | Grimwood et al. |
| 6,608,552 B1 | 8/2003 | Fogel et al. |
| 6,625,222 B1 * | 9/2003 | Bertonis et al. ............ 375/259 |
| 6,810,023 B1 | 10/2004 | Dillinger et al. |
| 6,885,694 B1 | 4/2005 | He et al. |
| 6,937,674 B2 * | 8/2005 | Santhoff et al. ............ 375/346 |
| 6,987,815 B2 | 1/2006 | Denno |
| 2002/0097185 A1 | 7/2002 | Hershey et al. |
| 2002/0154620 A1 | 10/2002 | Azenkot et al. |
| 2002/0155811 A1 * | 10/2002 | Prismantas et al. ........... 455/63 |
| 2002/0168003 A1 | 11/2002 | Richards |
| 2002/0168991 A1 | 11/2002 | Kochanski et al. |
| 2003/0090407 A1 | 5/2003 | Santhoff |
| 2003/0099299 A1 | 5/2003 | Rogerson et al. |
| 2004/0028011 A1 * | 2/2004 | Gehring et al. ............. 370/330 |

OTHER PUBLICATIONS

Barrett, *History of Ultra Wideband (UWB) Radar & Communications: Pioneers and Innovators*, Progress In Electromagnetics Symposium 2000 (PIERS2000), Jul. 2000, Cambridge, MA, 42 pages.

Foerster, Jeff et al., *Ultra-Wideband Technology for Short- or Medium-Range Wireless Communications*, Intel Technology Journal Q2, 2001, 11 pages.

Hirt, Walter, *Ultra-Wideband (UWB) Radio Technology (UWB-RT) Short-Range Communication and Location Tracking*, Apr. 12, 2001, 4 pages.

Kahney, Leander, *The Third-Generation Gap*, Scientific American.com (http://www.sciam.com/print_version.cfm?articleID=00031A96-ADF7-1C73-9B81809EC588EF21), Oct. 20, 2000, 4 pages.

McCorkle, John, *Project: IEEE P802.15 Working Group For Wireless Personal Area Networks (WPANS)—A Tutorial on Ultrawideband Technology*, XtremeSpectrum, Inc., Mar. 2000, 34 pages.

Siwiak, "Ultra-Wide Band Radio: Introducing a New Technology," 2001, IEEE, pp. 1088-1093.

\* cited by examiner

METHOD AND APPARATUS FOR ADAPTING MULTI-BAND ULTRA-WIDEBAND SIGNALING TO INTERFERENCE SOURCES

RELATED APPLICATIONS

This application claims priority to U.S. Provisional Patent Application Nos. 60/359,095 ("ADAPTING TDMF SIGNALING TO NARROWBAND INTERFERENCE SOURCES," filed Feb. 20, 2002); 60/359,044 ("POLARITY SIGNALING METHODS BASED ON TDMF UWB WAVEFORMS," filed Feb. 20, 2002); 60/359,045 ("CHANNELIZATION METHODS FOR TIME-DIVISION MULTIPLE FREQUENCY COMMUNICATION CHANNELS," filed Feb. 20, 2002); 60/359,064 ("HYBRID SIGNALING METHODS BASED ON TDMF UWB WAVEFORMS," filed Feb. 20, 2002); and 60/359,147 ("TRANSMITTER AND RECEIVER FOR A TIME-DIVISION MULTIPLE FREQUENCY COMMUNICATION SYSTEM," filed Feb. 20, 2002); 60/359,094 ("PHY LEVEL ERROR DETECTION/CORRECTION FOR TDMF," filed Feb. 20, 2002); and 60/359,046 ("METHOD OF DECODING TO EXPLOIT TDMF (FREQUENCY/TIME) CHARACTERISTICS," filed Feb. 20, 2002); all of which applications are incorporated in their entirety herein by reference.

This application is a continuation-in-part (CIP) of the following U.S. patent applications, all of which are incorporated in their entirety herein by reference: U.S. patent application Ser. No. 10/255,111 ("METHOD AND APPARATUS FOR DATA TRANSFER USING A TIME DIVISION MULTIPLE FREQUENCY SCHEME", filed Sep. 26, 2002) now U.S. Pat. No. 6,895,059; and U.S. patent application Ser. No. 10/255,103 ("TUNABLE OSCILLATOR", filed Sep. 26, 2002) now U.S. Pat. No. 6,781,470.

This application is related to the following U.S. patent applications filed concurrently herewith, all of which are incorporated in their entirety herein by reference: U.S. patent application Ser. No. 10/371,065 ("METHOD AND APPARATUS FOR DATA TRANSFER USING A TIME DIVISION MULTIPLE FREQUENCY SCHEME WITH ADDITIONAL MODULATION"); U.S. patent application Ser. No. 10/372,075 ("METHOD AND APPARATUS FOR DATA TRANSFER USING A TIME DIVISION MULTIPLE FREQUENCY SCHEME SUPPLMENTED WITH POLARITY MODULATION"); U.S. patent application Ser. No. 10/371,799 ("FLEXIBLE METHOD AND APPARATUS FOR ENCODING AND DECODING SIGNALS USING A TIME DIVISION MULTIPLE FREQUENCY SCHEME"); and U.S. patent application Ser. No. 10/371,074 ("METHOD AND APPARATUS FOR ADAPTING SIGNALING TO MAXIMIZE THE EFFICIENCY OF SPECTRUM USAGE FOR MULTIBAND SYSTEMS IN THE PRESENCE OF INTERFERENCE").

BACKGROUND

1. Field of the Invention

This invention generally relates to data transfer over wired, wireless, and/or optical transmission channels. More particularly, this invention relates to reception of ultra-wideband signals in the presence of interference.

2. Background Information

As computing and communications applications become richer and more complex, there is a need to transfer information between communicating devices at higher and higher data rates or at lower cost and power consumption. Use of such devices may include large data transfers and/or multimedia applications or distributed sensor networks. For example, multimedia applications may handle multiple simultaneous streams of high-definition audio and/or video coming from devices such as business/entertainment systems and gateways necessitating high-speed connectivity between communicating devices.

Increasingly, such devices are used in mobile and changing environments, where untethered connectivity is not only a convenience for the user, but can be a functional requirement, for example, cellular phones. Wireless connectivity can provide enhanced capabilities, ease of use, and may result in cost savings and increased productivity. Accordingly, there is a need for high-speed wireless connectivity and very low cost/low power consuming devices.

For consumer electronics devices, cost and complexity of transmitter and receiver implementations are important considerations as they can significantly contribute to the device production cost. Such devices therefore benefit greatly from low-cost high-speed wireless connectivity.

Most existing wireless communication schemes transfer data by modulating continuous-wave carriers. In many cases, a portion of the radio-frequency spectrum is reserved for the exclusive use of the scheme. Data transfers may be conducted over very narrow frequency bands in an attempt to occupy less of the frequency spectrum. However, such schemes may be susceptible to increases in background noise level and to multipath interference. Some narrowband schemes may also interfere with other systems (e.g. due to a higher concentration of energy in the particular frequency band being used).

Therefore there is a need for schemes for low-cost high-speed low-power wireless devices, which are less susceptible to multipath interference. Ultra-wideband (UWB) communication methods transmit information by spreading energy over a large portion of the radio frequency spectrum. Ultra-wideband communications transmit over a very wide bandwidth with very low power density. Thus, while ultra-wideband schemes are less susceptible to multipath interference, their performance can degrade in the presence of narrowband transmissions, which are in close proximity or which transmit signals with higher power. It is prudent, therefore, to provide methods to mitigate the effects of these narrowband transmissions on the ultra-wideband communication process

SUMMARY OF THE INVENTION

In one embodiment, the present invention may be characterized as a method of operation in a multi-frequency band system in the presence of an interference, the method comprising the steps of: receiving signaling in a plurality of wideband frequency sub-bands, each wideband frequency sub-band having a different center frequency, wherein a bandwidth of each wideband frequency sub-band is at least 2 percent of a center frequency of the wideband frequency sub-band; detecting an interfering signal having signal energy in a portion of a respective sub-band of the wideband frequency sub-bands; deciding to discontinue use of the respective sub-band; and instructing a transmitting device transmitting the signaling to transmit subsequent signaling in any except the respective sub-band of the plurality of wideband frequency sub-bands.

In another embodiment, the present invention maybe characterized as a multi-frequency band receiver for operating in the presence of an interference, the receiver comprising: a signal detector configured to receive signaling in a plurality of wideband frequency sub-bands, each wideband frequency sub-band having a different center frequency, wherein a bandwidth of each wideband frequency sub-band is at least 2 percent of a center frequency of the wideband frequency sub-band; an interference detector coupled to the signal detector and configured to detect an interfering signal having signal energy in a portion of a respective sub-band of the wideband frequency sub-bands; and an interference compensator coupled to the interference detector and configured to decide to discontinue use of the respective sub-band; and the interference compensator configured to determine that subsequent signaling is to be transmitted by a transmitting device in any sub-band except the respective sub-band of the plurality of wideband frequency sub-bands In a further embodiment, the present invention may be characterized as a method of communicating channel state information to a transmitting device, the method comprising the steps of: obtaining channel configuration information, the channel configuration information indicating that a respective sub-band of a plurality of wideband frequency sub-bands includes an interfering signal having signal energy in a portion of a respective sub-band, wherein signaling occurs over the plurality of wideband frequency sub-bands between a transmitting device and a receiving device, wherein each wideband frequency sub-band has a different center frequency, wherein a bandwidth of each wideband frequency sub-band is at least 2 percent of a center frequency of the wideband frequency sub-band; transmitting a first signal in the respective sub-band including the interfering signal during a first symbol period to the transmitting device; transmitting a second signal in the respective sub-band including the interfering signal during a second symbol period to the transmitting device; and transmitting a third signal in an available sub-band not presently being used for the signaling during the second symbol period to the transmitting device; wherein the transmitting device is able to determine which sub-bands of the plurality of wideband frequency sub-bands to transmit the subsequent signaling in, based upon receipt of the first signal, the second signal and the third signal.

DETAILED DESCRIPTION

Figure 1:
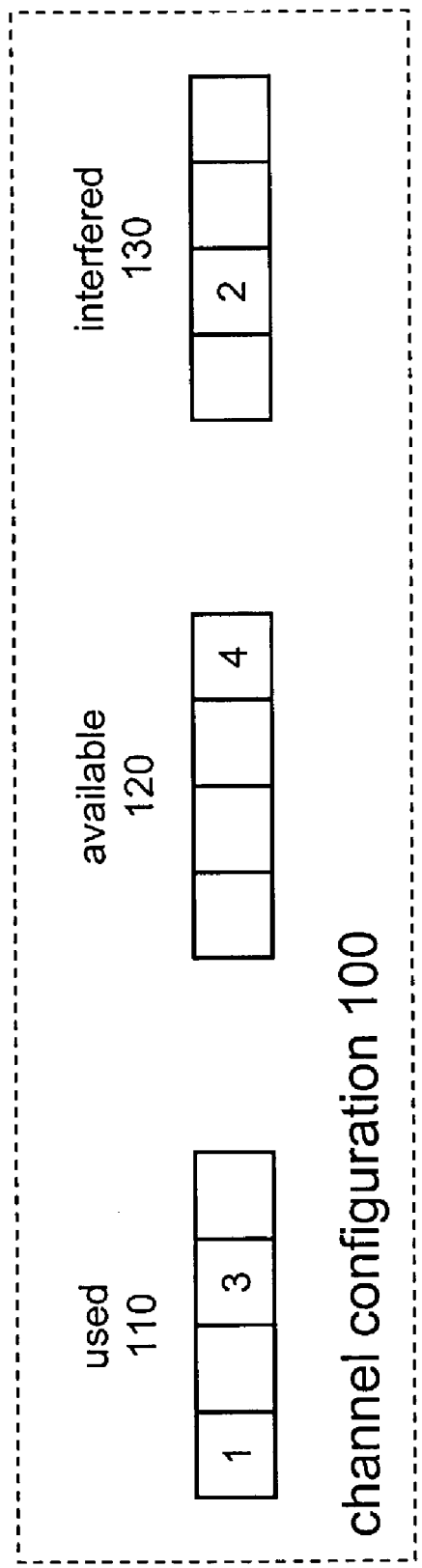
FIG. 1 illustrates the representation of the state of a communication channel as three sets, whereby each frequency band is a member of one set depending on whether it is used in the communication process, available but unused, or to be avoided because of interference in the band.

In the description and claims that follow, certain terms may be defined as follows:

The term 'frequency band' denotes a contiguous portion of the frequency spectrum. The term 'center frequency' as applied to a frequency band denotes a frequency at the arithmetic mean of the frequencies at the boundaries of the frequency band. The term 'bandwidth' refers to the width of the frequency band, that is, the difference between the frequencies at the upper and lower boundaries. As defined herein, frequency bands may be adjacent to one another and non-overlapping, but may also be disjoint or overlapping.

The term 'burst' denotes the emission of an amount of energy within a particular range of frequencies and over a limited period of time. A burst may include one or more cycles of a waveform (e.g. a sine wave). A burst may even be limited to less than one cycle of a waveform. In some applications, two or more bursts may be transmitted simultaneously. Initiating the transmission of a burst is also referred to as 'triggering' the burst.

The term 'wideband' denotes a signal whose bandwidth is not less than 2% of its center frequency, and the term 'ultra-wideband' denotes a signal whose bandwidth is not less than 20% of its center frequency. For example, the bandwidth of an ultra-wideband signal may be up to 50% or more of the signal's center frequency. Ultra-wideband signals may be used at frequencies from less than tens of hertz to terahertz and beyond. Although most ultra-wideband use currently falls between 100 MHz and 10 GHz primarily due to present-day regulatory allocations, it is envisioned that future allocations will extend far beyond this frequency range.

The term "sub-band" refers to a frequency band within a frequency spectrum. For example, as described herein, a frequency spectrum is divided into multiple sub-bands, each sub-band having a different center frequency. "Sub-bands" are also referred to simply as "bands" herein.

The term 'time slot' denotes a defined period of time that separates moments at which bursts may be triggered. A period of time may be divided into a continuous series of consecutive and non-overlapping time slots of equal duration. Alternatively, a period of time may be divided into a series of consecutive and non-overlapping time slots of varying duration. In a complex high-speed system, the length of a time slot may be measured in picoseconds. In a lower-speed system of less complexity, the length of a time slot may be in the nanosecond range. In other applications, time slots of shorter or greater length may be used as desired.

In the implementations described herein, the same time slot boundaries are observed across the various frequency bands. However, it is contemplated that two or more different time slot arrangements may be applied among the various frequency bands (e.g. that time slots in one frequency band may be longer than time slots in another frequency band, or that time slots in one frequency band may have constant length while time slots in another frequency band have varying length) in other implementations.

Ultra-Wideband technologies using a sub-banded approach, where the information encoding takes place in one or more of the sub-bands either in series and/or in parallel is referred to as a UWB multi-band architecture. For example, ultra-wideband signals are transmitted within more than one frequency sub-bands, each sub-band having an ultra-wideband bandwidth. Many such advantages are derived from such an architecture, like regulatory flexibility, scalability of performance parameters (data rate, power consumption, complexity/cost), and coexistence and interference avoidance.

An advanced approach to UWB multi-bands is described in U.S. patent application Ser. No. 10/255,111 (filed Sep. 26, 2002, entitled METHOD AND APPARATUS FOR DATA TRANSFER USING A TIME DIVISION MULTIPLE FREQUENCY SCHEME, which is incorporated herein by reference) and describes a Time Division Multiple Frequency (TDMF) scheme. According to one implementation, a TDMF scheme encodes information (bits) in the time order of transmission of at least one burst within each of multiple sub-bands. That is, data is encoded through the time dependence of frequency bursts within a cluster of bursts. The time and the frequency band at which bursts occur within a cluster carry the information. For example, the order of transmission of bursts across the multiple sub-bands defines a symbol, the symbol corresponds or maps to defined bits.

This multi-band scheme can also be augmented with amplitude modulation, polarity modulation, or other modulation schemes known in the art on each of the clusters to increase the data rate even further, for example, such as described in U.S. patent application Ser. No. 10/371,065 (filed concurrently herewith, entitled METHOD AND APPARATUS FOR DATA TRANSFER USING A TIME DIVISION MULTIPLE FREQUENCY SCHEME WITH ADDITIONAL MODULATION, which is incorporated herein by reference). In one implementation, this scheme looks at the modulation of the signaling in each of the sub-bands as well as looking at the timing of the transmission and/or reception of each of the sub-bands for the encoding of information. An example is a 3 band system, where each burst has polarity modulation and the timing of the arrival of the 3 modulated bursts collectively map to a specific symbol of defined bits. The TDMF scheme, as well as other multi-band schemes, are required to be well designed for coordinated and uncoordinated collocated systems; otherwise the system may not only be subject to narrowband sources of interference, but potentially self-interference and interference from other UWB systems.

According to such TDMF schemes, the term 'cluster' denotes a representation of encoding information into a time-ordered sequence of bursts in one or more frequency bands. The term 'cluster interval' denotes the period between the start of transmission of a cluster and the start of transmission of the next cluster and includes any 'quiet time' between the clusters. 'Quiet time' periods between clusters may be especially useful, for example, in asynchronous applications. In such cases, it may be desirable for the duration of a quiet time period to be greater than the duration of a time slot.

As explained, a multi-band communication process utilizes one or more frequency bands to transfer data from transmitter to one or more receivers. Referring to FIG. 1, it may be useful to categorize each frequency band as being in use by the communication process, as being available, but not being used, or as being avoided because the band is subject to excessive interference. Accordingly, the state 100 of the communication channel, also called its configuration, can be represented as three disjoint sets, whereby set 110, henceforth referred to as the "used" set, represents the set of bands in use by the communication process, set 120 represents the set of bands available, but not used, henceforth called the "available" set, and set 130 represents the set of bands being avoided due to interference in the bands, henceforth referred to as the "interfered" set. It should be noted that the mentioned sets can be treated as sets in the mathematical sense and that set operations, such as complement (~), union (+), intersection (*), and asymmetric difference (−), can be applied to manipulate the sets described herein.

FIG. 1 shows an example of the channel state (also referred to as the channel configuration 100), where frequency bands 1 and 3 are used by the communication process, while band 4 is available, but not used by the communication process. Band 2 has been determined to be impaired by excessive interference and is therefore avoided for communication purposes.

Figure 2:
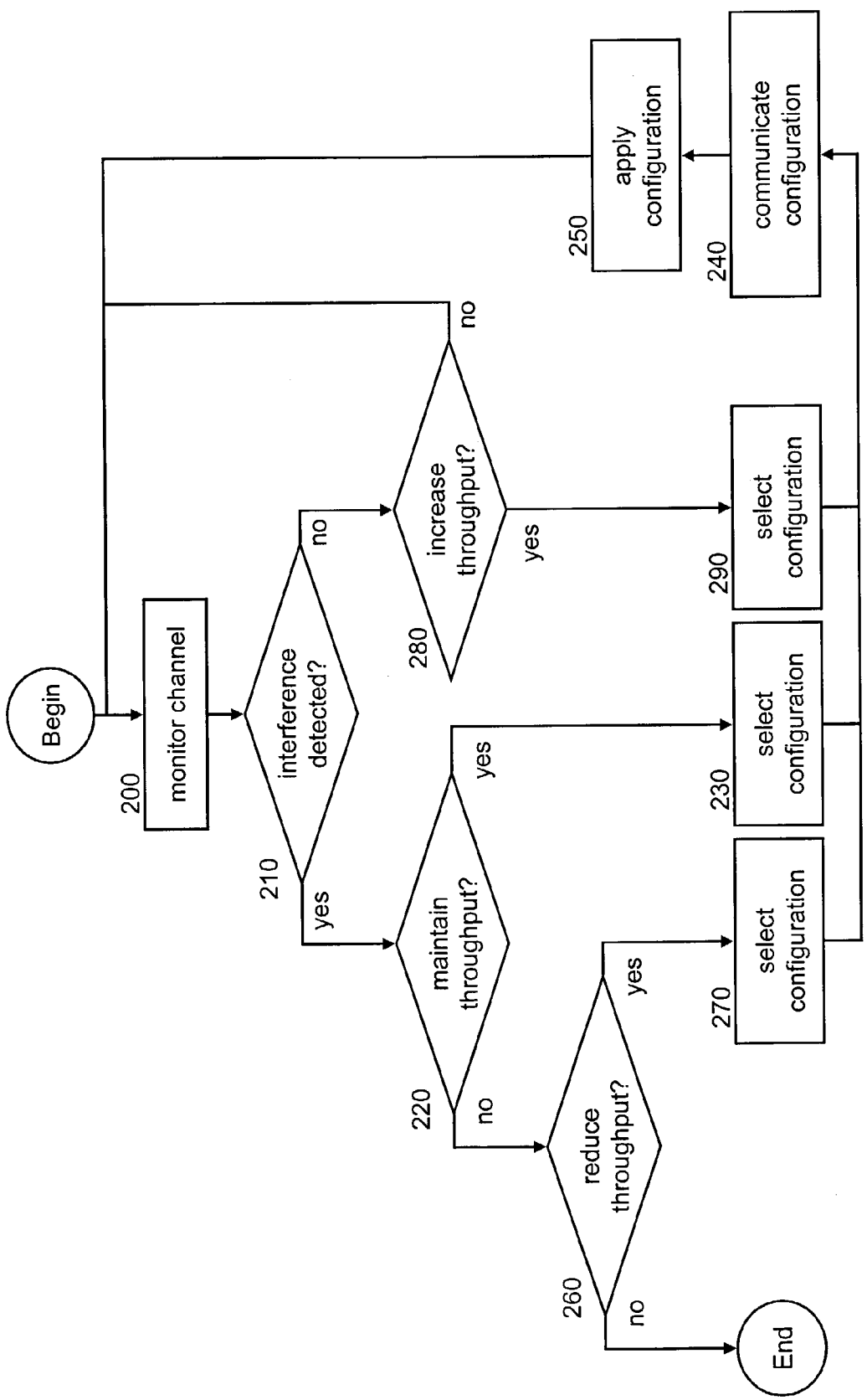
FIG. 2 shows a flow diagram for detecting and adapting to interference in one or more frequency bands.

Referring to FIG. 2, the present invention provides a method for monitoring a communication channel used for multi-band communication, detecting interference sources in one or more frequency bands, and adapting the configuration to the interference present in the channel. The present method also provides a means to recover from the interference effects after the interference disappears. At the outset, a communication channel or link is established between a transmitter and receiver (e.g., between at least two transceivers), the communication channel divided into a number of defined frequency sub-bands, each sub-band having a different center frequency. Preferably, the sub-bands are ultra-wideband frequency sub-bands over which ultra-wideband signals are transmitted and received. Depending on the multi-band transmission scheme, more than one of the sub-bands is used for communications, but it is not required that all of the sub-bands are used for communications, i.e., as described above, one or more sub-bands may be available, but not presently used.

At step 200 in FIG. 2, the communication device monitors the communication channel for interference sources. Generally, the channel is monitored during reception or idle time, although the channel may also be monitored during transmission time. At step 200, the "interfered" set is assigned the set of frequency bands determined as being unavailable due to excessive interference. In addition, at step 200, the "interfered" set is removed from the "available" set, that is, available=available−interfered.

At step 210, a determination is made as to whether there is interference present in one of the bands used by the communication process by determining if the intersection between the "used" set and the "interfered" set is non-empty (used*interfered≠{}). Several embodiment of the present invention are generally concerned with detecting interference in bands which are used during the current communication process, although a determination about interference in bands other than the bands currently used is equally possible, for example, to determine an alternate set of frequency bands having less interference than the current set. Thus, in one embodiment, non-used but available bands (sub-bands) are monitored to determine if there is an interference in such bands.

At step 210, if interference is detected, execution continues at step 220. Otherwise, execution continues at step 280.

At step 220, the device determines whether the data throughput offered by the current set of used bands can be maintained by exchanging the bands in the "used" set, which are impaired by interference, with bands from the "available" set. If the level of throughput can be maintained, execution continues at step 230. Otherwise, execution continues at step 260.

Figure 10:
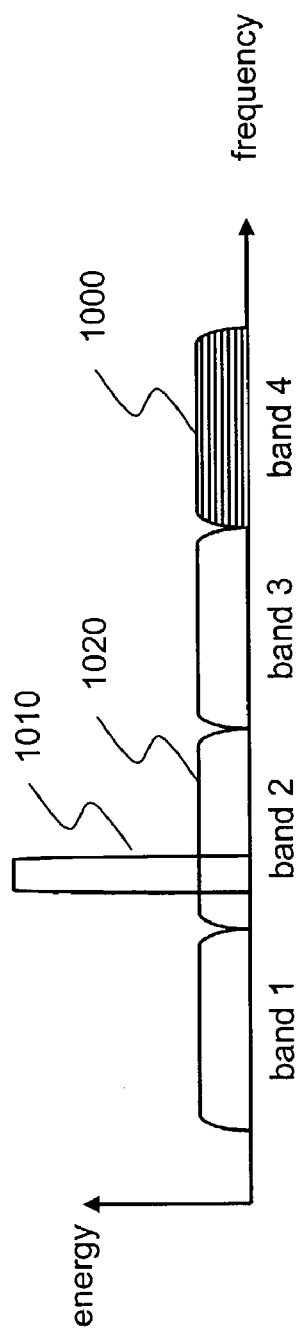
FIG. 10 illustrates a situation, where an interference source interferes with one of three bands in use.
Figure 11:
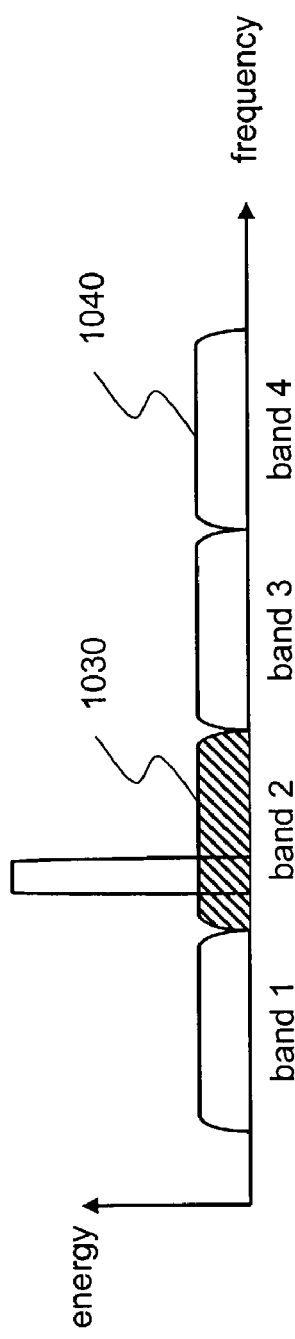
FIG. 11 shows the usage of bands after adapting to an interference source by stopping to use the interfered band and instead using a previously unused non-interfered band.
Figure 12:
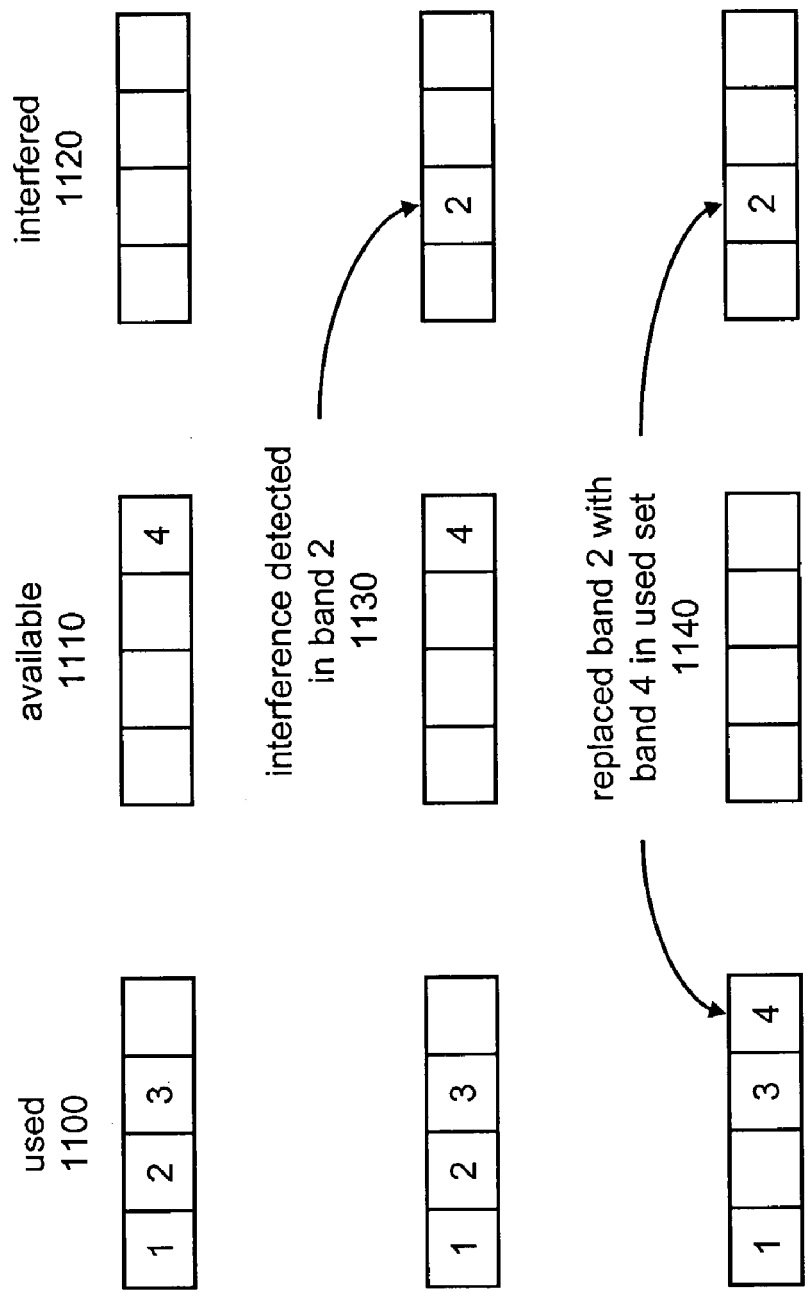
FIG. 12 illustrates the change of the channel configuration resulting from the transition from the configuration shown in FIG. 10 to the configuration shown in FIG. 11.

At step 230, the device selects a set of bands from the "available" set in order to replace the set of interfered used bands. The new "used" set is the result of removing the "interfered" set from the current "used" set and adding the selected bands from the "available" set (new used=used−interfered+selected). The device determines, based on the new "used" set, a data coding scheme, and continues at step 240. An example of replacing an interfered band with an available band is illustrated in FIGS. 10-12.

At step 240, the device communicates the new configuration and the new data coding scheme to the other participating devices and then continues at step 250.

At step 250, after successful communication of the new configuration and coding scheme, the device changes its configuration to use the new "used" set and the new coding scheme. It then proceeds to step 200.

If, at step 220, the throughput cannot be sustained, a determination is made at step 260 as to whether the communication link could be maintained with a reduced throughput. A reduced throughput is generally the result of reducing the number of bands used for communicating data by removing the bands containing interference. Various ways known in the art can be applied to make the determination as to whether the link can be maintained with reduced throughput. For example, the communication link can be attributed with upper and lower throughput requirements. The device can then compare a reduced throughput with the lower throughput requirement.

If the communication link can be maintained with a reduced throughput, the device proceeds at step 270.

Figure 13:
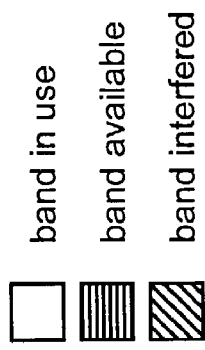
FIG. 13 illustrates a situation, where an interference source interferes with one of four bands in use.
Figure 13:
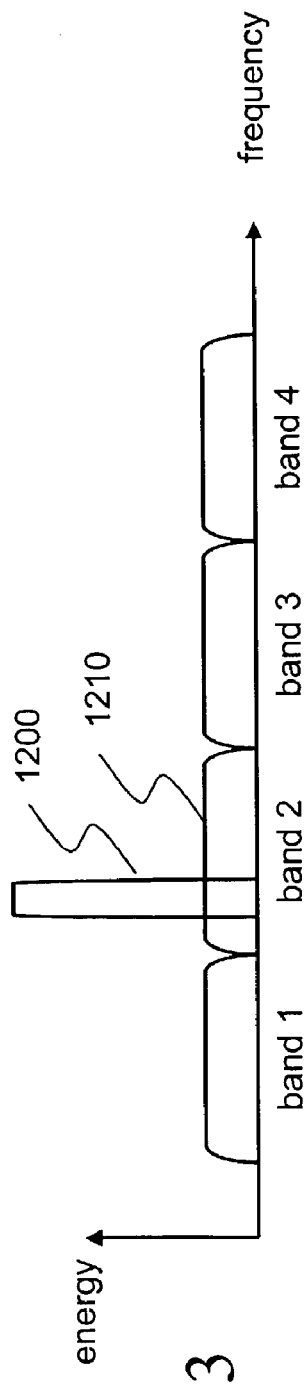
Figure 14:
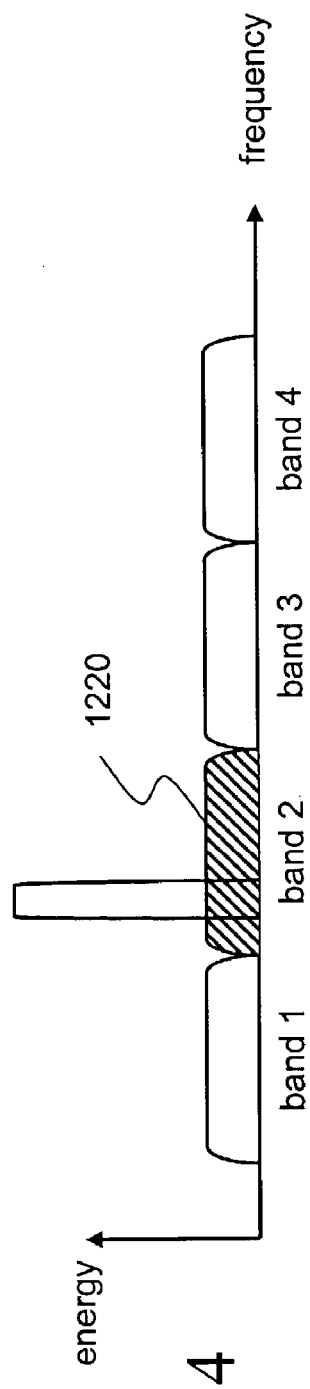
FIG. 14 shows the usage of bands after adapting to an interference source by stopping to use the interfered band resulting in a reduction of capacity.
Figure 15:
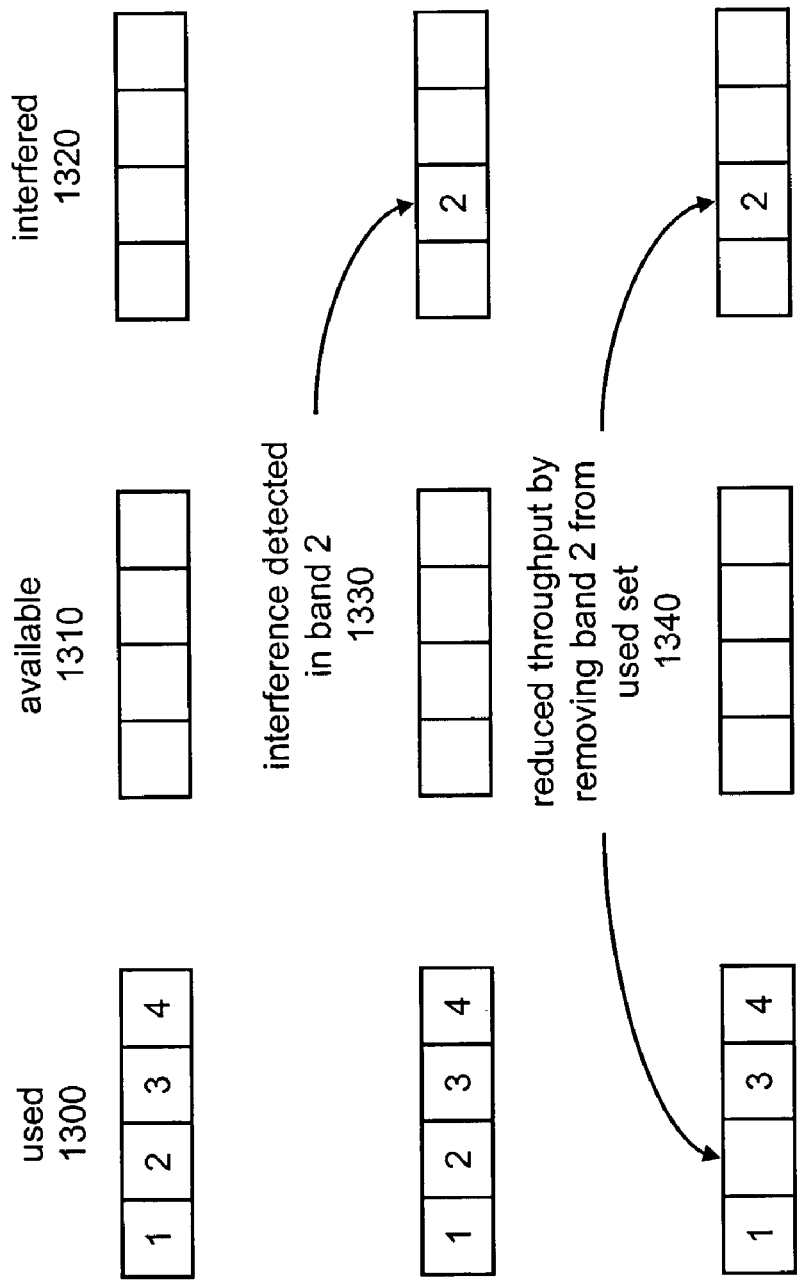
FIG. 15 illustrates the change of the channel state resulting from the transition from the state shown in FIG. 13 to the state shown in FIG. 14.

At step 270, the new "used" set results from removing the "interfered" set from the "used" set (new used=used−interfered). Also at step 270, the device determines, based on the new "used" set, a data coding scheme. Execution then proceeds at step 240. An example of removing an interfered band without a suitable replacement band is illustrated in FIGS. 13-15.

If, at step 260, it is determined that the communication link cannot be maintained with reduced throughput, the device terminates the communication process and recovers as known in the art, for example, by attempting to reestablish a communication link after a delay, in the hope that the interference environment has become less hostile.

If, at step 210, it is determined that the "used" set is not subject to interference, a determination is made at step 280 as to whether the communication link would benefit from an increased throughput. Increasing the throughput is generally possible if the "available" set is non-empty. This can be the result of the device not using a band for a communication link, or for a band to be moved from the "interfered" set to the "available" set. If it is determined that the communication link can benefit from an increased throughput, for example, by comparing the increased throughput with the link's upper throughput boundary, execution continues at step 290. Otherwise, channel monitoring is resumed at step 200.

Figure 16:
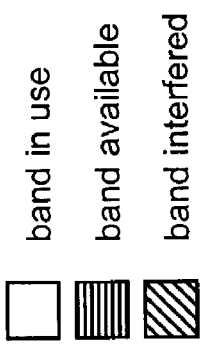
FIG. 16 illustrates a situation, where a communication link is maintained by using two bands while a third band is subject to interference and a forth band is unused.
Figure 16:
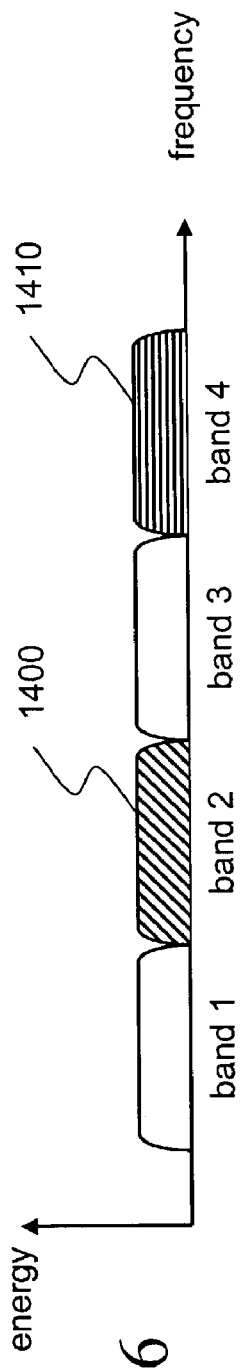
Figure 17:
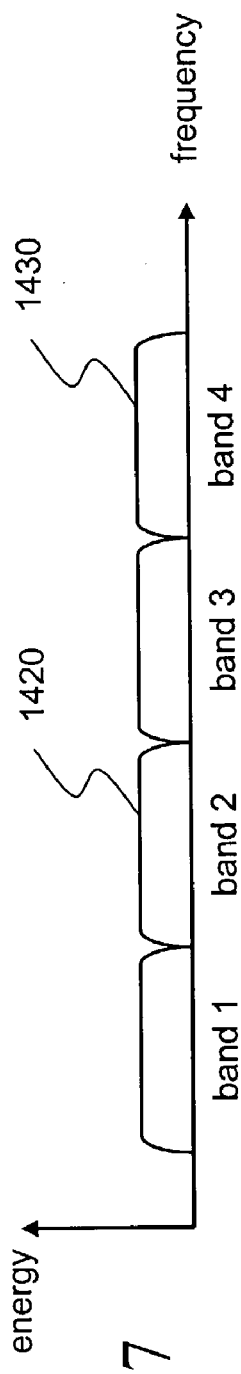
FIG. 17 shows the usage of bands after the interference source disappears and the device increases its performance, in this specific example, its throughput of the communication link by using all four bands.
Figure 18:
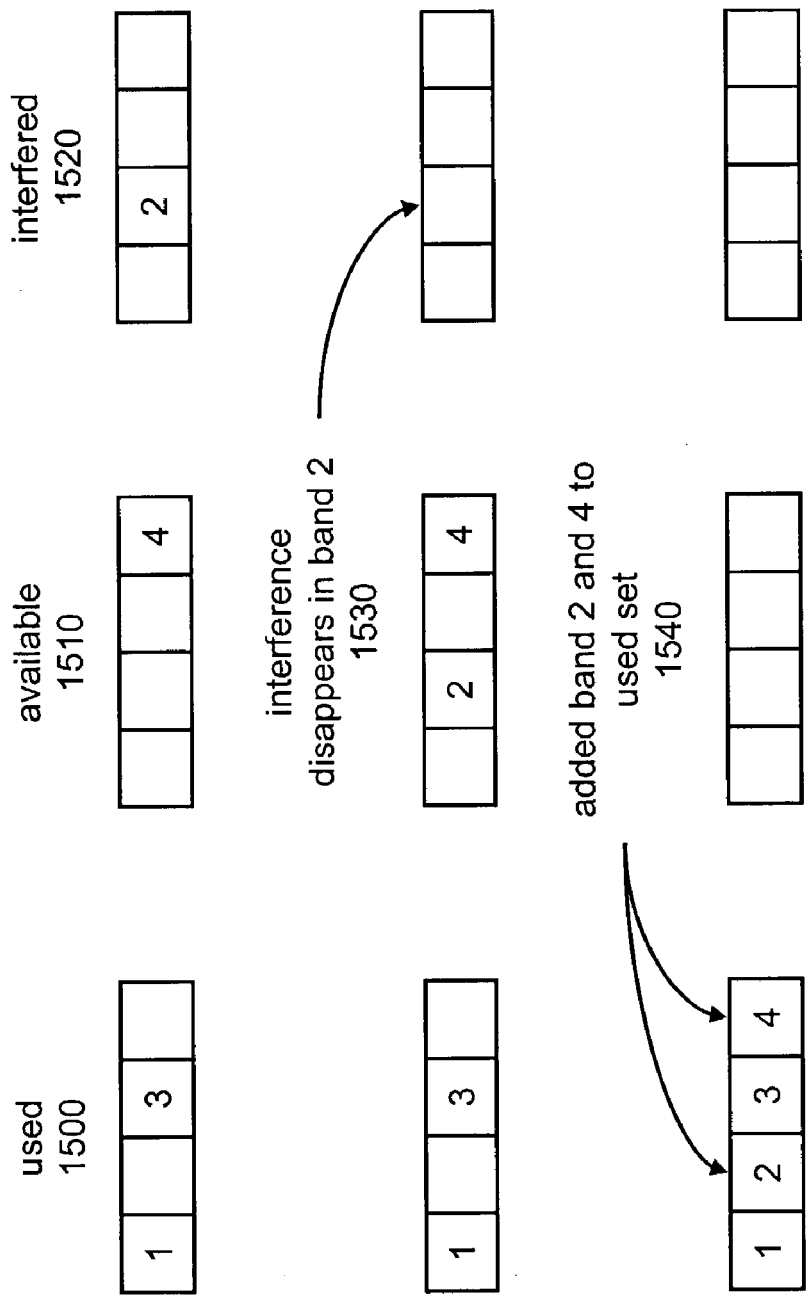
FIG. 18 illustrates the change of the channel state resulting from the transition from the state shown in FIG. 16 to the state shown in FIG. 17.

At step 290, the device selects a set of frequency bands from the "available" set with to the current "used" set to form a new "used" set (new used=used+selected). Based on the new "used" set, a data encoding scheme is determined before continuing at step 240. An example of adding an available band since an interfered band is no longer present is illustrated in FIGS. 16-18.

According to several embodiments of the present invention, methods are provided for detecting narrowband interference to UWB multi-band communication and adapting the multi-band signaling to remediate the effects of this interference. In one implementation of sub-band communication, transmission and reception of individual frequency channels are operated independently to transmit data using various modulation methods such as on-off keying (OOK), binary or quadrature phase shift keying (BPSK,QPSK), pulse amplitude modulation (PAM), pulse position modulation (PPM), and many others as are known in the art. The total data rate of the system is the sum of the data rate from individual frequency channels.

In other implementations, each symbol is comprised of bursts from multiple frequency bands. An example of this, known as TDMF (such as described in U.S. patent application Ser. No. 10/255,111, incorporated by reference herein above), a multi-band symbol consists of n different frequency bursts $f_k$, k=1, 2, . . . , n. Symbol information is contained in the relative location of the individual frequency bursts. The following embodiments are independent of the type of the multi-band implementation.

Methods of detecting an interfering signal in one or more sub-bands of a multi-band UWB communication scheme are generally based upon maintaining statistics on symbol errors and using those statistics to determine the presence of an interference, or using circuitry in the receiver to detect the presence of excess signal energy in a given sub-band.

In a multi-band receiver, various methods will typically be used for minimizing noise. In one method, the signal at the output of the receiver antenna is passed through n bandpass filters having center frequencies at $f_k$, k=1, 2, . . . , n, and having the same bandwidth as the transmitted bursts. Alternatively, with a correlator type detector, bandpass filters are not required.

Figure 3:
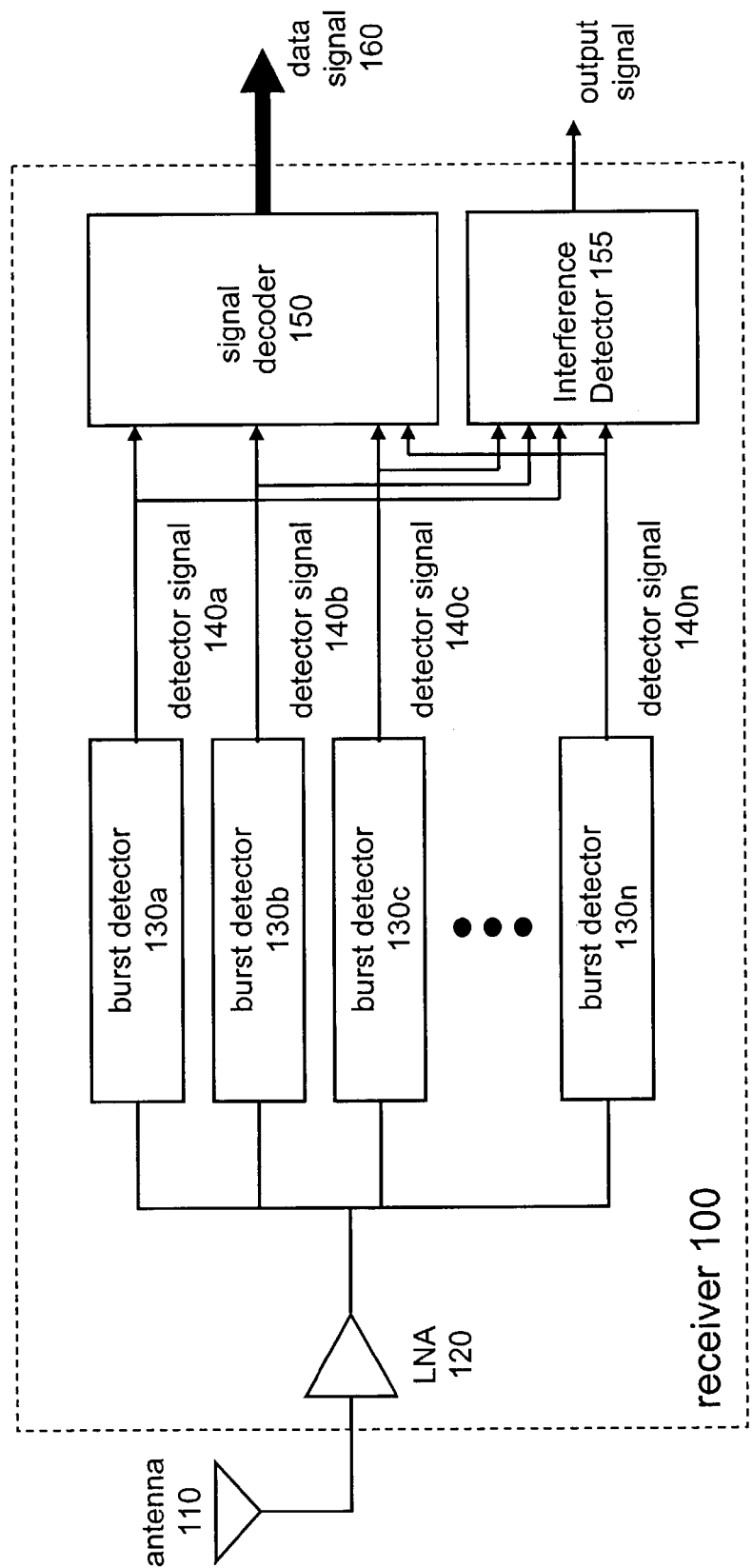
FIG. 3 shows a block diagram of a UWB multi-band receiver.

FIG. 3 shows a block diagram of a one embodiment of a multi-band receiver 100. It comprises a low-noise amplifier (LNA) 120 whose input is coupled to an antenna 110 and whose outputs are coupled to one or more burst detectors 130a through 130n, each of the detectors designed to detect bursts within a sub-band. The outputs of burst detectors 130a through 130n are coupled to the inputs of signal decoder 150 through detector signals 140a through 140n and to the inputs of an interference detector 155.

Electromagnetic energy received through antenna 110 is amplified by LNA 120 and fed to burst detectors 130a through 130n. Burst detectors 130a through 130n are configured to detect bursts in specific frequency bands. For example, in one embodiment, each burst detector 130 includes a bandpass filter configured to pass the desired sub-band. In another embodiment, a correlator is used, rather than a bandpass filter, to detect the desired burst. Upon detecting a burst, a burst detector 130a through 130n signals detection of a burst in its frequency band to attached signal decoder 150 and interference detector 155. Signal decoder 150 decodes a sequence of detected bursts into a data signal that is communicated to a data sink through data signal 160. According to several embodiments, the interference detector functions to determine if an interfering signal is present in one or more sub-bands.

Figure 4:
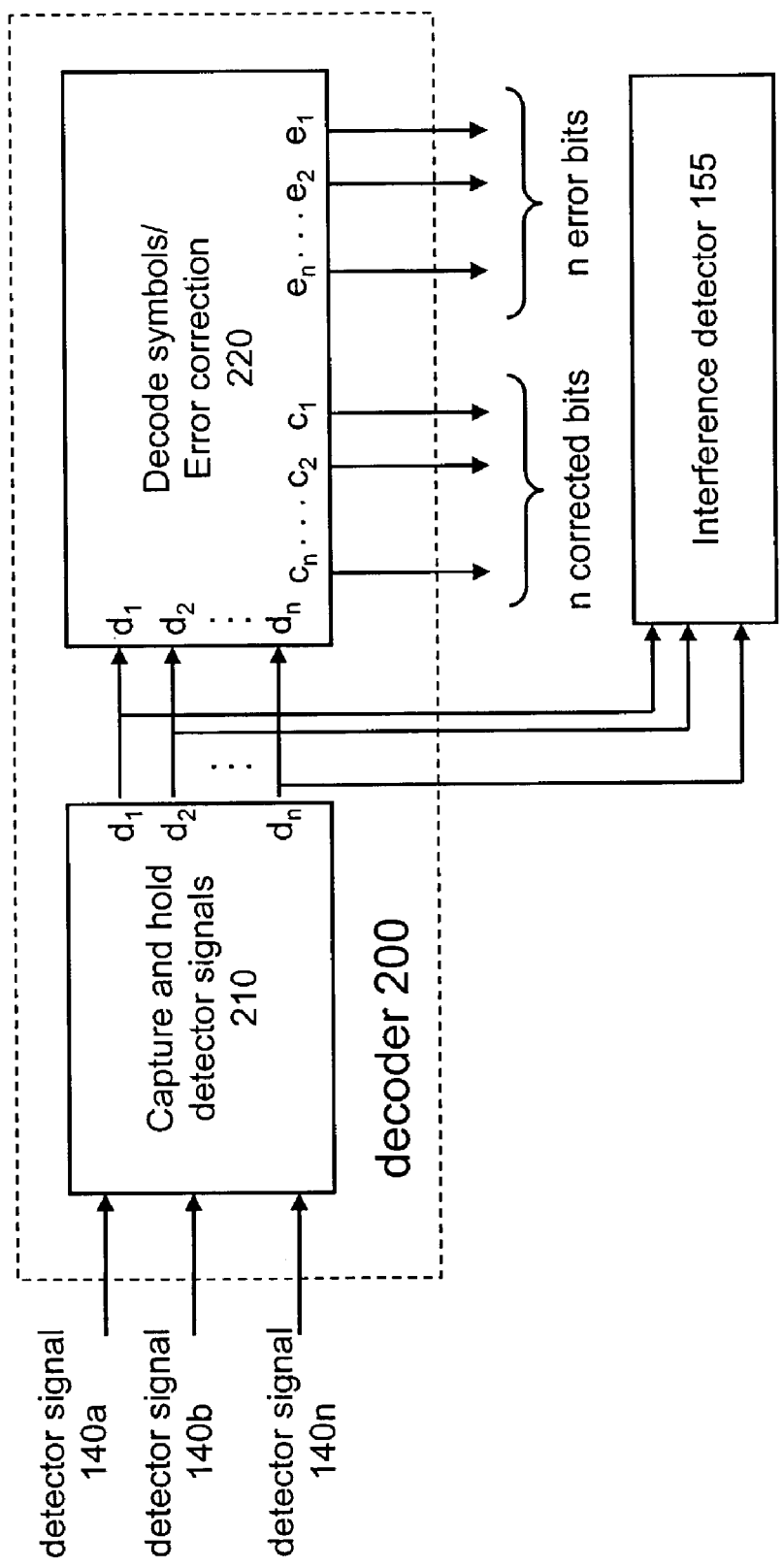
FIG. 4 shows a block diagram of a decoder block.

FIG. 4 shows a block diagram of the decoder 150 in FIG. 3. The analog or digital detector signals 140a through 140n are captured and held 210 by either analog or digital logic, using a bank of ADCs or using other methods as is known in the art. The resulting digital signal $d_1, d_2, \ldots, d_n$ is passed to a symbol decoder 220 which has error correction and to the interference detector 155 which determines if an interfering signal is present in one or more sub-bands. The corrected signal $c_1, c_2, \ldots, c_n$ is then passed on. A set of error bits $e_1, e_2, \ldots, e_n$ is also set, with a value of 1 for bit k if the symbol information produced by using the sub-band k was erroneous.

In the disclosure, the set of error bits is processed to compute, for each band $b_k$, an estimate of the probability that the symbol was in error due to the use of that band in the symbol transmission. How these bits are set depends on the particular signaling method used, and is explained below. In some embodiments, the n error bits are coupled to the interference detector 155 to aid in the interference detection.

For an implementation in which each channel operates independently, the error bits in FIG. 4 are determined by an error correction algorithm applied to the data stream in each band separately. The error correction algorithm recovers a corrected symbol from the symbol transmitted in that channel. If the recovered symbol in band k and directly received symbol do not match, the error bit for band k is set.

Figure 5:
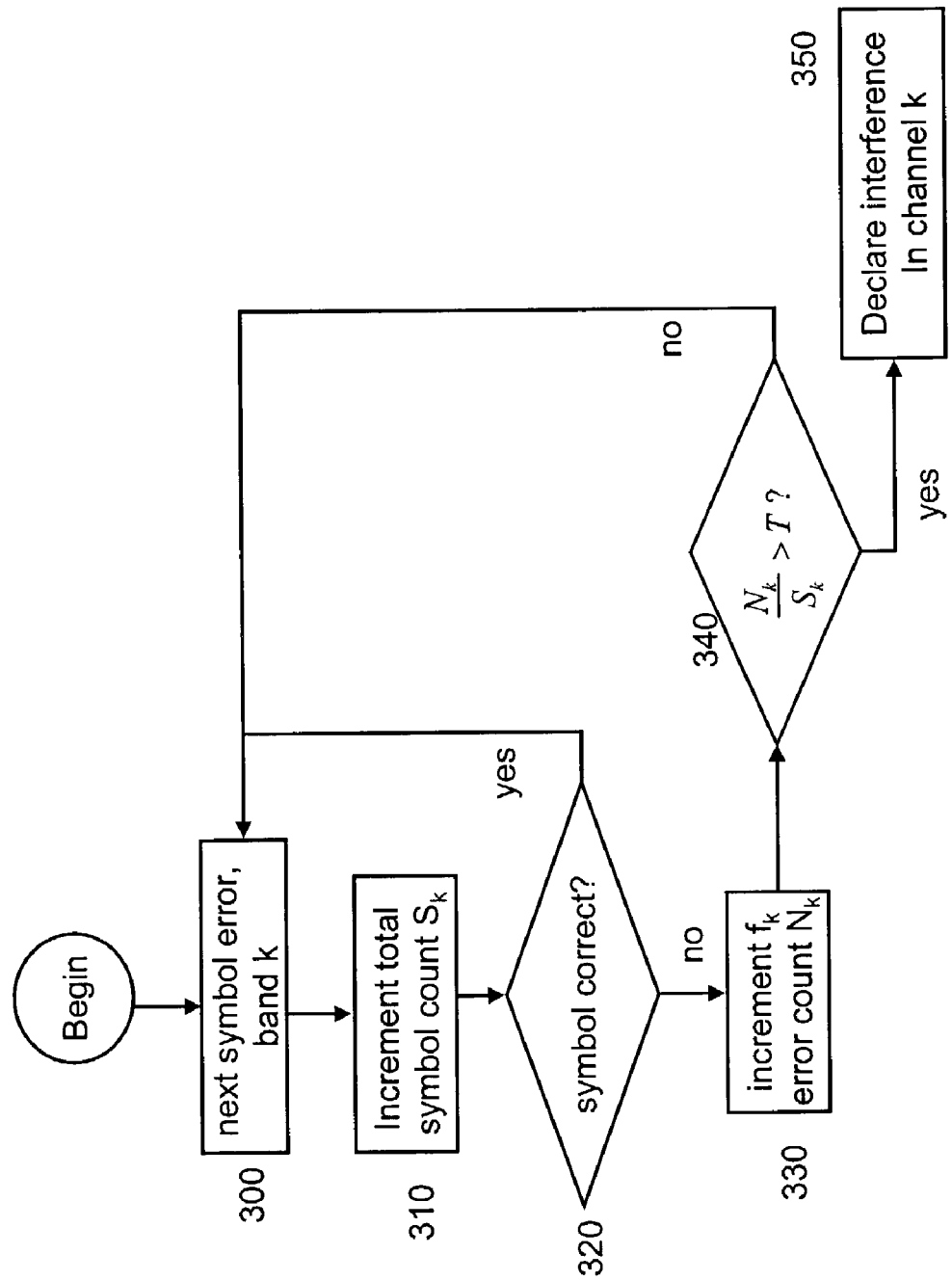
FIG. 5 shows a control flow diagram for computing symbol error statistics for individual channel signaling.

FIG. 5 shows a control flow diagram of one embodiment of the method of the invention, for a signaling method in which n independent sub-bands are used and symbols may be transmitted at different rates in different sub-bands. A total of n copies of this logic must execute one for each sub-band. Upon command to begin, block 300 fetches the error bit for sub-band k for the next symbol. Block 310 increments the running count of symbols received in sub-band k. Block 320 then examines the error bit to see if it is 0. If yes, the symbol was received correctly, and control returns to block 300 to wait for the error bit for the next symbol. If no, control is passed to block 330 where the count of errors for sub-band k is updated. Define $N_k$ to be the count of the number of errors for frequency band k. After the error counter is updated, block 340 compares the ratio of number of symbol errors $N_k$ to total symbols $S_k$ for the frequency band. If this ratio exceeds a threshold T, interference is declared to exist in the channel k in block 350.

The method shown in FIG. 5 may be implemented with a microprocessor, or by discrete logic, or by any other method as is evident to those skilled in the art. In one embodiment, the method of FIG. 5 is implemented by the interference detector 155 of FIGS. 3 and 4.

Figure 6:
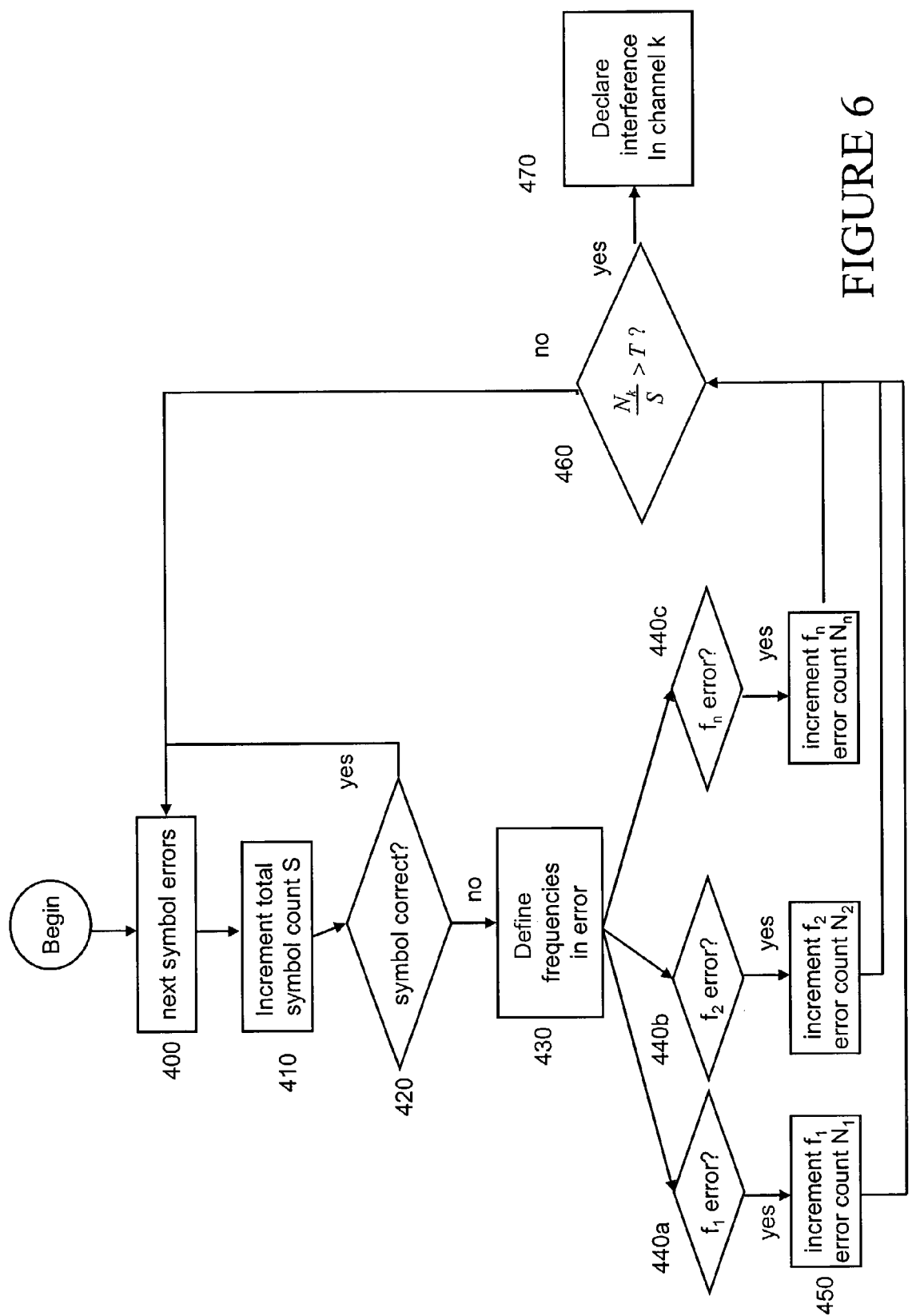
FIG. 6 shows a control flow diagram for detecting sub-band interference using symbol error statistics for a multi-band signaling method in which transmitted symbols are comprised of bursts from multiple sub-bands.

FIG. 6 shows a control flow diagram of one embodiment of the method of the invention. Upon command to begin, block 400 fetches the error bits for the next symbol. Block 410 increments the running count of symbols received. Block 420 then examines the error bits to see if all bits are 0. If yes, the symbol was received correctly, and control returns to block 400 to wait for the next set of error bits. If no, the Block 430 determines which bits have been set and passes this information onto Blocks 440a through 440n. At each block, if the error bit for frequency k has been set, control is passed to block 450k where the count of errors for frequency band k is updated. Define $N_k$ to be the count of the number of errors for frequency band k. After each error counter is updated, block 460 compares the ratio of errors $N_k$ to total symbols $S_k$ for each frequency band. If this ratio exceeds a threshold T for a frequency band k, interference is declared to exist in the channel k in block 470.

The method shown in FIG. 6 may be implemented with a microprocessor, or by discrete logic, or by any other method as is evident to those skilled in the art. In one embodiment, the method of FIG. 6 is implemented by the interference detector 155 of FIGS. 3 and 4.

The method of FIG. 6 implicitly assumes a uniform distribution in use of each frequency band for transmitted symbols. Thus, the number of symbols containing each frequency $f_k$ would be roughly the same for all values of k. If this is not the case, then the logic may be modified as follows: Maintain a separate count $M_k$ of the total number of symbols containing the frequency $f_k$. For each frequency $f_k$ define $$\varphi_k = \frac{N_k}{M_k} \text{ and define } \varphi = \frac{\sum_{k=1}^{n} N_k}{\sum_{k=1}^{n} M_k}.$$

If for some $$k, \frac{\varphi_k}{\varphi} > T,$$

then declare a narrowband interference for channel $f_k$.

Figure 7:
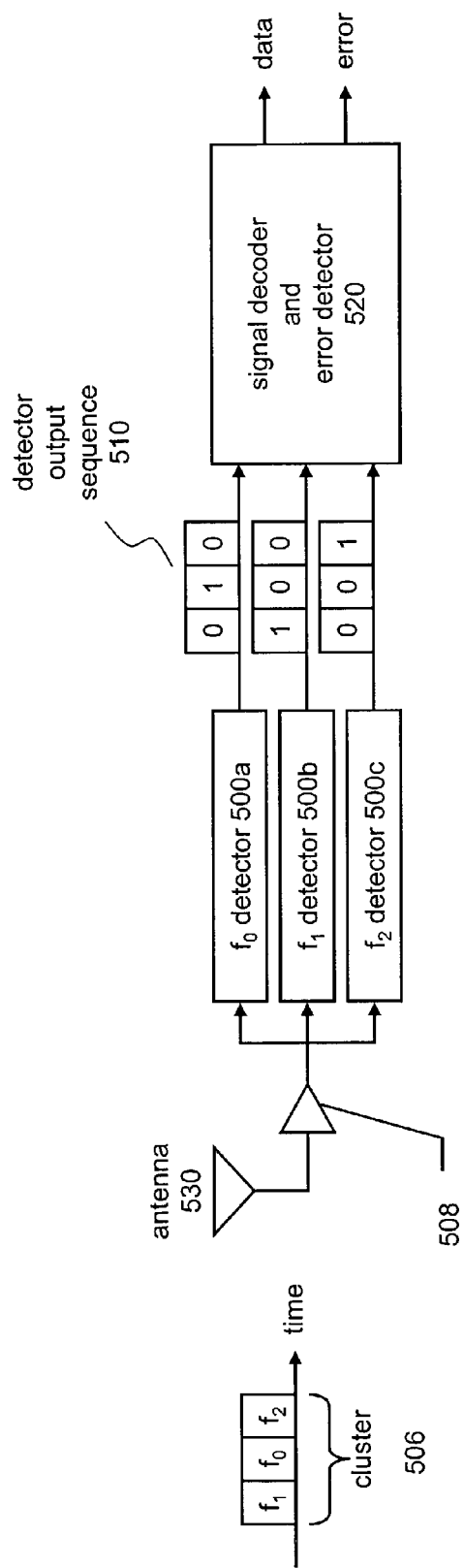
FIG. 7 shows an example of a burst detector.

For an implementation in which a symbol is comprised of information from multiple channels, the method used to set the error bits will depend on the detection method used. FIG. 7 shows an example of a detector in block diagram form, which can be used to decode a particular embodiment of TDMF encoding in which a burst occurs in a frequency band at most once per cluster, and which uses an independent decision as to the frequency of each individual burst as it passes through the burst detector. A particular symbol consisting of a cluster 506 of three bursts with frequencies $f_1$, $f_0$, $f_2$, in that order, enters the receiver through antenna 530 and is amplified by an appropriate LNA 508. The received signal passes through three separate burst detectors 500a, 500b and 500c and each detector independently declares the existence of a burst in its associated frequency band during each time slot. In the example of FIG. 7, each filter correctly declares the presence (indicated by an output value of 1) or absence (indicated by an output value of 0) of the particular frequency burst, as shown in the detector output sequence 510. The detector output sequence 510 is input to the signal decoder and error detector 520, which decodes the symbol into data (i.e., maps the symbol designated by the series of bursts into its corresponding data bits). The signal decoder and error detector 520 also determines whether there are any errors in the received cluster.

Figure 8:
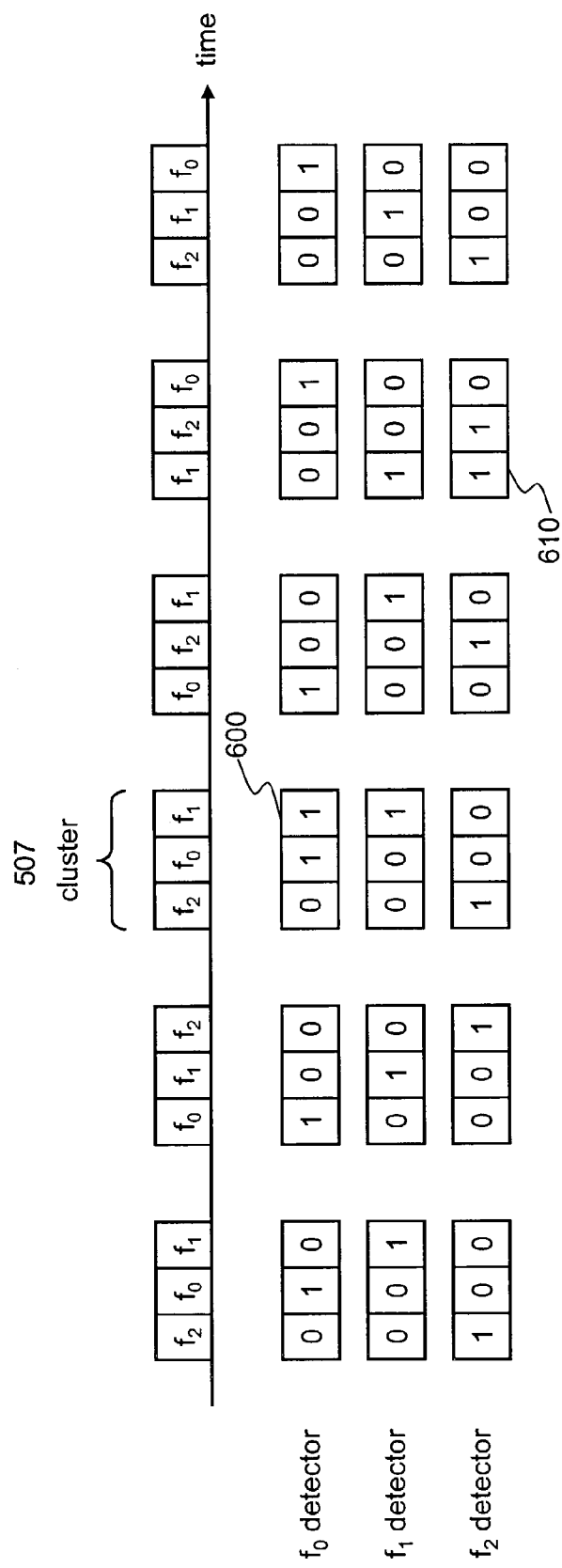
FIG. 8 illustrates a signal detector output for a sequency of one type of TDMF symbols.

FIG. 8 illustrates an example sequence of transmitted clusters and example outputs from the three individual burst detectors for each of these clusters. In the defined signaling method, each frequency can be used at most once per symbol. Therefore, if an individual detector 500 declares the existence of a particular frequency more than once, the detection must be in error. For the third symbol (i.e., cluster 507), for example, the $f_1$, and $f_2$ detectors have correctly declared the existence of the $f_1$, and $f_2$ frequency bursts in the appropriate time slots, but the $f_0$ detector has declared the existence of the $f_0$ burst at both the second and third time slots (see 600 in FIG. 8). The existence of multiple detections of the same frequency can be used to declare the received symbol to be invalid. The error bit for that channel would also be set to 1. Similarly, the declarations for the fifth symbol show that the frequency $f_2$ is declared twice, so this detection is in error (see 610 in FIG. 8), and thus the error bit for channel 2 would be set for that symbol. If more than one channel declared the same frequency twice, the error bit for each of those channels would be set.

It should be understood that this technique may be modified, for example, if, the multi-band encoding scheme required more than one burst per frequency sub-band. For example, if in another embodiment, the encoding scheme required that a burst be transmitted in each frequency sub-band a specified number of times (e.g., twice) in a cluster, then the signal decoder and error detector 520 may be configured to detect when the number of bursts detected within the cluster in a given sub-band differs from the specified number. For example, if a given burst detector only detected one occurrence of a burst during the cluster, then the symbol could be declared in error. Similarly, if a given burst detector detected three occurrences of a burst during the cluster, then the symbol could be declared in error.

An alternative method for setting the error bits for a signaling method in which symbols are comprised of bursts from multiple frequency bands, such as TDMF, is to compare each originally detected symbol with the corresponding symbol reconstructed by an error correction code. In one embodiment of TDMF signaling, a symbol consists of an ordered sequence of n frequencies. If the error correction code replaced the originally detected symbol with a symbol consisting of those frequencies in a different order, the error bit would be set for each frequency which changed position in the sequence. If, after application of the error correction code, the replaced sequence was identical to the original, no error bits would be set.

An alternative to use of the ratio test 460 in FIG. 6 is to base the decision of interference detection of an abnormally high number of errors due to one frequency channel in relation to the average number of errors in all channels. In the absence of sub-band interference, the number of errors due to a frequency band should be evenly distributed over the n frequency bands. Define m to be the average of the n counter values of erroneous symbols $N_k$, k=1, 2, ..., n. Define a detection threshold T>1. If $N_k/m > T$, then declare a narrowband interference for channel $f_k$. A narrowband interferer, for example, will cause an excessive number of errors for one particular frequency band so as to exceed the threshold T.

This method implicitly assumes a uniform distribution in use of each frequency band for transmitted symbols. Thus, the number of symbols containing each frequency $f_k$ would be roughly the same for all values of k. If this is not the case, then the logic may be modified as follows: Maintain a separate count $M_k$ of the total number of symbols containing the frequency $f_k$. For each frequency $f_k$ define $$\varphi_k = \frac{N_k}{M_k} \text{ and define } \varphi = \frac{\sum_{k=1}^{n} N_k}{\sum_{k=1}^{n} M_k}.$$

If for some $$k, \frac{\varphi_k}{\varphi} > T,$$

then declare a narrowband interference for channel $f_k$.

If individual sub-bands are not sufficiently spectrally isolated in the receiver for a UWB sub-band communication system, a signal transmitted in one sub-band may cause interference to other sub-bands. This would be the case for example, if bandpass filters used to separate the individual bands on input to the receiver had significant overlap in frequency response.

If bursts within each sub-band are sufficiently isolated from one another in time, time gating may be used to eliminate the interference between bands. If bursts from individual sub-bands are transmitted close together in time, as they are in the TDMF signaling method, it may be useful to provide a method for interference detection which does not mistake the signaling self-interference due to time proximity of bursts for external interference.

Figure 9:
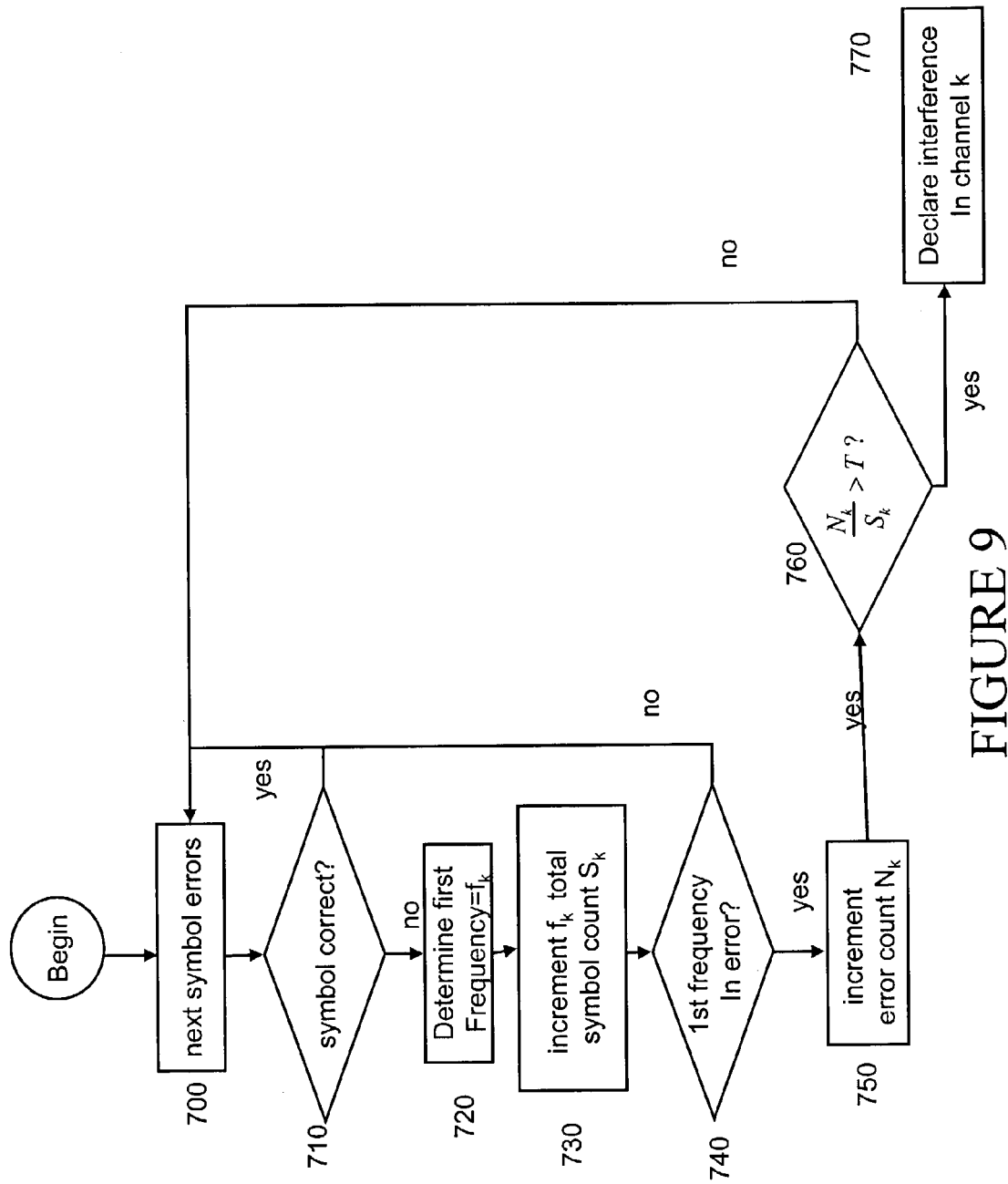
FIG. 9 shows a control flow diagram for detecting sub-band interference using symbol error statistics computed based on the first frequency burst in a group of bursts comprising a multi-band symbol.

FIG. 9 shows a control flow diagram of an alternative embodiment of the method of the invention in which the first burst of a group of bursts comprising a symbol is used to estimate the probability that a symbol will be in error if a frequency band k is used. In this embodiment, an index which indicates the correct identity of the first frequency used in the symbol is passed to the interference detector (e.g., interference detector 155) from the burst detectors, along with the error bits. This could be the identity of the first frequency in the symbol reconstructed by the error correction code, for example. Upon command to begin, block 700 fetches the error bits for the next symbol. Block 710 then examines the error bits to see if all bits are 0. If yes, the symbol was received correctly, and control returns to block 700 to wait for the next set of error bits. If no, block 720 determines the identity of the correct first frequency in the symbol. Then block 730 increments the running count of symbols received which have used that frequency in the first position. Block 740 determines if the error bit for the identified first frequency was set. If not, then this frequency was detected correctly in the original symbol, and control returns to block 700 to wait for the next set of error bits. If yes, then the count of errors for that frequency is incremented in block 750. The test 760 is then made to determine if the ratio of the number of symbol errors $N_k$ to total number of symbols $S_k$, in which that frequency is the first burst of the symbol, exceeds a threshold T. If no, then control returns to block 700 to wait for the next set of error bits. If yes, interference is declared for the channel represented by frequency k in block 770.

The method shown in FIG. 9 may be implemented with a microprocessor, or by discrete logic, or by any other method as is evident to those skilled in the art. In one embodiment, the method of FIG. 9 is implemented by the interference detector 155 of FIGS. 3 and 4.

For practical reasons, the numbers $N_k$ and $M_k$ in FIGS. 5, 6 and 9 cannot be allowed to grow without bound. One method to handle this is to reset the counters for N and M periodically, then allow a sufficient number of symbols to be acquired in order to compute reliable statistics before executing the threshold test again.

A method which can be used to reduce the number of new symbols needed before resuming the threshold comparison is to apply simple filters to the values of $\varphi_k$ and $\varphi$ in each sub-band k. For example, $$\text{define } \varphi_k(t_j) = \alpha \left( \frac{N_k(t_j)}{M_k(t_j)} \right) + (1-\alpha)\varphi_k(t_{j-1}),$$

and define $$\varphi(t_j) = \alpha \left( \frac{\sum_{k=1}^{n} N_k(t_j)}{\sum_{k=1}^{n} M_k(t_j)} \right) + (1-\alpha)\varphi(t_{j-1})$$

where $t_j$ represents the jth time step. $0<\alpha<1$, and $\varphi(0)=\varphi_k(0)=0$, k=1, 2, ..., n. Periodic values for $t_j=t_0+\delta t$ are chosen at which to reset the counters for $N_k$ and $M_k$ to 0. Because of the filtering effect, a smaller number of new symbols is required before resuming threshold comparisons.

In other embodiments, an interfering signal may be detected by using extra circuitry coupled to the output of the individual burst detectors to detect excess energy arriving through a given frequency sub-band when no symbol is scheduled to arrive. Such excess energy is a strong indicator of a narrowband interferer, but more generally, a large amount of unintentional energy in a frequency band is likely to cause a large number of errors in that band.

Figure 29:
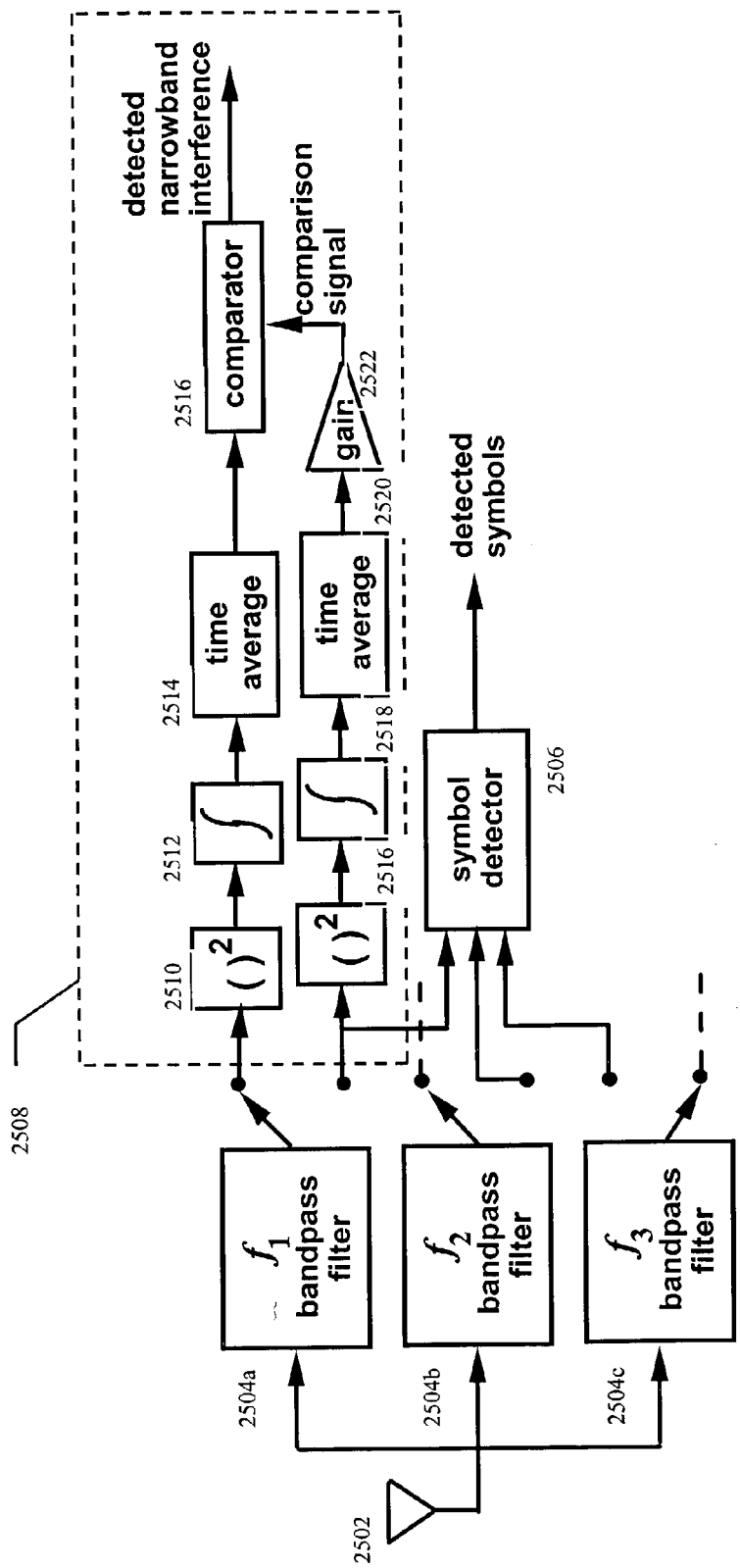
FIG. 29 shows a multi-band ultra-wideband receiver including an interference detector including circuitry to detect excess energy in a particular sub-band indicative of an interfering signal.

FIG. 29 illustrates the use of an interference detector in an example multi-band receiver. Signaling is received at antenna 2502 and coupled to each of burst detectors 2504a, 2504b and 2504c, e.g., each including a bandpass filter for the appropriate sub-band. Symbol detector 2506 detects the symbol based upon the ordered arrival of bursts and outputs the detected symbol, which is mapped to the corresponding data. An interference detector 2508 is also coupled to the output of each burst detector 2504 to detect excess energy in a given band. For example, as illustrated in FIG. 29, the band surrounding frequency $f_0$ is coupled to the interference detector 2508. Similar interference detectors are coupled to the output of burst detectors 2504b and 2504c, but these are omitted from FIG. 29 for simplicity. A switch directs the filtered signal through the interference detector path when signaling in the particular frequency sub-band is not expected.

The circuitry of the interference detector 2508 squares the signal (block 2510) and integrates the signal (block 2512) to compute the signal energy, then averages over time (block 2514). The output of time average block 2514 is compared to a signal representing the average intentional energy received during a time period when signaling is expected. That is, when a burst is expected in the given sub-band, the signal is squared (block 2516), integrated (block 2518), averaged over time (block 2520), and amplified (block 2522). If the energy in the comparison (block 2524) exceeds a threshold, a narrowband interference exists and is declared. The gain (block 2522) should be chosen so that average undesired energy would be much smaller than the desired signal energy in order not to exceed the threshold, such that the interference (if present) is large enough to cause significant errors.

It is an object of one embodiment of the present invention to provide a method to replace one or more frequency bands used for communication, which are subject to interference from one or more interference sources, with one or more frequency bands not presently used for communication by the device.

Various methods can be applied to select a subset of bands from a set of frequency bands. In one embodiment, the bands are chosen at random from the available bands.

In another embodiment, bands are chosen based on an ordering criterion, such as the magnitude of the center frequency, or the numbering of the bands.

In a third embodiment, bands are chosen based on a quality criterion, such as the bands containing the least amount of interference, the bands furthest away from the interference sources (in the frequency domain).

In a fourth embodiment, bands are chosen based on their relationship to the bands already in use. For example, the bands may be selected based on their adjacency with the bands already in use, or the may be chosen such that the distance between the center frequencies of the bands in the resulting configuration is maximal or minimal.

Selection of this alternate band may provide a worse, equal, or better communication performance compared with the band being replaced in its non-interfered state, but will be preferably selected as to provide better performance than the band being replaced in its interfered condition.

Equally possible, is to consider adapting to an interfering signal by adding and dropping bands to meet world-wide regulatory or coexistence requirements.

Altering the set of bands used for communication between two or more devices generally requires the devices to change the coding scheme to encode and decode data values in accordance with the change of the bands used for communication.

FIG. 10 illustrates the method described in FIG. 2, whereby communicating devices adapt to interference by changing the "used" set of frequency bands without loss of throughput. As shown, the communicating devices have four bands available for communication, of which three bands (bands 1 through 3) are used, while band 1000 in FIG. 10 (band 4), is unused. A narrowband interference source 1010 interferes with band 2 (1020 in FIG. 10) currently used for communication.

Referring to FIG. 2, the device, by monitoring the channel at step 200, determines at step 210 that strong interference 1010 in FIG. 10 is present in band 1020 and that band 1020 should therefore not be used for communication any more (e.g., using a method such as described with reference to FIGS. 5, 6, 9 and 26). The device determines at step 220 in FIG. 2, that the configuration may be adapted to the interference without loss of throughput. At step 230, the device determines that band 1000 in FIG. 10 can be used to replace interfered band 1020. The device determines a data coding scheme using bands 1, 3 and the newly selected band 4 (1000 in FIG. 10). At step 240, the device notifies the collaborating devices of the configuration change and switches to the new configuration at step 250.

FIG. 11 illustrates the configuration after the switch. Bands 1, 3, and the newly selected band 4, form the "used" set, while the "available" is empty and the "interfered" set contains band 2 (1030), which is still subject to interference.

Although FIG. 10 and FIG. 11 depict a situation where the communicating devices have a total of four frequency bands available, of which three are used, the exact number of available bands and bands in use, their frequency range and bandwidth may vary and should not be seen as limiting the invention in any way.

FIG. 12 illustrates the change of the configuration according to FIGS. 10 and 11. The top row in FIG. 12 shows the configuration prior to interference. The "used" set comprises bands 1, 2, and 3, while the remaining band 4 is member of the "available" set. In the middle row, the device, after monitoring the frequency bands, determines that band 2 contains an interference source and therefore includes band 2 in the "interfered" set. In the bottom row, FIG. 12 shows the configuration after interfered band 2 is replaced with band 4 removed from the "available" set.

In accordance with FIG. 10, TABLE 1 shows one embodiment of how three sub-bands or simply bands, bands 1, 2, and 3, can be used to encode data. Data is encoded into clusters consisting of a sequence of three frequency bursts. For example to encode data value 3, a cluster consisting of a frequency burst in bands 2, 3, and 1 is transmitted with bursts emitted in the order band 2, 3, and 1 during successive time slots, i.e., $f_2$, $f_3$ and $f_1$, bursts are emitted in successive time slots to encode data value 3.

TABLE 1

| Data | Time Slot 0 | Time Slot 1 | Time Slot 2 |
| --- | --- | --- | --- |
| 0 | 1 | 2 | 3 |
| 1 | 1 | 3 | 2 |
| 2 | 2 | 1 | 3 |
| 3 | 2 | 3 | 1 |
| 4 | 3 | 1 | 2 |
| 5 | 3 | 2 | 1 |

TABLE 2 shows an example of an encoding table according to the invention, where the table provides for encoding values using the frequency bands shown in FIG. 11, namely bands 1, 3, and 4. For example, to encode value 3, a cluster consisting of a frequency burst in bands 3, 4, and 1 is transmitted with bursts emitted in the order band 3, 4, and 1 during successive time slots, i.e., $f_3$, $f_4$ and f bursts are emitted in successive time slots to encode data value 3. However, the new encoding scheme may be implemented in numerous ways. For example, the encoding scheme of TABLE 1 may be used, but substituting bursts in band 4 for the bursts in interfered band 2.

TABLE 2

| Data | Time Slot 0 | Time Slot 1 | Time Slot 2 |
| --- | --- | --- | --- |
| 0 | 1 | 3 | 4 |
| 1 | 1 | 4 | 3 |
| 2 | 3 | 1 | 4 |
| 3 | 3 | 4 | 1 |
| 4 | 4 | 1 | 3 |
| 5 | 4 | 3 | 1 |

FIG. 13 illustrates the method described in FIG. 2, whereby communicating devices adapt to interference by changing the "used" set of frequency bands with reduction in throughput, i.e., an interfered band is removed and not replaced with another band. As shown, the communicating devices have four bands available for communication, of which all are used (members of the "used" set). The device detects interference 1200 in band 2 (1210) at step 210 in FIG. 2, and determines at step 220 that it cannot remove band 2 without loss of throughput since there are no available bands ("available" set is empty). At step 260, the device decides that a reduction in throughput is tolerable, removes band 2 from the "used" set and adds it to the "interfered" set instead at step 270.

FIG. 14 depicts the use of frequency bands after communicating the new configuration at step 240 and switching over to the new configuration at step 250, resulting in a reduced throughput.

FIG. 15 illustrates the change of the configuration when changing the configuration according to FIGS. 13 and 14. The top row in FIG. 15 shows the configuration prior to interference. All available bands are in use by the communication process and therefore member of the "used" set 1300. The "available" set and the "interfered" set are empty. The middle row shows the sets after the device detects interference in band 2. The bottom row shows the configuration after switching to the new configuration using only the three bands 1, 3, and 4 for communication. The remaining band 2 is member of the "interfered" set and thus marked as containing interference.

In accordance with FIG. 13, TABLE 3 shows one embodiment of how four bands, bands 1, 2, 3, and 4, can be used to encode data. Data is encoded into clusters consisting of a sequence of four frequency bursts. For example to encode data value 16, a cluster consisting of a frequency burst in bands 3, 4, 2, and 1 is transmitted with bursts emitted in the order band 3, 4, 2, and 1 during successive time slots, i.e., $f_3$, $f_4$, $f_2$ and $f_1$, bursts are emitted in successive time slots to encode data value 16. After the configuration switch to the three frequency bands 1, 3, and 4, a coding table such as shown in TABLE 2 may be used.

TABLE 3

| Data | Time Slot 0 | Time Slot 1 | Time Slot 2 | Time Slot 3 |
|---|---|---|---|---|
| 0 | 1 | 2 | 3 | 4 |
| 1 | 1 | 2 | 4 | 3 |
| 2 | 1 | 3 | 2 | 4 |
| 3 | 1 | 3 | 4 | 2 |
| 4 | 1 | 4 | 2 | 3 |
| 5 | 1 | 4 | 3 | 2 |
| 6 | 2 | 1 | 3 | 4 |
| 7 | 2 | 1 | 4 | 3 |
| 8 | 2 | 3 | 1 | 4 |
| 9 | 2 | 3 | 4 | 1 |
| 10 | 2 | 4 | 1 | 3 |
| 11 | 2 | 4 | 3 | 1 |
| 12 | 3 | 2 | 1 | 4 |
| 13 | 3 | 2 | 4 | 1 |
| 14 | 3 | 1 | 2 | 4 |
| 15 | 3 | 1 | 4 | 2 |
| 16 | 3 | 4 | 2 | 1 |
| 17 | 3 | 4 | 1 | 2 |
| 18 | 4 | 2 | 3 | 1 |
| 19 | 4 | 2 | 1 | 3 |
| 20 | 4 | 3 | 2 | 1 |
| 21 | 4 | 3 | 1 | 2 |
| 22 | 4 | 1 | 2 | 3 |
| 23 | 4 | 1 | 3 | 2 |

FIG. 16 illustrates the method described in FIG. 4, whereby communicating devices adapt to the disappearance of interference by changing the "used" set of frequency bands with increase in throughput. As shown, the communicating devices have four bands available for communication, of which two are used (band 1 and band 3 are members of the "used" set). Band 4 (1410) is available but not used, while band 2 is a member of the "interfered" set due to previous interference in band 2. At step 200 in FIG. 2, the device monitors the channel and determines at step 210 that there is no interference in any of the bands moves band 2 from the "interfered" set to the "available" set. At step 2800, the device determines that an increase in throughput is desirable and adds all bands from the "available" set to the "used" set at step 290.

FIG. 17 depicts the use of frequency bands after communicating the new configuration at step 240 and switching over to the new configuration at step 250, resulting in increased throughput due to the use of all four bands.

FIG. 18 illustrates the change of the configuration when changing the configuration according to FIGS. 13 and 14. The top row in FIG. 18 shows the configuration prior to a change in the interference environment. Bands 1 and 3 are in use by the communication process and therefore member of the "used" set 1500. The "available" set contains band 4 and the "interfered" set contains band 2. The middle row shows the sets after the device detects that the interference in band 2 has disappeared. The bottom row shows the configuration after switching to the new configuration using all four bands for communication.

In accordance with FIG. 16, TABLE 4 shows one embodiment of how two bands, bands 1 and 3, can be used to encode data, as would be used to transmit data according to FIG. 16. Data is encoded into clusters consisting of a sequence of two frequency bursts. For example to transmit data value 0, a cluster consisting of a frequency burst in band 1 followed by a burst in band 3, i.e., $f_1$, and $f_3$ bursts are emitted in successive time slots to encode data value 0.

TABLE 4

| Data | Time Slot 0 | Time Slot 1 |
|---|---|---|
| 0 | 1 | 3 |
| 1 | 3 | 1 |

It is an object of the present invention to provide a method to communicate the new channel configuration and the new data coding scheme to the other participating devices.

Figure 19:
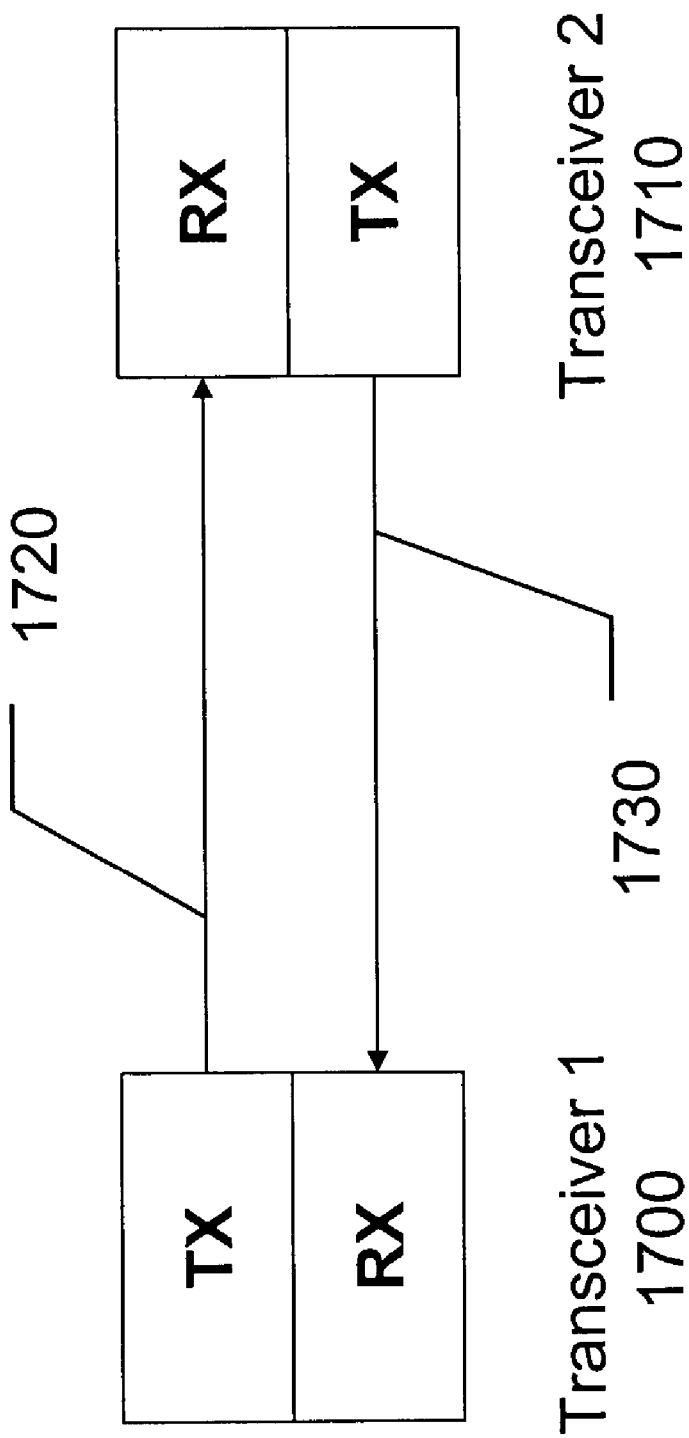
FIG. 19 shows transceiver pairs communicating either using the same set of frequency sub-bands, a mixed set of frequency sub-bands, or an orthogonal set of frequency sub-bands.

In several embodiments, each of the transceiver pairs must contain a copy of the channel state in order to establish a successful communications link with each other. In FIG. 19, the channel configuration in transceiver 1700 is used by the transmitter of transceiver 1700 to transmit data to the receiver of transceiver 1710; however, in order to properly receive the data at the receiver of transceiver 1710, the receiver of transceiver 1710 must assume the channel configuration upon which the data was transmitted. The channel configuration in transceiver 1710 is used by the transmitter of transceiver 1710 to transmit data to the receiver of transceiver 1700. Similarly, in order to properly receive the data at the receiver of transceiver 1700, the receiver of transceiver 1700 must know the channel state upon which the data was transmitted.

As illustrated in FIG. 19, transceiver 1700 communicates with transceiver 1710 over communication link or channel 1720, while transceiver 1710 communicates with transceiver 1700 over communication link or channel 1730. For example, if the receiver of transceiver 1710 determines that there is an interfering signal in a given sub-band over channel 1720 and it alters the current channel configuration (e.g., replacing the interfered band with an available band), the updated channel configuration (channel state) is communicated back to the transmitter of transceiver 1700 via communication channel 1730 prior to the new channel configurations taking effect. There are several ways to encode the new channel configurations, and one such way is to use a special sub-set of symbols as control signals. Until the channel configuration takes effect, due to the presence of the interference, communications containing the new channel configurations will perhaps require more robust communications, perhaps via the use of more coding or redundancy of data bits in the transmission.

Figure 20:
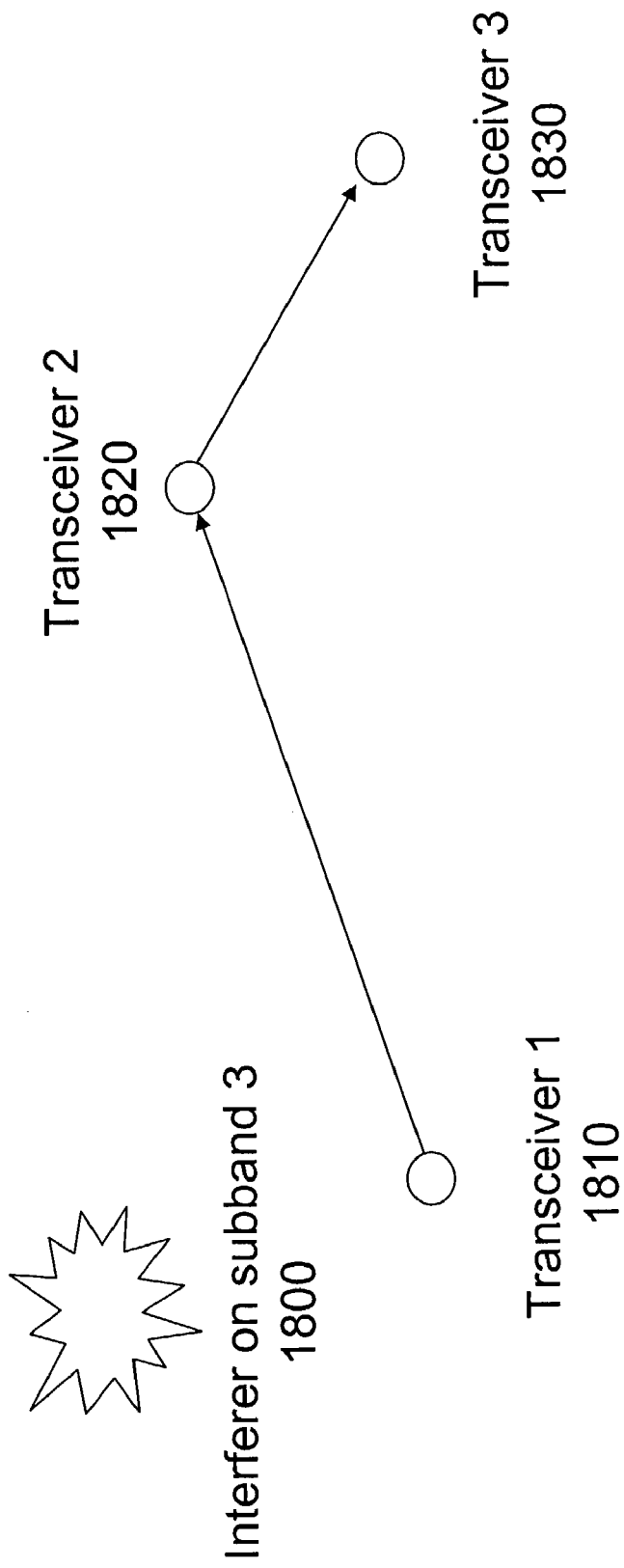
FIG. 20 shows an interferer close to a transceiver adapting to the new environment while the other communication link is unbothered.

The channel states used by a particular transmitter do not have to be the same for all the transceivers, although one common channel state can be shared by all transceivers. For example, in a three device system, where transceiver 1 transmits data to transceiver 2 and transceiver 2 transmits data to transceiver 3, the channel state in transceiver 1 does not have to match the channel state in transceiver 2. As shown in FIG. 20, an interferer 1800 close to transceiver 1810 may render sub-band 3 unusable, but may not interfere with the communications link between transceivers 1820 and 1830. As a result, transceiver 1810 cannot use sub-band 3 to receive information from transceiver 1820, but transceiver 1820 can use sub-band 3 to transmit to transceiver 1830. It is noted that although transceiver 1 cannot use sub-band 3 to receive information, it may be possible that transceiver 1 may effectively transmit in sub-band 3, depending on whether the interferer 1800 interferes with sub-band 3 from the point of view of transceiver 2.

In one embodiment, the channel state consists of the location of signaling bands (the used set), the unused bands (the available set), and the interference bands (the interfered set). Any two out of the three sets will completely describe the communications channel, since the third set can be derived by subtracting the other ones from the set containing all frequency bands.

Figure 21:
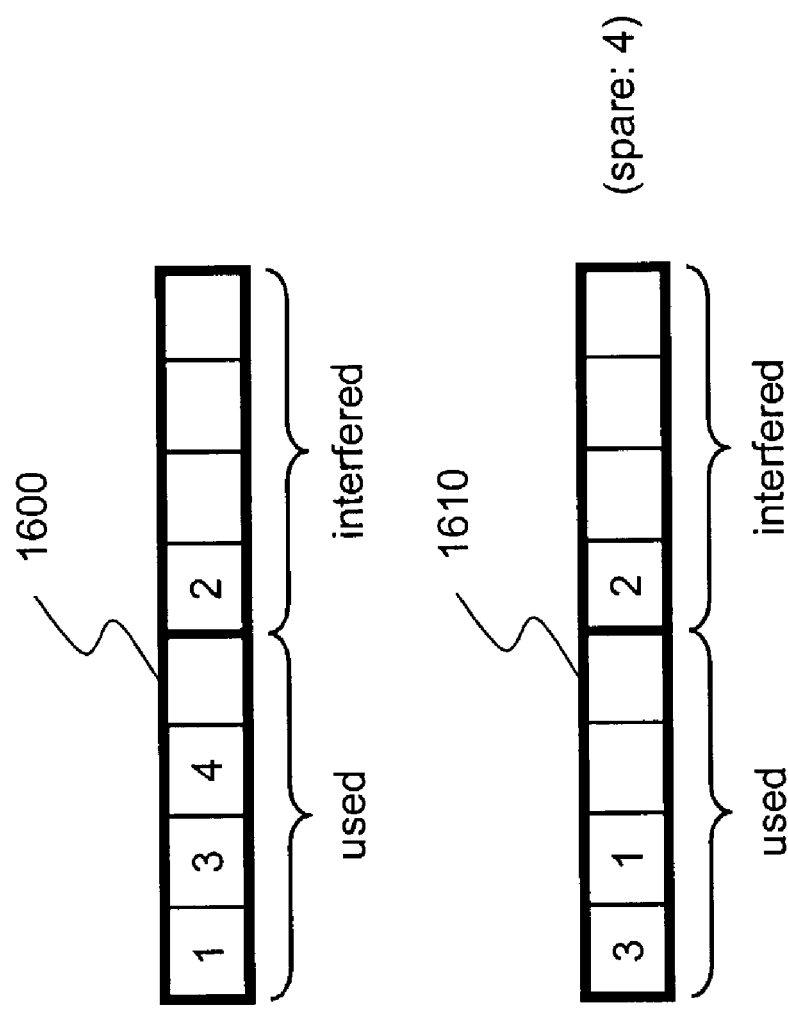
FIGS. 21 and 22 show different example representations of the frequency band information exchanged between two communicating devices.

An embodiment to relay new channel configuration is to send only the channel state (the set of "used", "available" and "interfered" bands) from the transceiver that performed the channel estimation to the other transceivers. The first example in FIG. 21 shows a system that uses four frequency bands for its communications link. The channel state 1600, is represented by the "used" set and the "interfered" set. By definition, the "available" set is the complement of the union of the "used" set and the "interfered" set, and in this case empty, since three of the four bands are used by the system and one of the four bands is corrupted by the interferer. The second example, the channel state 1610 shows two bands (sub-bands 3 and 1) are in use and one band (sub-band 2) is unavailable. As a result, sub-band 4 can be deduced as available for use.

Figure 22:
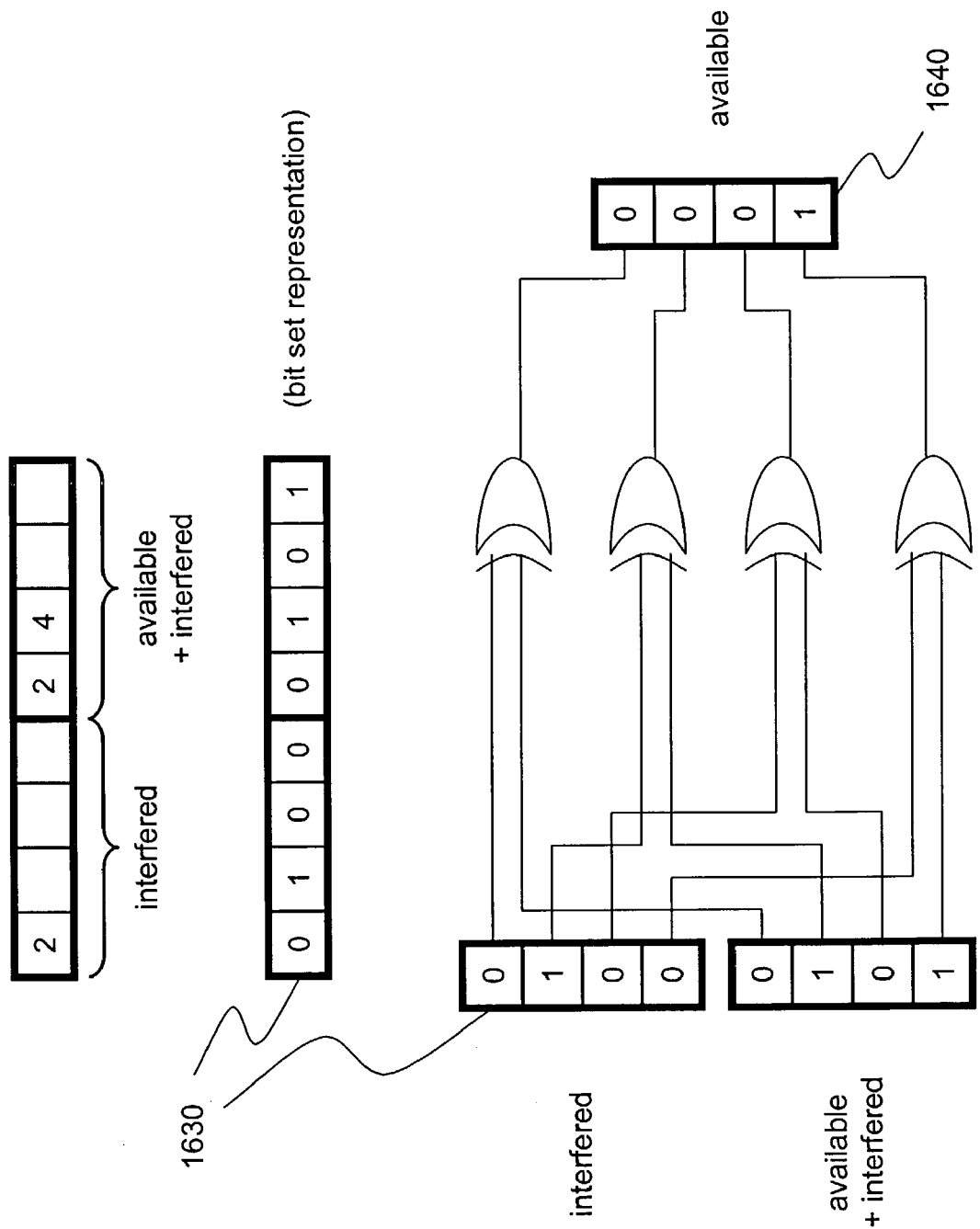

FIG. 22 shows another example of a channel state, using the interfered set and a composite set comprising the union of the "interfered" and the "available" set. Block 1630 shows one embodiment of the channel state. The channel state is encoded into two clusters consisting of two frequency bursts (i.e., there are two sub-bands in "use", sub-bands 1 and 3). The first burst represents the "interfered" set and the second burst represents the union of the "interfered" set and the "available" set. To show that sub-band 2 is in the "interfered" set, a data value 1 is sent on sub-bands 2, and a data value 0 is sent on sub-bands 1, 3, and 4 in the first burst. In the second burst, a data value 1 is sent on sub-bands 2 and 4, while a data value 0 is sent on sub-bands 1 and 3. To deduce the "available" set 1640, the output of the two frequency bursts are XORed, resulting in a 1 in sub-band 4. This example uses the interference as an aid. While transmitting the channel state from one transceiver to another, purposely signal in the interference band. Here, the interference detector (e.g., the detector 155 described above) can successfully deduce the location of the interference, and also the available bands in the presence of interference.

Since the communicating devices transmit and receive on a common set of "used" bands, the channel configuration is completely specified when the "interfered" set is known. Therefore, another method for conveying channel state information is described by broadcasting the "interfered" set to all the devices, the new band configuration can be derived from the current configuration and the interfered set if the devices use the same method to derive a new configuration from the current configuration and the interfered set.

Another embodiment for communicating the channel configuration between the transceivers is to send the channel state and the transmission parameters such as modulation, coding, symbol rate, sub-band bandwidths, and/or any combination of these transmission parameters. These encodings are basically a sub-set of special symbols that have been reserved for signal controls that will be used to define the new system configurations, according to a pre-defined mapping or table. For example, Symbol XYZ can be mapped to the following elements: the used frequency set, the available frequency set, the interfered frequency set, a specific modulation, a specific coding scheme, a specific data rate and particular sub-band bandwidths. An illustration of this is a specific symbol known herein as coding number '4'. Coding number '4' may represent the following: used frequency set of {1,3}, interfered frequency set of {2}, modulation of binary phase shift keying, rate ½ code, no change in symbol rate, and no change in sub-band bandwidths. This number can also be used to identify any combination of the elements listed above. An alternative embodiment concatenates multiple coding numbers to form any combination of the elements mentioned above. For example, the transceivers can agree on using three concatenating code words to express the transmission status, where the first codeword represents the available frequency set, the second codeword represents the interfered frequency set, and the third codeword represents the remaining parameters.

Methods for improving the robustness of transmission are known in the art, and may be used for the transmission of the new channel configuration or just the "interfered" set between the devices in the presence of noise and or interference. Providing reliable communication links over impaired channels such as interference, noise, and others, can come with significant cost, such as lowering the performance of the system, so temporary use of these schemes may allow for the accurate transmission and updating of the channel configuration information, which removes the interferer from the system, thus reducing the need to have perhaps such costly robustness. Such schemes for increasing robustness, include the use of bit redundancy as well as using simpler modulation schemes, smaller symbol sets, lower transmission rates, strong error correction codes, automatic retransmission request protocols (ARQ), combinations thereof, or any other techniques known in the art. One embodiment is to encode the information in a packet, protect the packet with an error correction code, and then send it to the destination transceivers.

After receiving the updated channel configuration or channel state from the first transceiver, the second transceiver must acknowledge the successful reception. This is often implemented by sending an ARQ from the first transceiver to the second transceiver. After such confirmation, the new channel configurations are put to use.

Figure 23:
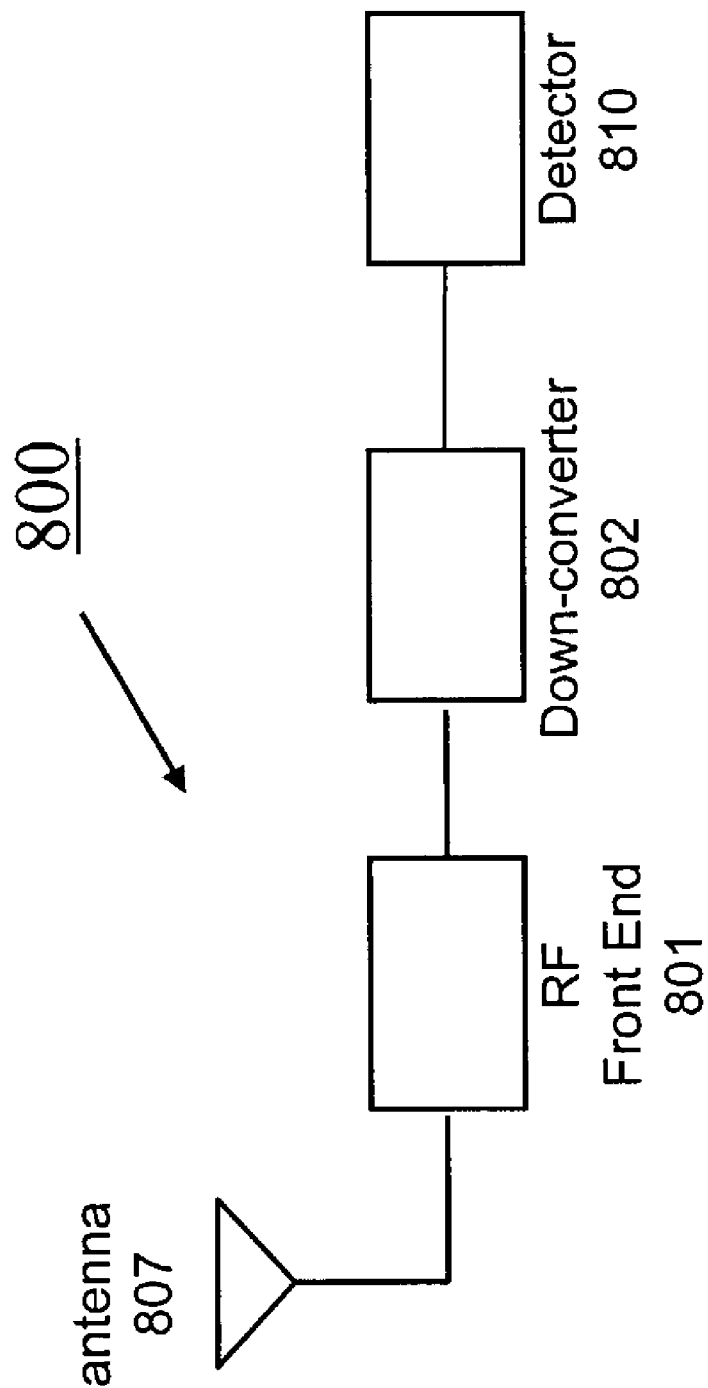
FIG. 23 shows a block diagram of a generic UWB receiver.

FIG. 23 is a block diagram of a UWB receiver 800. Antenna 807 is coupled to RF front end 801, which is coupled to the downconverter 802, which is coupled in turn to the detector 810. RF front end 801 is for preliminary conditioning of the signal and might set the passband of the signal and the level. Due to the nature of UWB multi-bands, it is conceivable that in this part, the signal can be divided. In such a case, a RF splitter could be used; alternatively, the signal can be split later in the chain.

The next block in FIG. 23 is the down-converting block 802, where the signal can be down-converted to baseband or a lower intermediate frequency (IF). One embodiment of this, as known in the art, is zero-IF or direct down-conversion. It is noted that generally, in embodiments including the downconverter 802, the transmitted UWB signals comprise short sinusoidal bursts (at least a portion of a sine wave), as opposed to impulse bursts.

Figure 24:
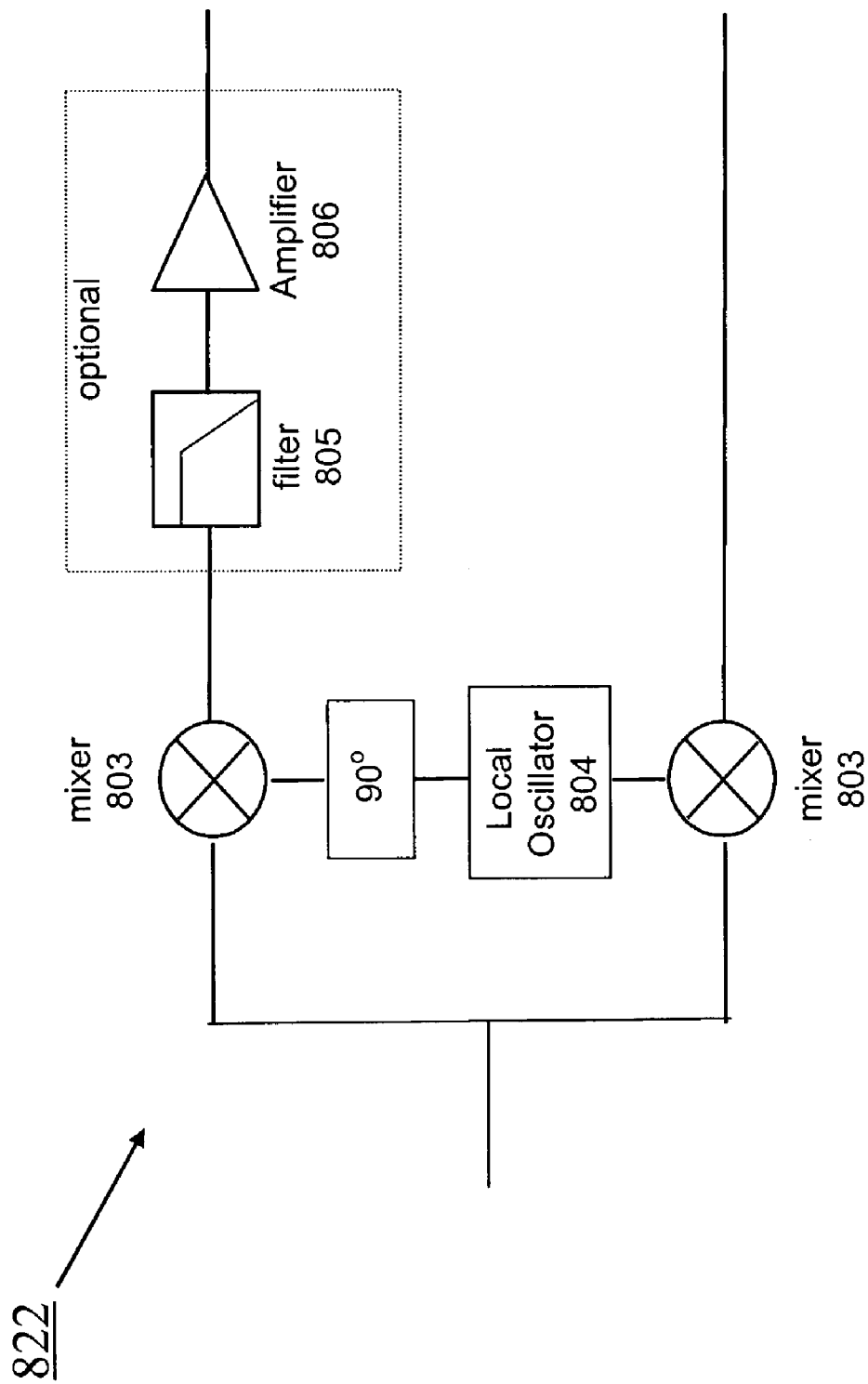
FIG. 24 shows the architecture of a zero-IF block.

FIG. 24 shows the architecture of a zero-IF block 822. As is well known in the art, the signal is coupled to two different mixers 803 to be mixed with a signal from a local oscillator 804 with one signal 90 degrees offset from the other. Optionally included are filter 805 and amplifier 806. Many other down-converting implementations that are common practice include using heterodyne, superheterodyne, and matched filters (correlator). In FIG. 24, it is equally acceptable to use an integrator in place of optional filter 805.

The next block in FIG. 23 is detector 810, which receives the outputs from down-converter block 802. The most flexible detector presently known in the art is the analog to digital converter (ADC) followed by digital detection logic. The ADC takes the signal from the analog domain into the digital domain enabling digital processing. Other methods to detect the signal, as known in the art, include comparators, integrators, filtering, envelope detection, and square law detectors.

Embodiments that may employ these approaches are shown in FIGS. 28A, 28B, 28C and 28D and include single detector systems, multi-functioning detector systems, or detectors used together in parallel with the signals either being pre-split with dedicated VCOs or not.

Figure 28B:
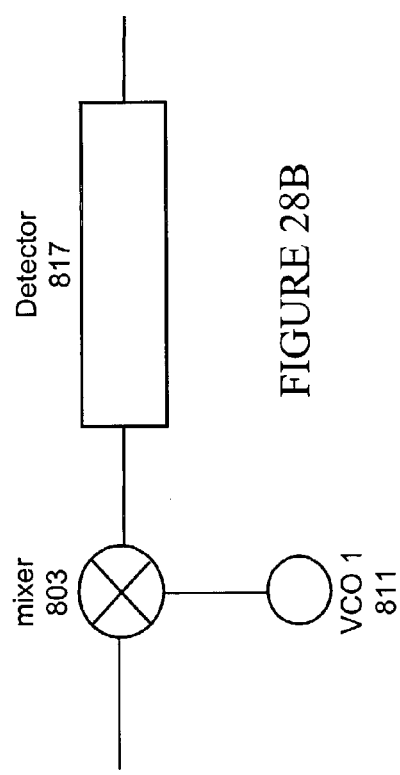
FIGS. 28A-28D show various embodiments of detector structures, ones which have sub-band signals pre-split and others with dedicated frequency detectors.
Figure 28D:
Figure 28A:
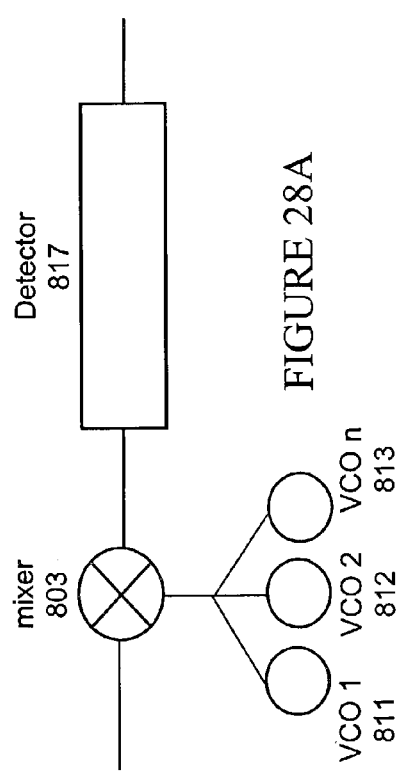

FIG. 28A shows an implementation using one detector 817 and one mixer 803 with several VCOs 811, 812 and 813 that are multiplexed, multiplexer not shown, but used between mixer and all VCOs. The inputs to the mixer 803 are the output from the RF front-end and the multiplexed VCO signals. This implementation may be limited by how fast the signals can clear the detector 817, how fast the VCOs may switch, and how fast the multiplexer can work.

FIG. 28B shows a simpler implementation than FIG. 28A, using one detector 817 and one mixer 803 with just one VCO 811. The inputs to the mixer 803 are the output from the RF front-end and the VCO signals. To receive and detect multiple frequency bands, the VCO 811 must be able to switch faster than the arrival of the frequency signals. Perhaps this implementation is best suited for lower bit rate systems, which allow ample time for the VCO to switch and the signal to clear the detector 817.

Figure 28C:
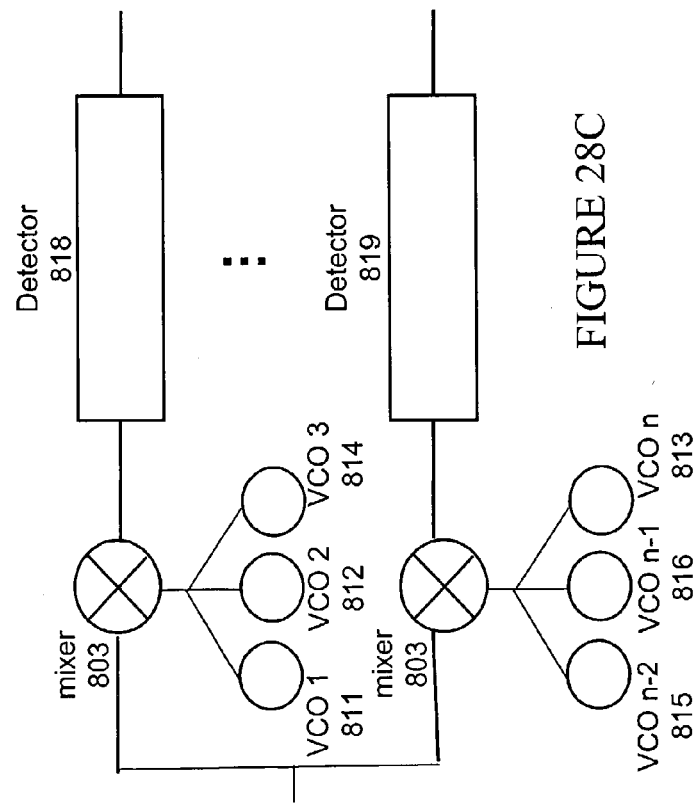

FIG. 28C shows an implementation using more than one detector 818, 819 along with more than one mixer 803, while also utilizing several VCOs (811, 812, 814 and 815, 816, 813) that are multiplexed, multiplexers not shown, but used in each finger between the mixer and the VCOs. The inputs to the mixers 803 are the split output from the RF front-end and the multiplexed VCO signals. This system may require two or more fingers, and allows the received signal additional leniency for clearing the detector 818, 819 and switching in the VCOs. The signal may simultaneously be detected by any of the fingers.

FIG. 28D shows a similar implementation to that of FIG. 28C except that it has dedicated VCOs 811 and 813 per finger, perhaps this is a simpler architecture. Thus, it may be necessary to have more fingers to accommodate an equal bit rate to that of FIG. 28C. This implementation allows a constant monitoring of each band by means of dedicated mixers 803, VCOs, and detectors 818, 819; though, the VCOs could be rapidly changed to different frequencies as in FIG. 28B.

Note, a variation on FIG. 23 is to skip down-converter block 802 and go directly into the 810 detector from RF block 801, and there are many known methods in the art, such as using a set of bandpass filters followed by an envelop detector.

A transmitter suitable for UWB communications is described in U.S. Pat. No. 6,026,125 (which is incorporated herein by reference); particularly, the impulse-gated oscillator which produces an extremely wide bandwidth pulse. It suggests that with suitable choice of oscillator and mixer, UWB signals can be generated with center frequencies from DC to millimeter wave frequencies. It further suggests that one implementation could use a bandpass or pulse shaping filter to govern the signal bandwidth. Additionally, the use of an output bandpass filter may further limit the out of band energy; and the use of an optional amplifier may be desired prior to applying the signal to the signal launcher.

Another suitable transmitter, described in U.S. Pat. No. 6,026,125 uses an impulse generator and bandpass or pulse shaping filter without the need for a separate oscillator and mixer.

The preferred transmitter embodiment is described in U.S. patent application Ser. No. 10/255,103 (filed Sep. 26, 2002, entitled TUNABLE OSCILLATOR, which is incorporated herein by reference), which describes the use of a tunable ring oscillator which is notably advantageous to ensure the transmitter be reduced to a chipset. This approach describes an oscillator including a common logic circuit and a plurality of delay lines for the burst generation. Each delay line is configured to receive a state transition at its input terminal and to output a corresponding state transition at its output terminal after a corresponding delay. An output terminal of each delay line is in electrical circuit with a corresponding input terminal of the common logic circuit, and the input terminal of each of the delay lines is in selectable electrical circuit with the output terminal of the common logic unit. The common logic circuit is configured to output a state transition at its output terminal in response to a state transition at any one of the input terminals of the common logic circuit. Additionally, this patent document describes configurations of burst generators and transmitters.

Figure 25:
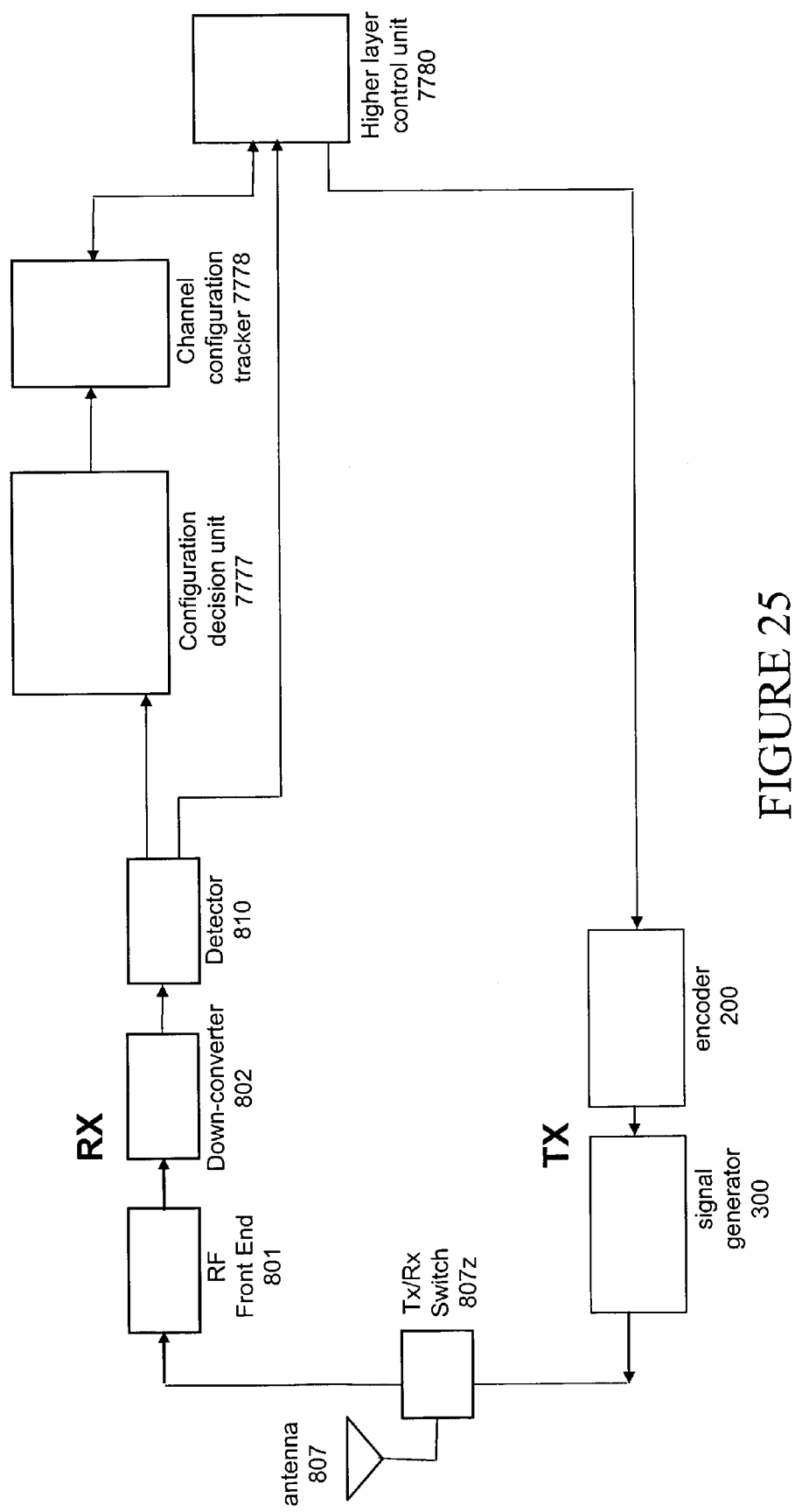
FIG. 25 shows a block diagram of one embodiment of an implementation of a transceiver incorporating data transfer and interference identification and adaptation.

FIG. 25 shows an implementation of a transceiver (e.g., to be used for each transceiver 1700 and 1710 of FIG. 19) incorporating data transfer and interference identification and adaptation. Blocks 801, 802, and 803 are the previously described generic receiver of FIG. 23; configuration decision unit 7777 implements the following blocks from FIG. 2, 200, 210, 220, 230, 260, 270, 280, and 290. That is, in one embodiment, block 7777 includes an interference detector. The configuration decision unit 7777 awaits instructions from higher layer control unit 7780 to either listen to random bands to check for interference or to wait for a specified time or symbol that is sent as part of perhaps a training signal. If 7777 does not detect interference, the control signal given to 7780 is a zero. If however 7777 detects interference, then it first selects the appropriate configuration (based on the compensation technique, such as a technique of FIGS. 10-18) and then it passes this information onto blocks 7778 (channel configuration tracker) and to block 7780. The channel configuration tracker has two functional sections to it, the first being the present channel configuration, and other being the newly defined configuration. The newly defined configuration will not be implemented until Block 7780 receives back an ACK (acknowledgement) from the other transceiver. Block 7780 takes the input from 7777, packages it and has it transmitted to the other transceiver. For example, the information is encoded at encoder 200 and an appropriate signal is generated (at signal generator 300) and transmitted via antenna 807. It awaits the ACK, and if it times-out waiting, will resend the configuration details until it receives the ACK. Block 7780 may transmit the existing and/or the new configuration, for this transmission, as the other transceiver may not have yet updated its configuration. Once the ACK is received, block 7780 updates blocks 7778, 802, and 200, to activate the new configuration. At the other transceiver, the one receiving new configuration details, part 240 of FIG. 2, after receiving this new configuration details, it will update its channel configuration, and start listening for signals using the new configuration. This transceiver may also allow for monitoring of the old configuration, in case the ACK was not received.

Figure 26:
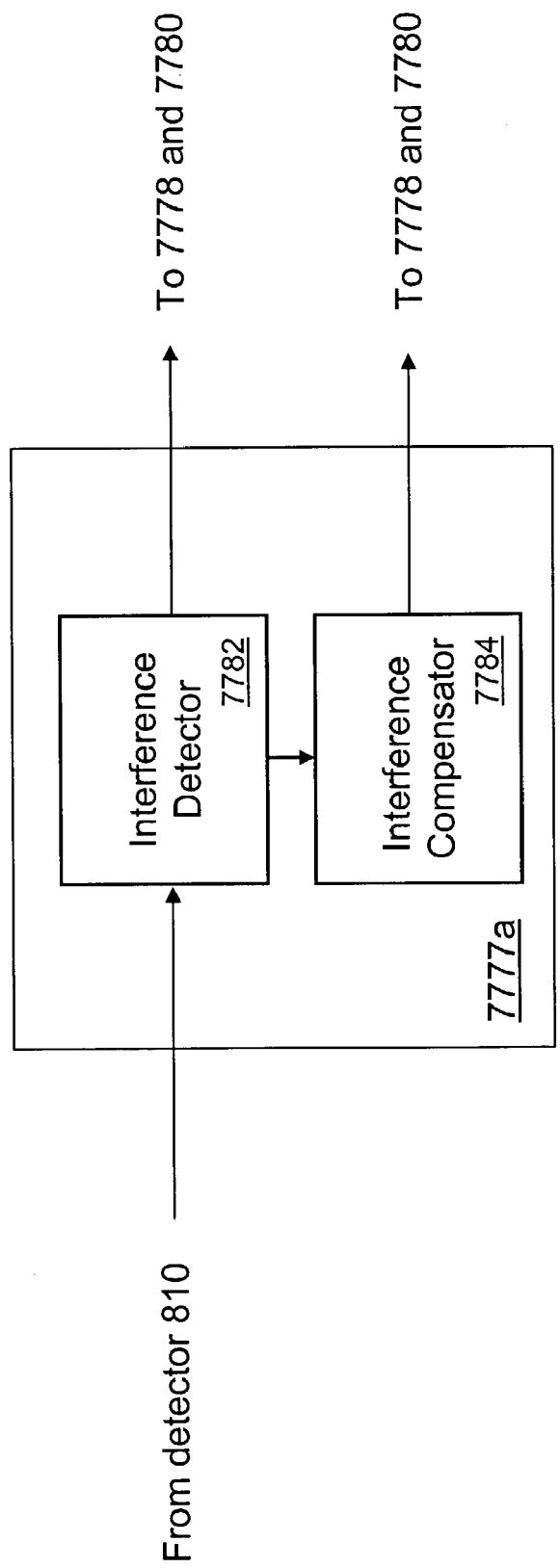
FIG. 26 shows one implementation of a configuration decision unit of FIG. 25.

FIG. 26 shows one implementation of a configuration decision unit 7777a of FIG. 25. In this embodiment, the functional components of 7777a include an interference detector 7782 for detecting the presence of an interfering signal and an interference compensator 7784 for making the appropriate changes in the sub-band assignments to affect a configuration change. As illustrated, the input from detector 810 is coupled to the interference detector 7782, which notifies the interference compensator 7784 in the event an interfering signal is detected in a sub-band. In one embodiment, 7782 outputs the presence or lack of an interfering signal to the channel configuration tracker 7778 and the control unit 7780, while 7784 outputs the updated or modified channel configuration to allow continued operation in the presence of the interfering signal.

According to several embodiments, the interference compensator 7784 (and generally the configuration decision unit 7777) implements several of the methods described above. For example, in some embodiments, 7784 implements Blocks 220, 230, 260, 270, 280 and 280 of FIG. 2. It is also understood that the functions of 7784 may be variously implemented within other functional blocks and remain in accordance with several embodiments of the invention.

Figure 27:
FIG. 27 shows one embodiment of a higher layer control unit of FIG. 25.

FIG. 27 shows higher layer control unit 7780 of FIG. 25. This control unit 7780 comprises inputs: channel configuration 9000, new configuration 9001, and data 9002 (direct from detector 810). The channel configuration input come from block 7778 and give the present channel configurations. New configuration input 9001 comes from block 7777 to pass information on the selected new configuration. Data input 9002 comes from block 810, and is the received, detected, and decoded signals. Outputs 9003 (update changes), 9004 (channel configuration), 9005 (data), and 9006 (interference control signals) communicate with various parts of the transceiver. Output 9003 communicates with block 7778 to enable the new configuration upon return of the ACK. Output 9004 updates down-converter block 802 and encoder block 200 for the purpose of enacting the new configurations to allow for continued transceiver communications. Output 9005 communicates with block 200, and is used for sending out the new configuration details to the other transceiver to facilitate the reception of an ACK. Output 9006 communicates with block 7777 to learn if an interference is present, namely a zero if there is no detected interference, or receiving a one along with the newly selected configuration details.

According to several embodiments of the present invention, methods are provided to adapt a multi-band communication system to an interference source by adjusting the configuration of the bands (also referred to as sub-bands) used for communication. One or more communication devices monitor the communication channel for interference sources and, having determined that the interference present requires adjustment of the configuration, determine the countermeasure, communicate the measure to other devices involved in the communication, and adapt to the interference according to the present invention. In deciding among the possible countermeasures, a device is assumed to consider the boundaries of the decision space, including frequency range restrictions imposed by regulatory bodies, minimum frequency band widths for reliable communication or as set by regulatory bodies, allowed transmission power levels, and other such parameters affecting the decision as known in the art.

In the following embodiments, methods of flexibly adapting to an interference are provided in which the one or more frequency sub-bands of a multi-band signaling scheme are shifted, adjusted and/or otherwise modified, for example, by altering the center frequency and/or the bandwidth of one or more sub-bands. This is in contrast to the methods described, for example, with reference to FIGS. 10-18, in which fixed sub-bands are removed, added, or replaced with other fixed sub-bands. These flexible adapting methods generally require that a given transmitter and receiver pair (e.g., two communicating transceivers), be able to alter the signaling transmitted and received during operation in accordance with the shifted, adjusted and/or modified sub-bands in reaction to a detected interfering signal (interference). Examples of portions of such transmitters and receivers are illustrated in FIGS. 30-34, while examples of various adaptation methods are illustrated in FIGS. 35-40.

In the following description, it is assumed that only a single interference source is present. However, it will be readily apparent to persons skilled in the art that method presented is equally applicable to multiple interference sources by considering more than one interference sources simultaneously when applying the method, or by iteratively applying the method considering one interference source per iteration.

Figure 35:
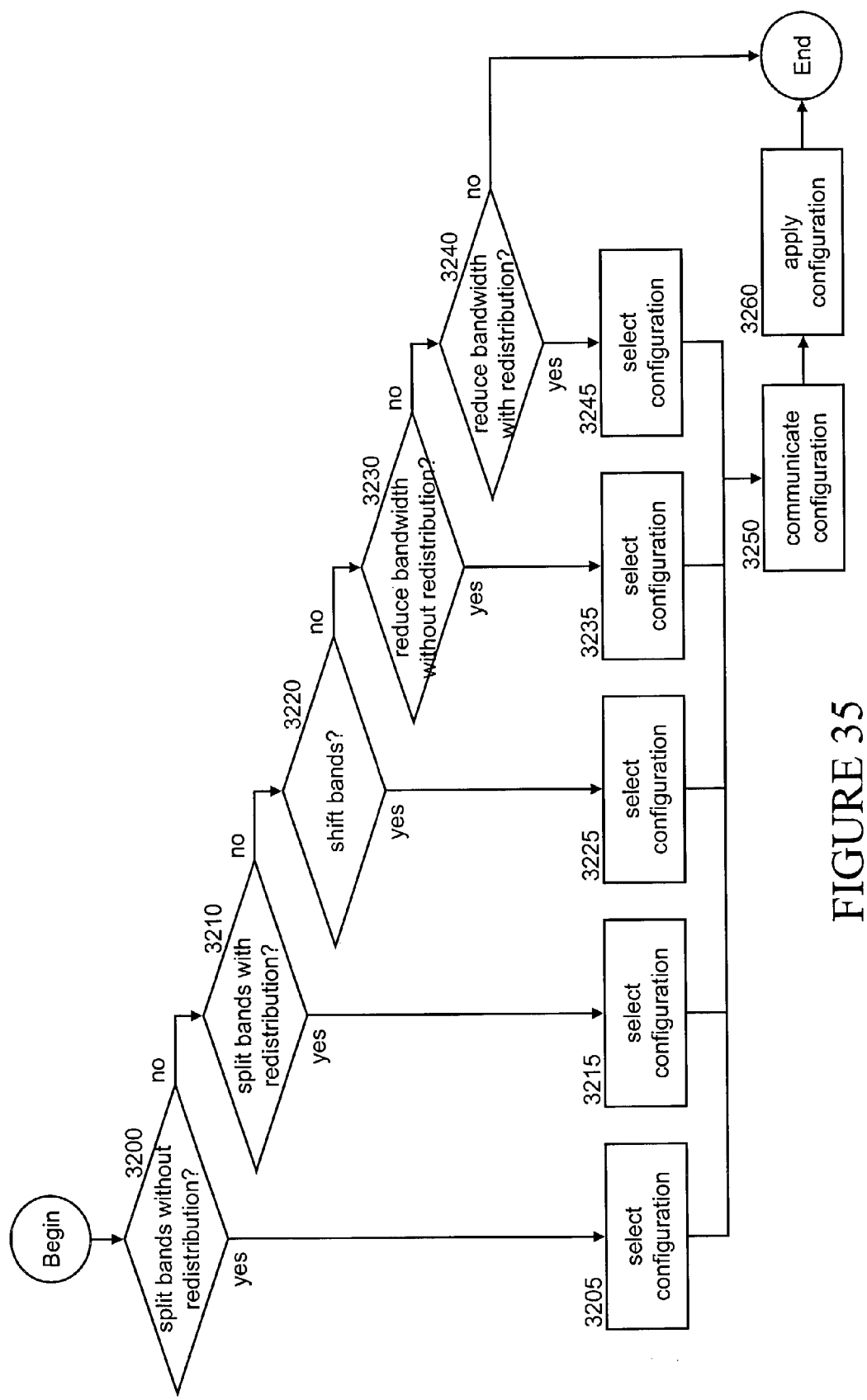
FIG. 35 shows a flow diagram illustrating how a method in accordance with an embodiment of the present invention adapts to narrowband interference without abandoning bands used for communication.
Figure 36:
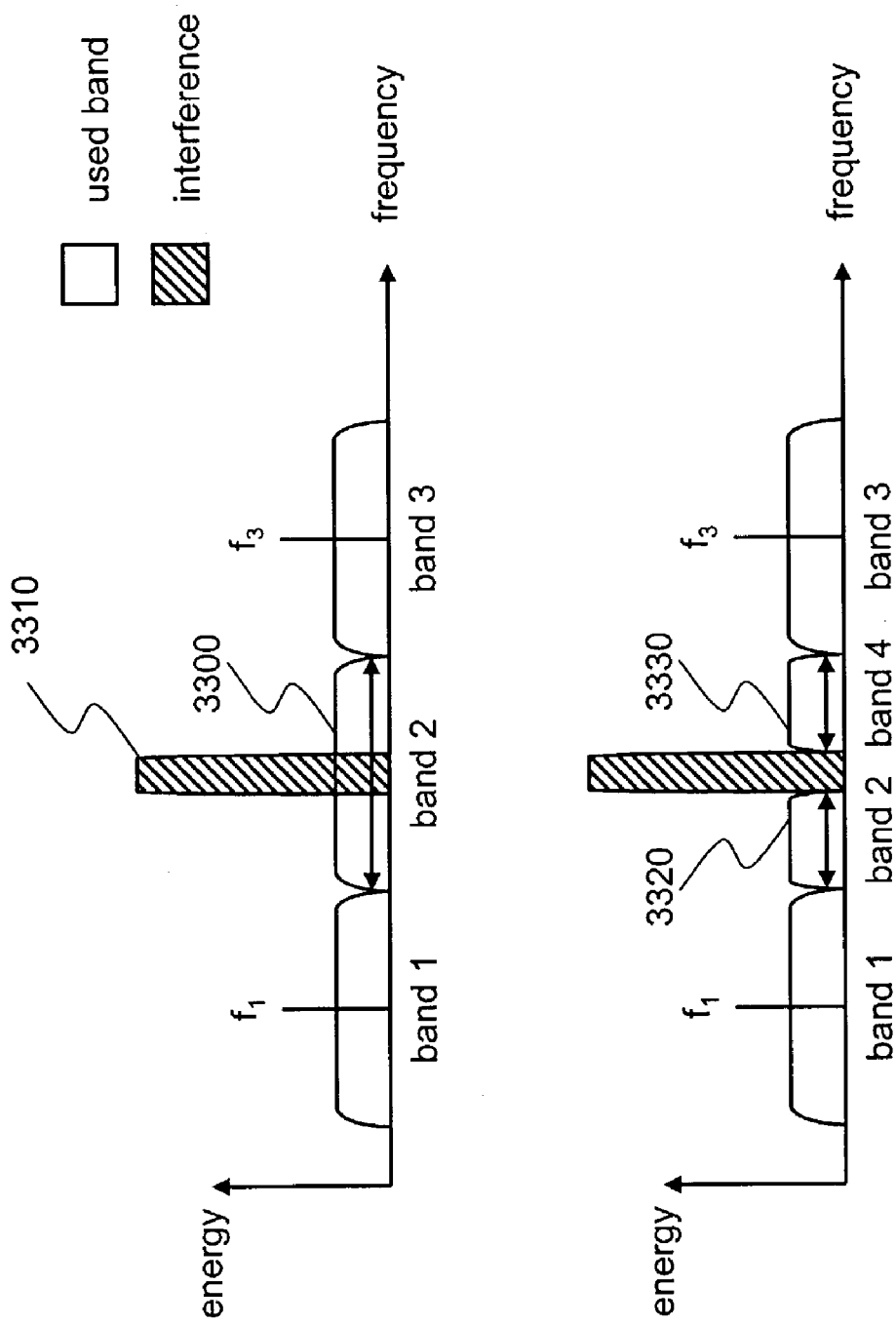
FIG. 36 illustrates one embodiment of a method of adapting to a narrowband interference source by splitting the band affected by interference in two sub-bands without adjusting the bandwidth of other bands in use.

Referring to FIG. 35, a method according to one embodiment of the present invention begins at step 3200 after the device detects interference (e.g., by interference detector 155 or 7782 described above) in one or more of the bands used for communication. An interference source is characterized by its center frequency and its bandwidth. At step 3200, the device makes a determination as to whether the frequency band (also referred to herein as a frequency sub-band) affected by the interference source should be split around the interference, yielding two sub bands of smaller bandwidth. This situation is illustrated in FIG. 36, where frequency band 3300 is subject to interference source 3310. During the split, band 3300 is divided into two sub-bands 3320 and 3330 of smaller bandwidth than band 3300.

The determination about whether to divide the interfered band may be based on whether the communicating devices can support more bands, whether the resulting sub-bands each provide sufficient bandwidth for successful communication, or other decision factors known in the art.

After determining that the affected band should be split at step 3200, the device at step 3205 selects a new configuration of the bands used for communication (also referred to as a channel state information), whereby the band affected by interference is replaced with two sub-bands (3320 and 3330 in FIG. 36).

To use these sub-bands instead of the original band 3300 in FIG. 36, the device communicates the new configuration to the other communicating devices in step 3250 in FIG. 35. For example, in the system of FIG. 19, the receiver of transceiver 1710 (which detects the interference and decides to create sub-bands 3320 and 3330)(each transceiver may be implemented as illustrated in FIGS. 25-27) communicates this decision and new configuration via communication channel 1730 to the receiver of transceiver 1700 for use by its transmitter.

Upon successfully communicating the new configuration, the device changes to the new configuration at step 3260 and continues to communicate in the new configuration.

Figure 37:
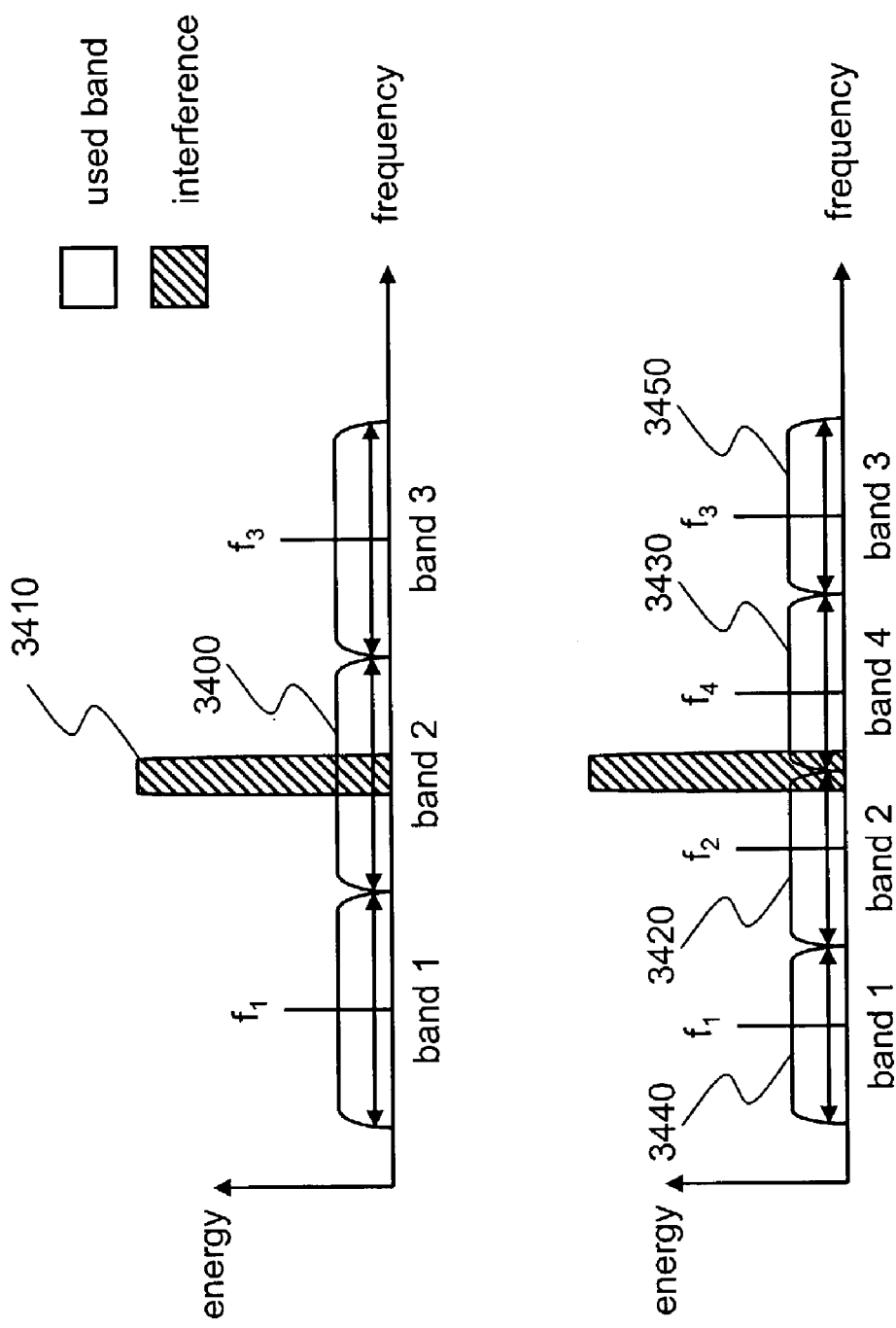
FIG. 37 illustrates another embodiment of a method of adapting to a narrowband interference source by splitting the band affected by interference in two sub-bands whereby the bandwidth other bands used may be adjusted.

If, at step 3200, the device determines that a split by solely dividing the affected band is not appropriate, it makes a determination at step 3210, as to whether a split should be made around the interference source, whereby the bandwidth assigned to one or more of the bands not being split may be altered as well. This situation is shown in FIG. 37, where band 3400 is interfered by interference source 3410. After dividing band 3400 into sub-bands 3420 and 3430, the bandwidths of bands 3440 and 3420 below the interferer 3410 are adjusted to provide the new sub-band 3420 with sufficient bandwidth. A similar redistribution of bandwidth among the bands above the interferer is performed yielding appropriate bandwidth for bands 3430 and 3450.

The determination about whether to divide the interfered band may be based on whether the communicating devices can support more bands, whether the resulting bands each provide sufficient bandwidth for successful communication, or based on other decision factors known in the art.

If, at step 3210 in FIG. 35, the device determines that the band under interference should be split, it selects at step 3215 the new configuration, splitting the affected band into two sub-bands and redistributing the bandwidth such that each band provides sufficient bandwidth for communication. The device then continues at step 3250.

Figure 38:
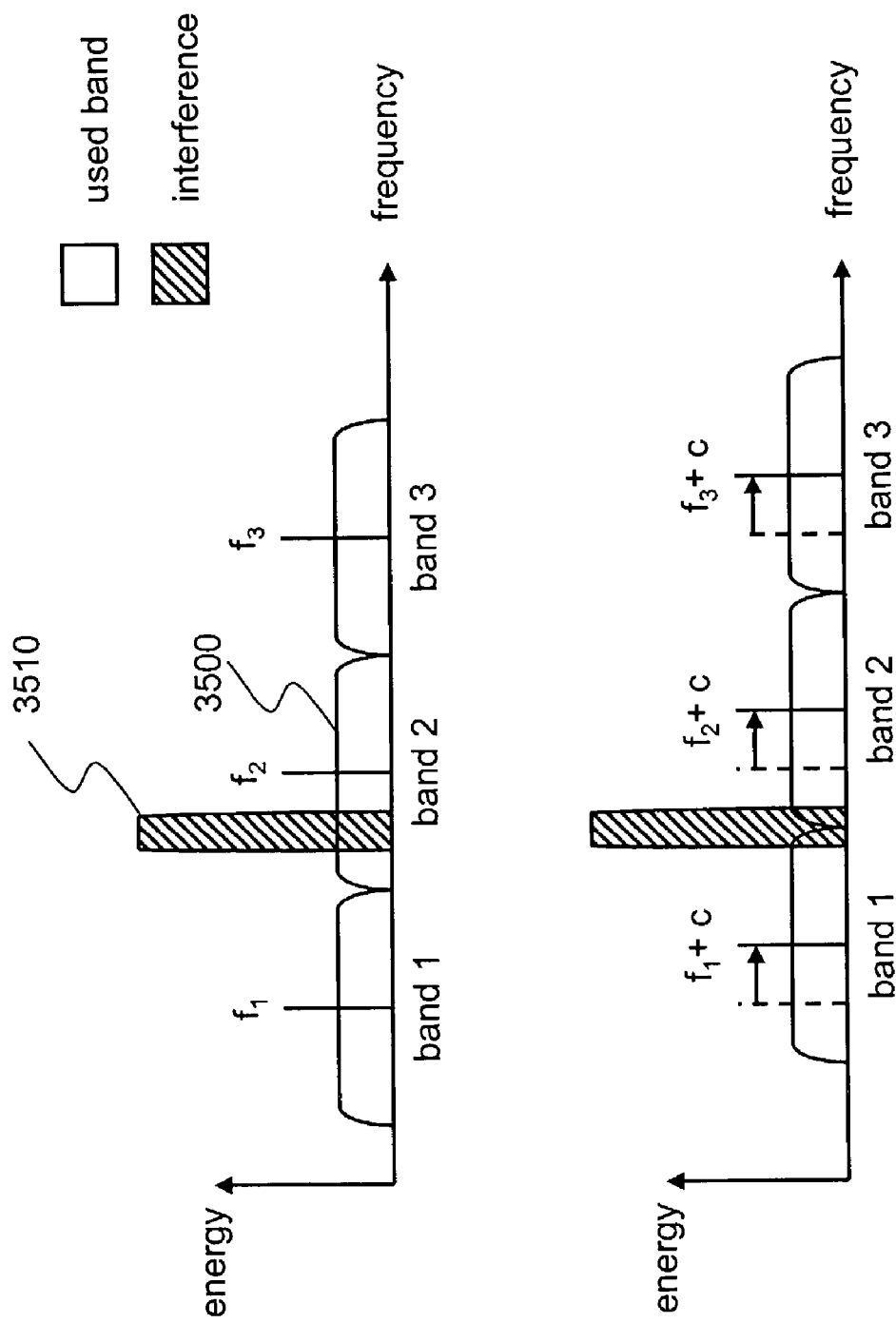
FIG. 38 illustrates another embodiment of a method of adapting to a narrowband interference source by shifting the center frequencies of the bands used for communication as to move the interference source between bands.

If the device determines that a split of the affected band is not appropriate at step 3210, the device continues at step 3220, where it determines whether the effect of the interference source can be mitigated by shifting the bands such that the spectrum of the interferer lies between or at the edge of one or more of the bands used for communication. This situation is illustrated in FIG. 38, where band 3500 is subject to interference 3510. To mitigate the effect of the interferer, the center frequencies of all bands are shifted, such that the interference lies between two bands, below the lowest, or above the highest band. In the preferred embodiment, all bands are shifted by the same offset (constant c in FIG. 38), although it is well understood that is equally possible to shift only some of the bands or to shift the bands by a different offset, possibly in different directions.

The determination made at step 3220 in FIG. 35, about whether to shift bands, may be made based on the presence of additional interference in other parts of the spectrum, on regulatory restrictions, such as which parts of the spectrum may be used by the device for communication, on characteristics of the spectrum related to the transmission quality of the signals, or on other criteria known in the art.

If, at step 3220, the device determines that the communication bands should be shifted, it selects, at step 3225, the new configuration using shifted frequency bands. The device then continues at step 3250.

Figure 39:
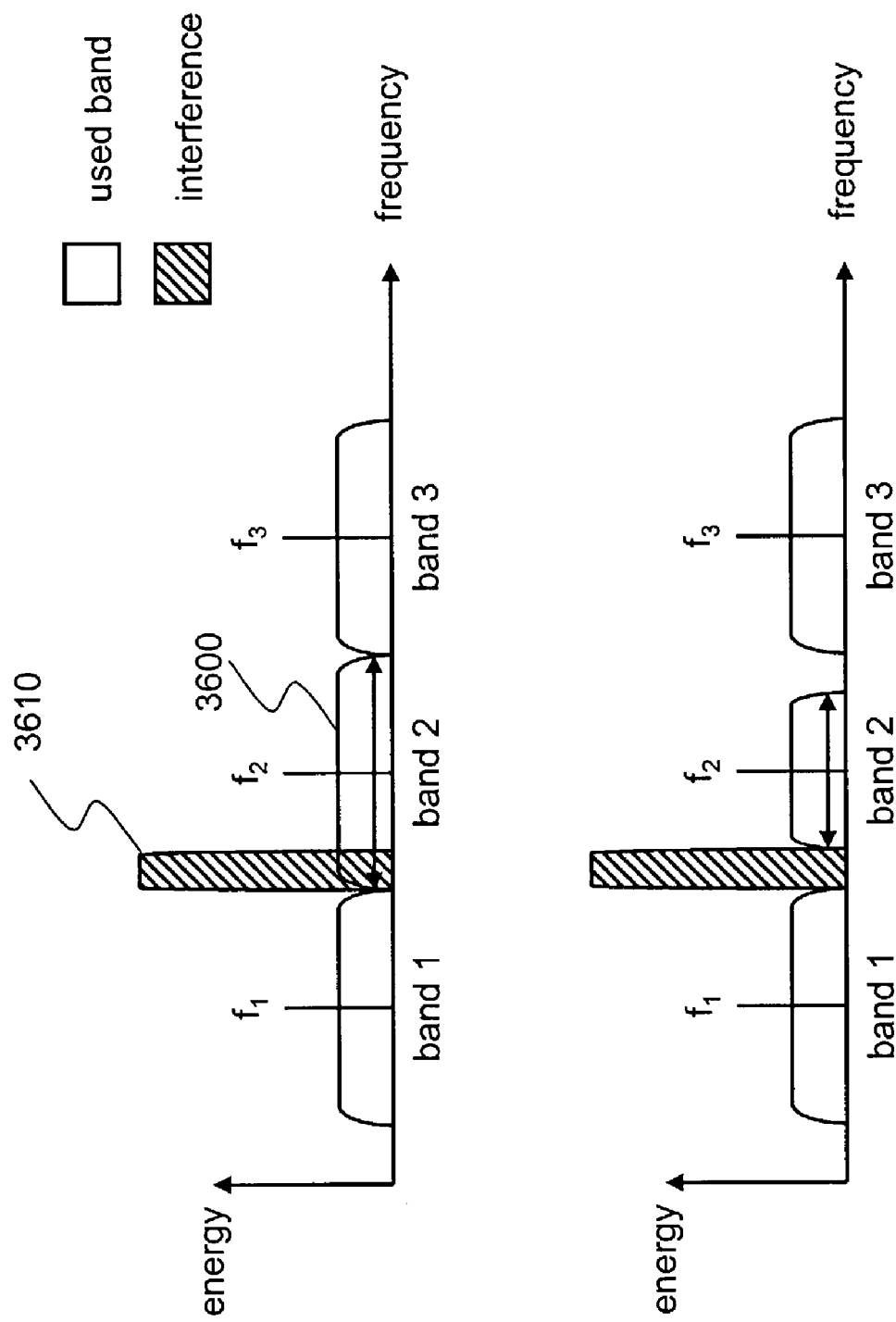
FIG. 39 illustrates yet another embodiment of a method of adapting to a narrowband interference source by reducing the bandwidth of the band affected by the interference without changing bands unaffected by interference.

If the device determines that the frequency bands should not (or cannot) be shifted at step 3220, the device continues at step 3230, where it makes a determination as to whether the bandwidth of the affected band may be reduced to avoid the in-band interference. FIG. 39 illustrates this approach where band 3600 is interfered by interference 3610. The device may chose to reduce the bandwidth of band 3600 to move the interference out of band as shown in the lower section of FIG. 39.

The determination about whether to reduce the bandwidth of the band affected by interference may be based on where the interference is located within the affected band, on whether the reduced bandwidth is sufficient to maintain the desired quality of service provided by the communication link, or on other factors known in the art.

If, at step 3230, the device determines that the interference should be avoided by reducing the bandwidth of the affected band, the device selects a new configuration at step 3235 that comprises the band at reduced bandwidth as well as the other bands not affected by the interference source. The device then continues at step 3250.

Figure 40:
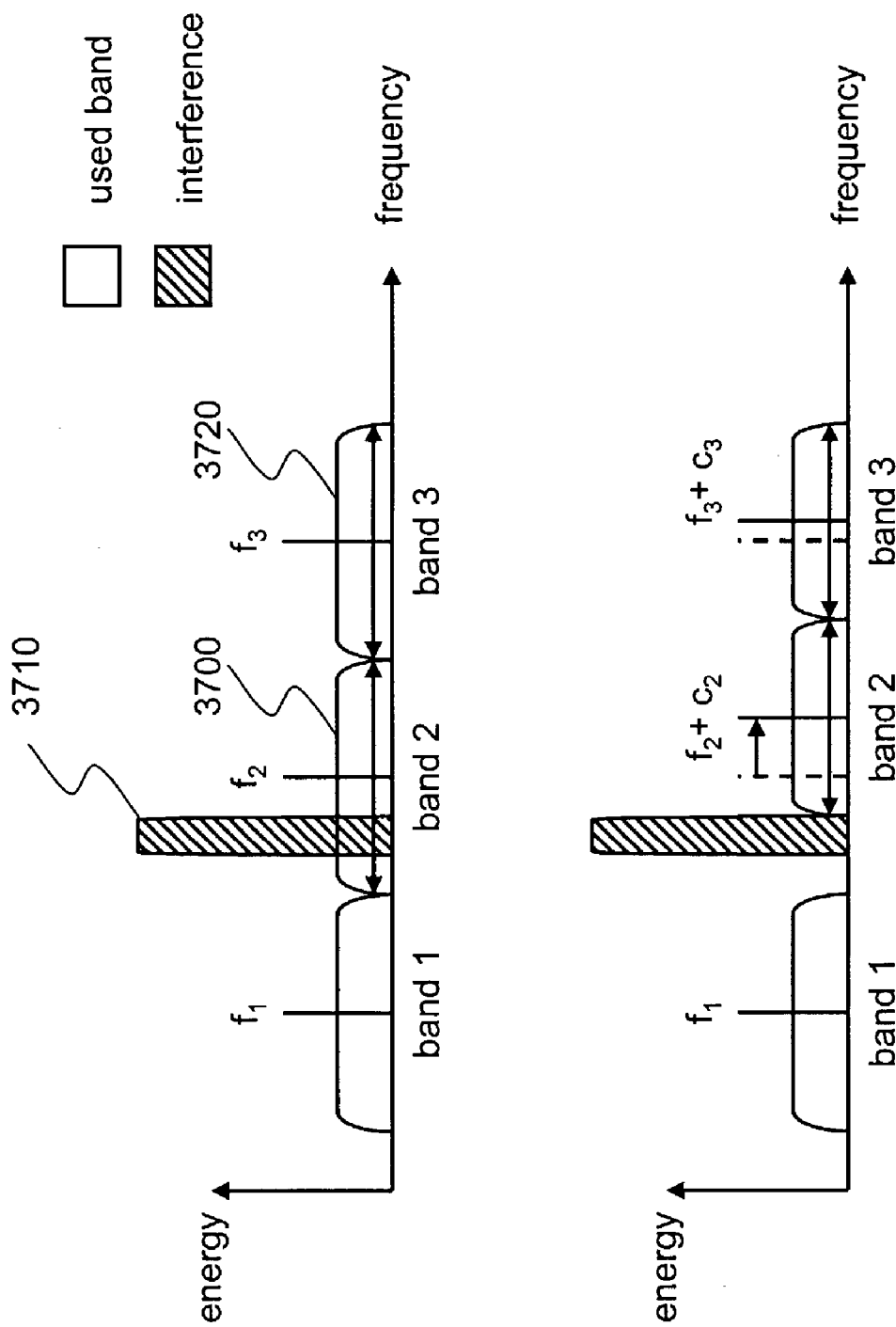
FIG. 40 illustrates a further embodiment of a method of adapting to a narrowband interference source by changing the bandwidth of the band affected, whereby its center frequency and the center frequency and bandwidth of other bands in use may be changed as well.

If, at step 3230, the device determines that a reduction of the bandwidth of the affected band alone is not appropriate, it makes, at step 3240, a determination about whether a reduction of the bandwidth of one or more of the bands not affected by the interference may be advisable. This situation is illustrated in FIG. 40. There, band 3700 is subjected to interference 3710. The band is moved above the interference thereby reducing its bandwidth. The resulting bandwidth is combined with the bandwidth of adjacent band 3720 and redistributed among the two bands as shown in the lower section of FIG. 40.

The determination about whether two redistribute the bandwidth of the bands in order to avoid the interference may be based on the available bandwidth, the location of the interference, or other characteristics known in the art.

If the device determines at step 3240 that the bandwidth should be reduced and redistributed, execution continues at step 3245. There, the device selects a new configuration incorporating the redistribution of the bandwidth among the bands. Then, execution continues at step 3250.

If, at step 3240, the device determines that the bandwidth of the bands should not be redistributed, the device may decide to completely remove the affected band from use for communication. At this point, one or more of the methods previously described (e.g., in FIGS. 10-18) maybe employed to affect a fixed sub-band solution. For example, the affected band may be removed, or replaced by an additional band that is available for communication.

Persons skilled in the art will readily understand that the method presented can be modified in various ways, for example, by applying the decisions in a different order, or by omitting certain decisions. For example, if a system does not support splitting of bands into sub-bands, the decisions made at steps 3200 and 3210 in FIG. 35 may be omitted. That is, a method of flexibly adapting to an interference may include one or more of the methods described in FIGS. 36-40, such as collectively illustrated in FIG. 35.

The method presented may be reduced to practice using a finite state machine, a microprocessor with memory, or other ways known to persons skilled in the art to decide actions to take based on conditions.

Once an interference source is characterized by its center frequency and its bandwidth, countermeasure to such interference needs to be communicated to the devices involved in the communication. One method is to broadcast the new center frequency and bandwidth of the frequency bands used for signaling, where the new center frequency and bandwidth for each of the "used" bands are determined by the countermeasure algorithm stated earlier. However, it is apparent to persons skilled in the art that the method presented here is equally applicable to the method where only the center frequency and bandwidth of the interference is broadcast to all the devices involved in the communication, provided that all the devices use the same countermeasure algorithm. This equivalent method is more efficient when the number of interfering sources is less than the number of signaling bands.

Methods for transmitting information between the devices are known in the arts. One embodiment for conveying system configuration is to encode the center frequency and bandwidth information in a packet, protect the packet with an error correction code, then sent to the transceivers.

Figure 30:
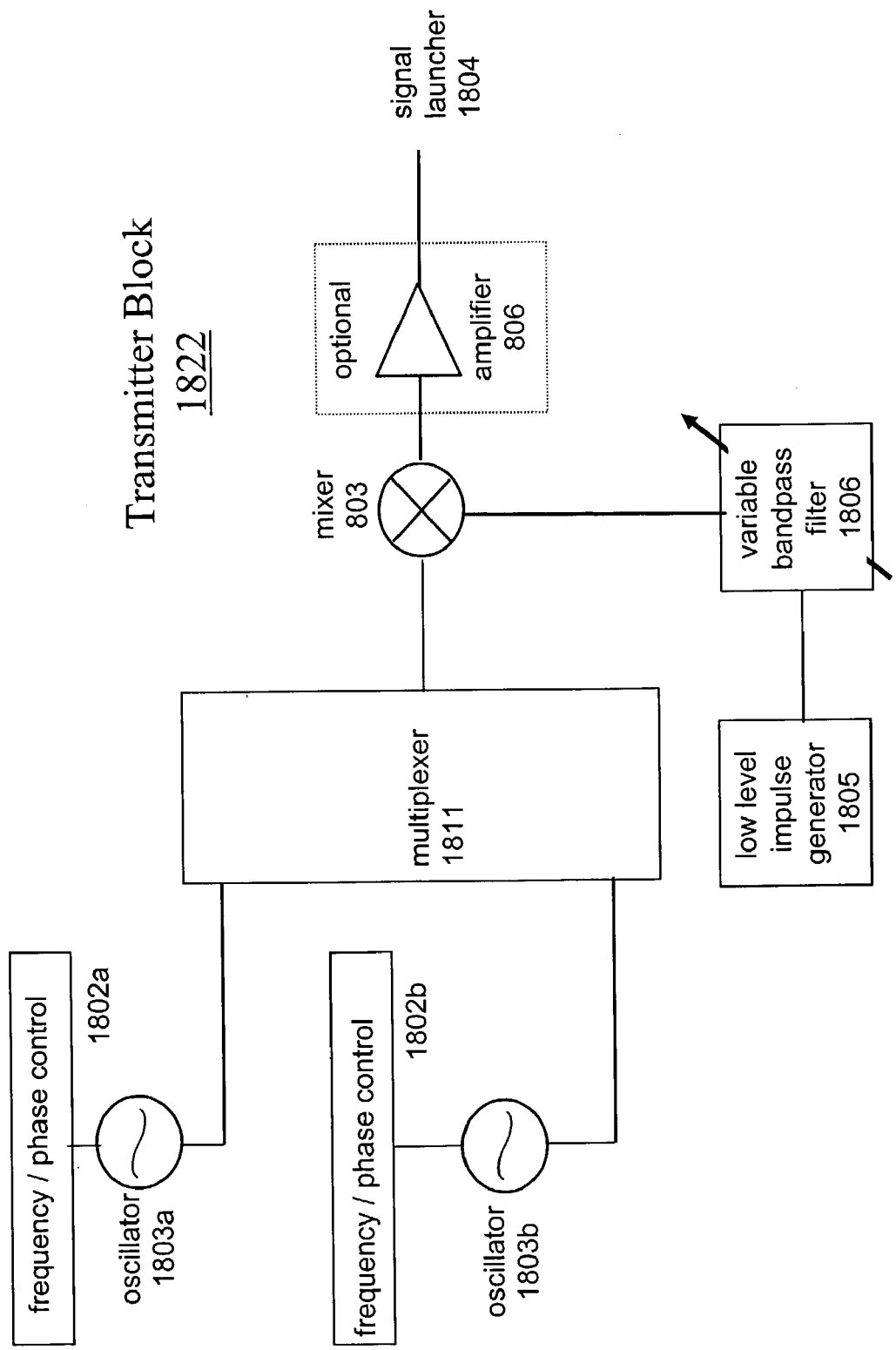
FIG. 30 shows a transmitter block using a variable bandpass filter with several fingers of frequency/phase controllers to generate multi-band signals

There are numerous ways to generate and transmit adaptive signals of varying burst widths and at different center frequencies; many are common practice for one skilled in the art. FIG. 30 shows a portion of a transmitter 1822 in which frequency and phase control blocks 1802 being used with oscillator 1803 and switched in multiplexer block 1812. After the multiplexer 1811, mixer 803 combines the shaped impulses generated by the impulse generator block 1805 after passing through the variable bandpass filter 1806. Filter 1806 is variable so that the filter or shaper can facilitate the generation of the required burst. Filter 1806 can also be used to create RF bursts of different bandwidths by changing its bandwidth. One such way to build a variable bandwidth block is to use a variable capacitor, such as a varactor diode, or use a variable resistor. This new signal passes through an optional amplifier 806 prior to being presented to signal launcher 1804, which may be differently embodied depending on the transmission medium and requirements, e.g., the signal launcher may be embodied to include an antenna, a light emitting diode, a laser diode, impedance matching components, amplifiers, diodes, resistors and/or capacitors.

Figure 31:
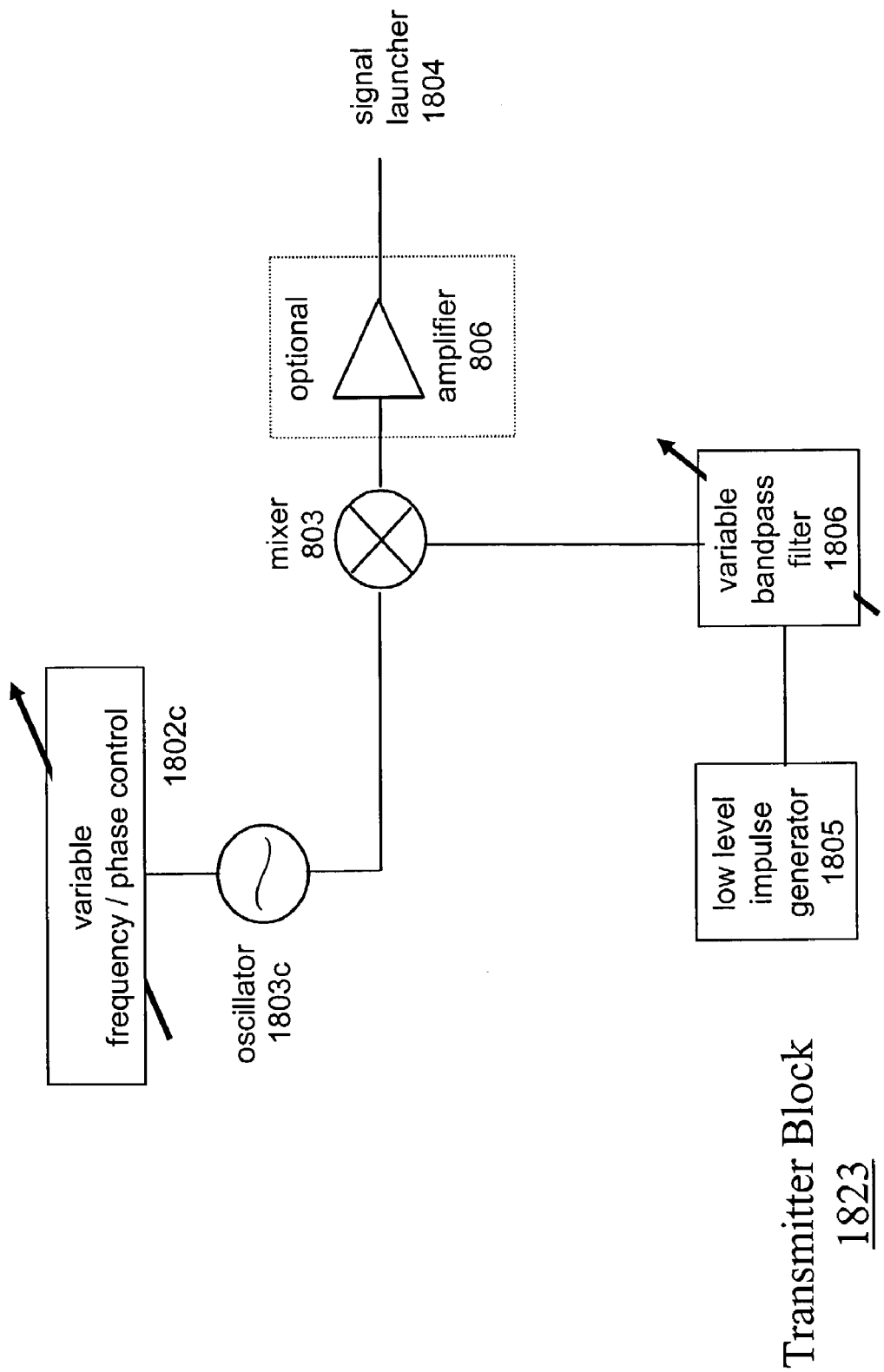
FIG. 31 shows a transmitter block using a variable bandpass filter with a single variable frequency/phase controller to generate multi-band signals
Figure 32:
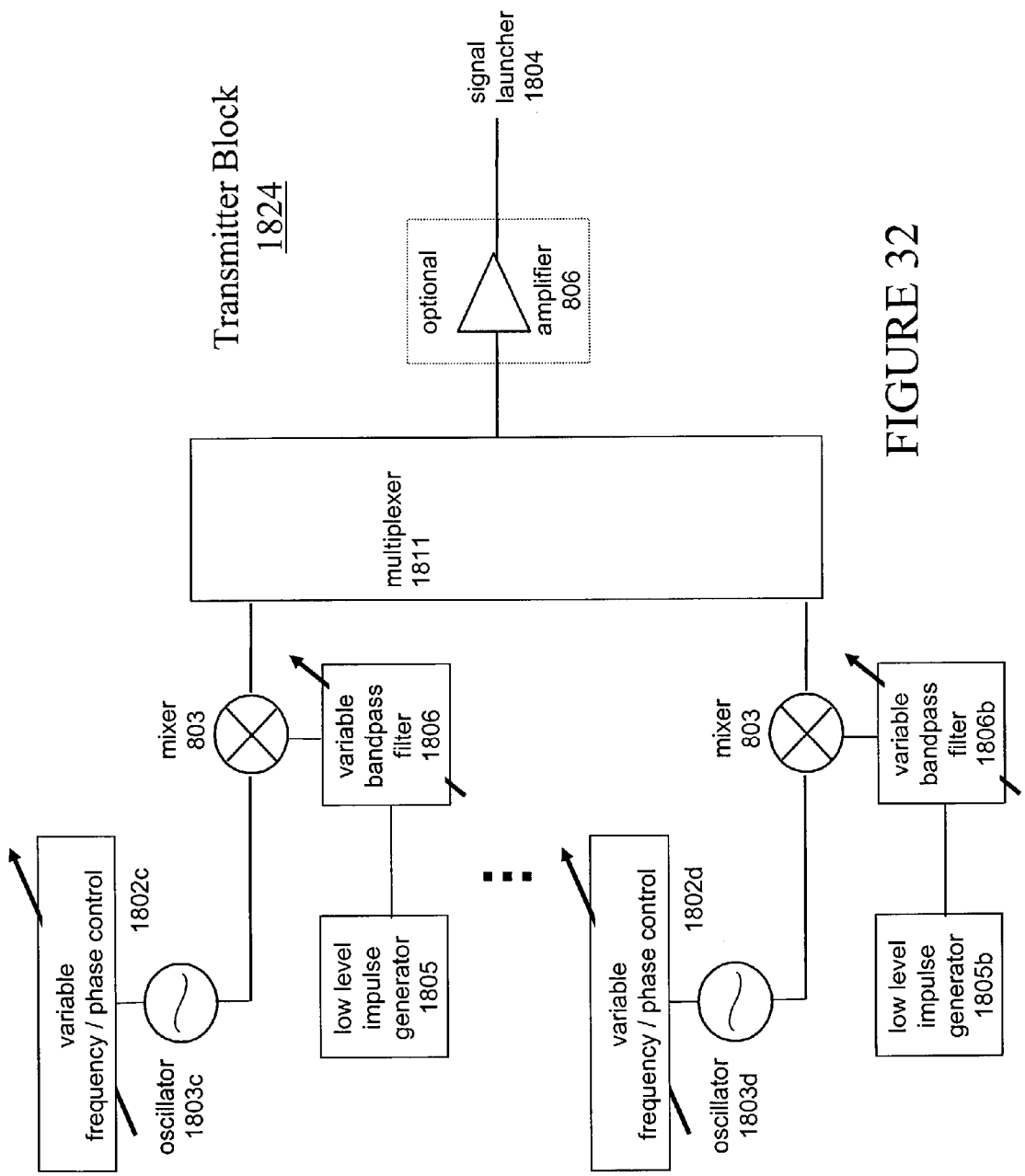
FIG. 32 shows a transmitter block using a variable bandpass filter with several fingers of variable frequency/phase controllers to generate multi-band signals

The use of more than one set of control blocks 1802 and oscillators 1803 is to address a system which can not switch between frequencies fast enough. FIG. 31 shows a system which can quickly switch between frequencies to generate the necessary bursts; note, it uses variable frequency/phase controller 1802c and omits the need for multiplexer 1811 and the use of more than one of blocks 1802 and 1803. FIG. 32 is a variation on FIG. 31, where it uses more than one burst generating circuit to generate the necessary pulse, i.e., multiple variable frequency/phase controllers 1802c, mixers 803, impulse generators 1805 and filters 1806. Note that multiplexer 1811 can be replaced with a RF combiner instead; the output can then passed onto optional amplifier 806 and signal launcher 1804.

For specific use with ultra-wideband multi-band signals, the use of a tunable oscillator, as described in U.S. patent application Ser. No. 10/255,103 (filed Sep. 26, 2002, entitled TUNABLE OSCILLATOR, which is incorporated herein by reference) may be the preferred burst generator and transmitter embodiment, if the desired implementation is in an integrated circuit. The tunable oscillator has control over the burst width (occupied frequency spectrum) and the center frequency of the bursts by means of utilizing various delay lines.

Figure 33A:
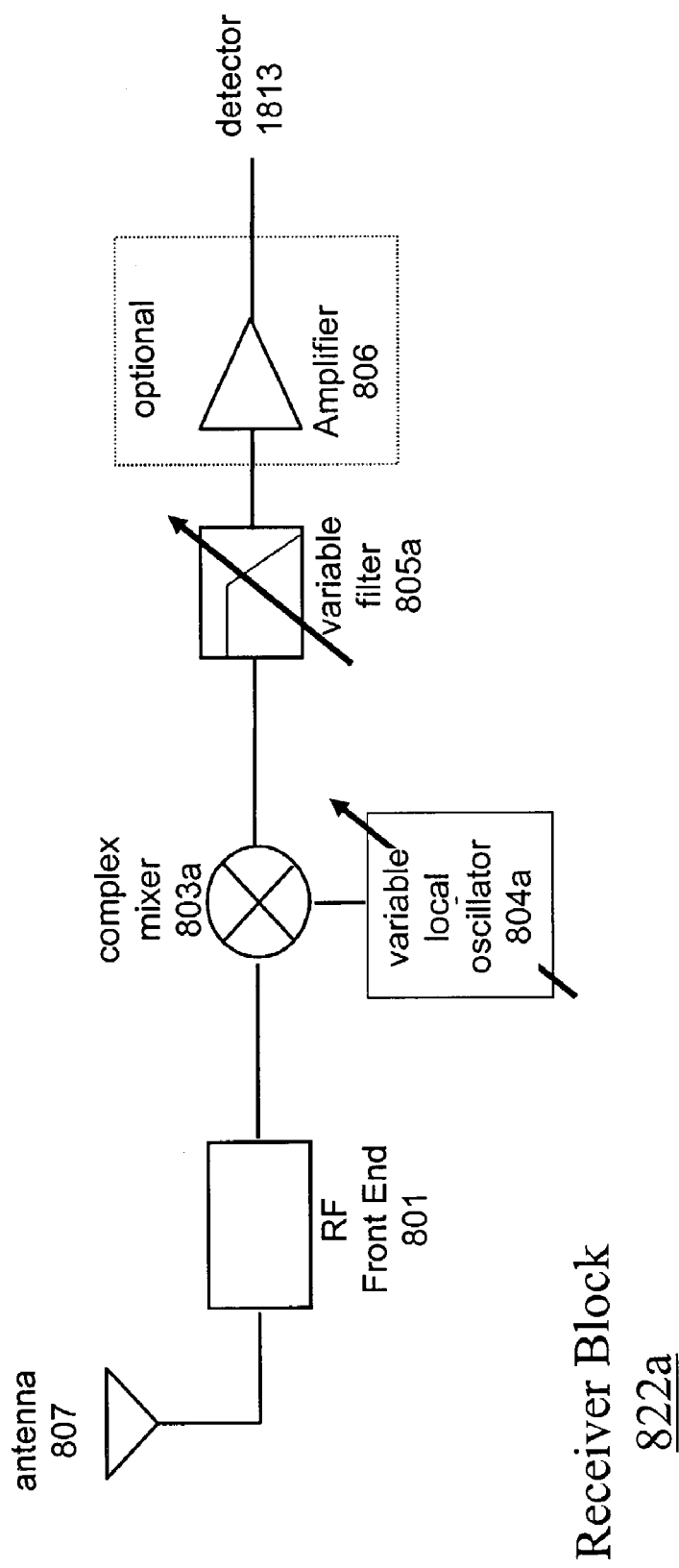
FIG. 33A shows a receiver block using a variable local oscillator and variable filter to receive and detect multi-band signals
Figure 33B:
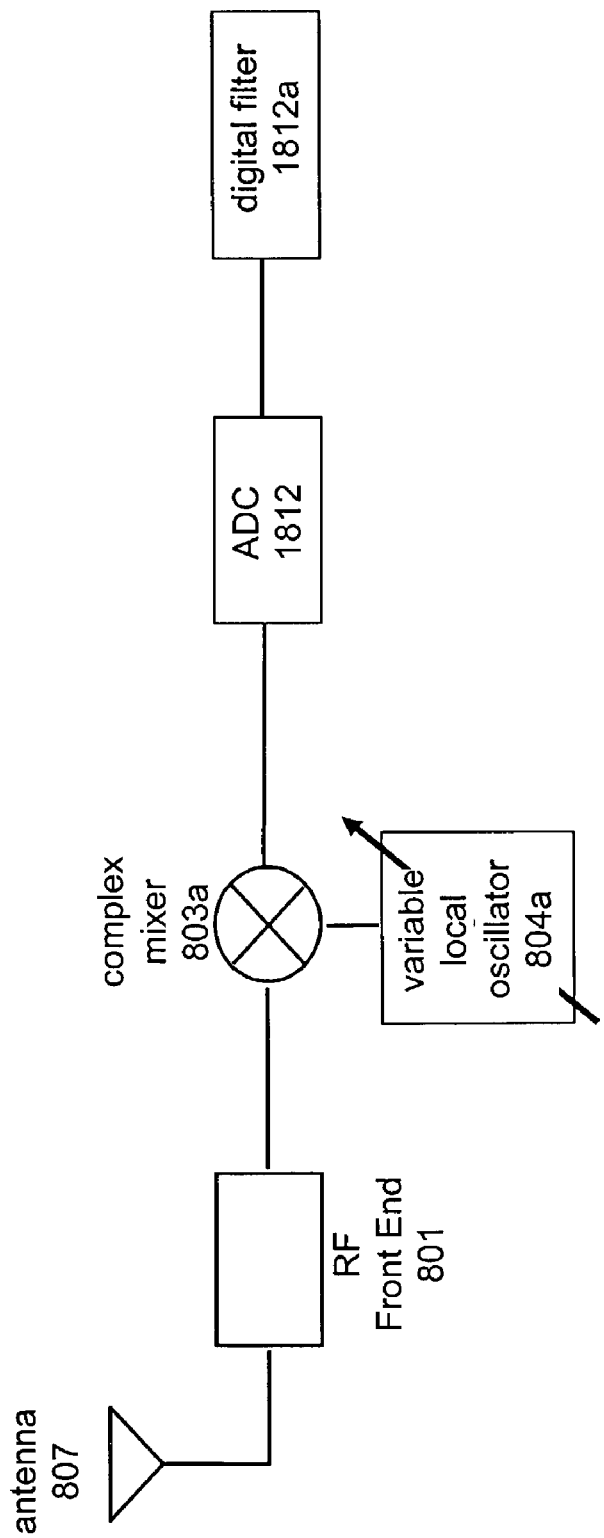
FIG. 33B shows a receiver block using a variable local oscillator and an ADC followed by a digital filter to receive and detect multi-band signals

The receiver structure in FIG. 23, shows a generic multi-band receiver. To accommodate the adaptive nature of the methods of flexibly adapting one or more sub-bands to an interference in a multi-band system, an embodiment of a receiver 822a based on FIGS. 23 and 30 is shown in FIG. 33A. After receiver front-end 801, complex mixer 803a is used with the variable local oscillator 804a to set the signal center frequency. Variable filter block 805a is used to set the bandwidth of the received channel. The output of the filter 805a can be amplified (e.g., by amplifier 806) and then go into the detector 1813. It is noted that the output of detector 1813 may be coupled to the configuration decision unit 7777 of FIG. 25 in accordance with several embodiments of the invention. If an ADC block is used as a detector, the variable filter and amplifier are optional as the signal can be filtered in digital logic, as shown in the receiver 822c FIG. 33B. The ADC block 1812 and digital filter block 1812a are used to set the filter width. Previously described are the methods for synchronizing the transmitter and receiver by communicating the transmitter center frequencies and occupied spectrums.

Figure 34:
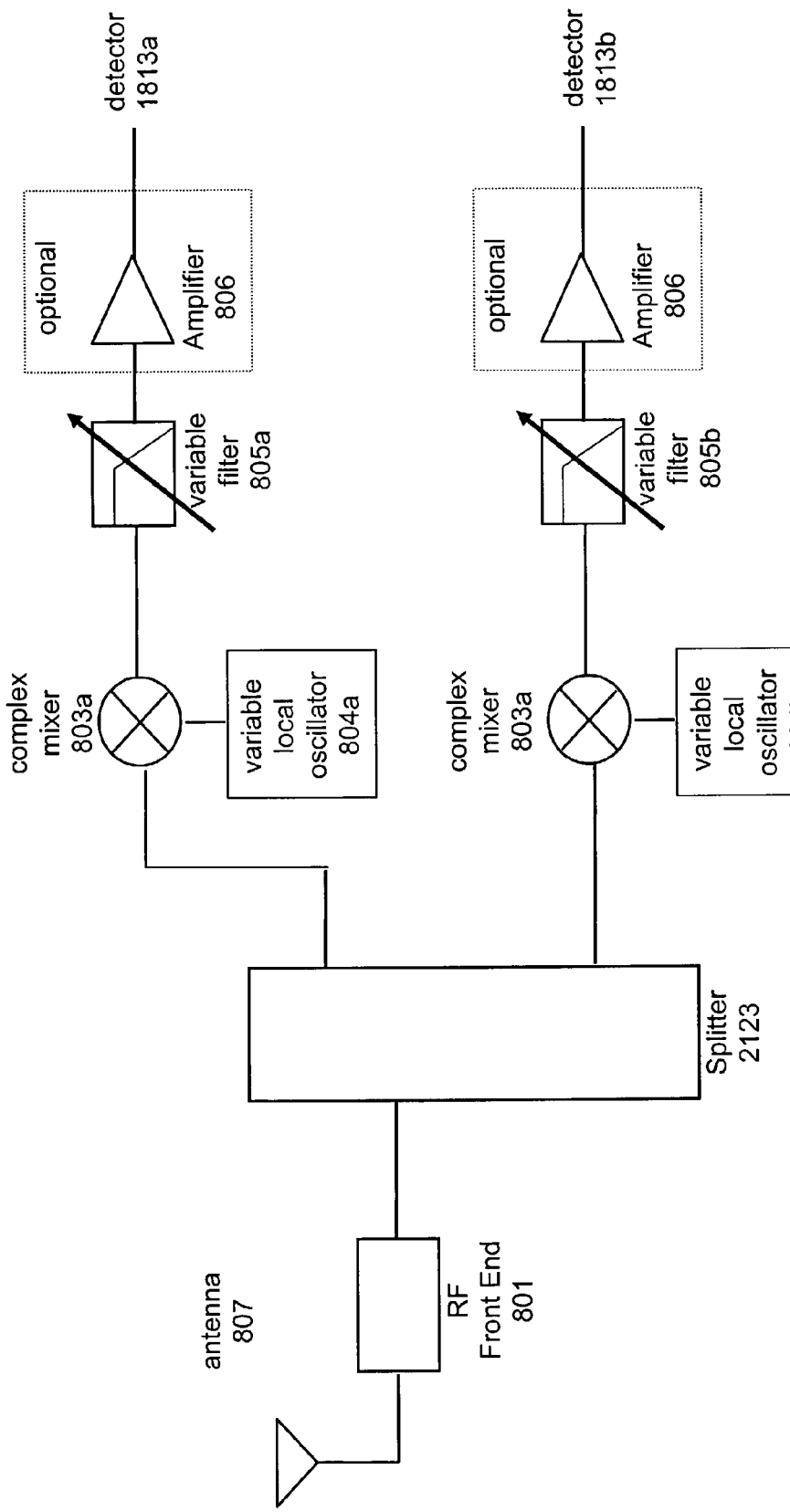
FIG. 34 shows a receiver block using a splitter followed by a variable filter to receive and detect multi-band signals

FIG. 34 is another receiver 822b structure. After the signal is received by the front-end block 801, splitter 2123 passes the signal to multiple receive chains of down-converters (e.g., complex mixers 803a, variable local oscillators 804) and detectors (e.g., variable filters 805, optional amplifiers 806 and detectors 1813), or as stated above, may bypass the down-converter components and go directly to detectors such as ADCs. Motivation for using a splitter is if a single oscillator can not switch fast enough to allow for the rapid detection of the incoming signal.

Similar to the embodiments described above, the frequency sub-band modifications or channel configuration changes may be implemented in the configuration decision unit 7777 of FIG. 25. Likewise, the interference detector 7782 is used to detect the presence of an interfering signal and the interference compensator 7784 determines the appropriate modification to the channel configuration (e.g., according to FIGS. 35-40).

According to several embodiments of methods for detecting an interfering signal in a frequency band and compensating for the interference (e.g., by appropriately modifying the interfered band), the interference compensator (e.g., compensator 7784) should also know additional information about the interfering signal in order to make a good decision as to a new channel configuration. For example, in some embodiments, the compensator should know an estimate of the center frequency of the interfering signal. Knowledge of the center frequency of the interfering signal is especially helpful in determining which of the flexible approaches to operating in the presence of the interfering signal, such as described with reference to FIGS. 35-40, are most appropriate (assuming the compensator may choose between more than one compensation technique). The center frequency of the interfering signal may be determined in a number of ways known in the art.

The following are methods for determining the center frequency of an interfering signal; however, these methods may also be used for both interference detection of a narrowband interference and estimation of the interference frequency (center frequency) within each signaling band. Thus, in many embodiments, the following methods may be implemented in an interference detector, such as variously described herein. Alternatively, each method can be used only to identify the narrowband frequency subsequent to initial detection of interference by another interference detection method.

Figure 41:
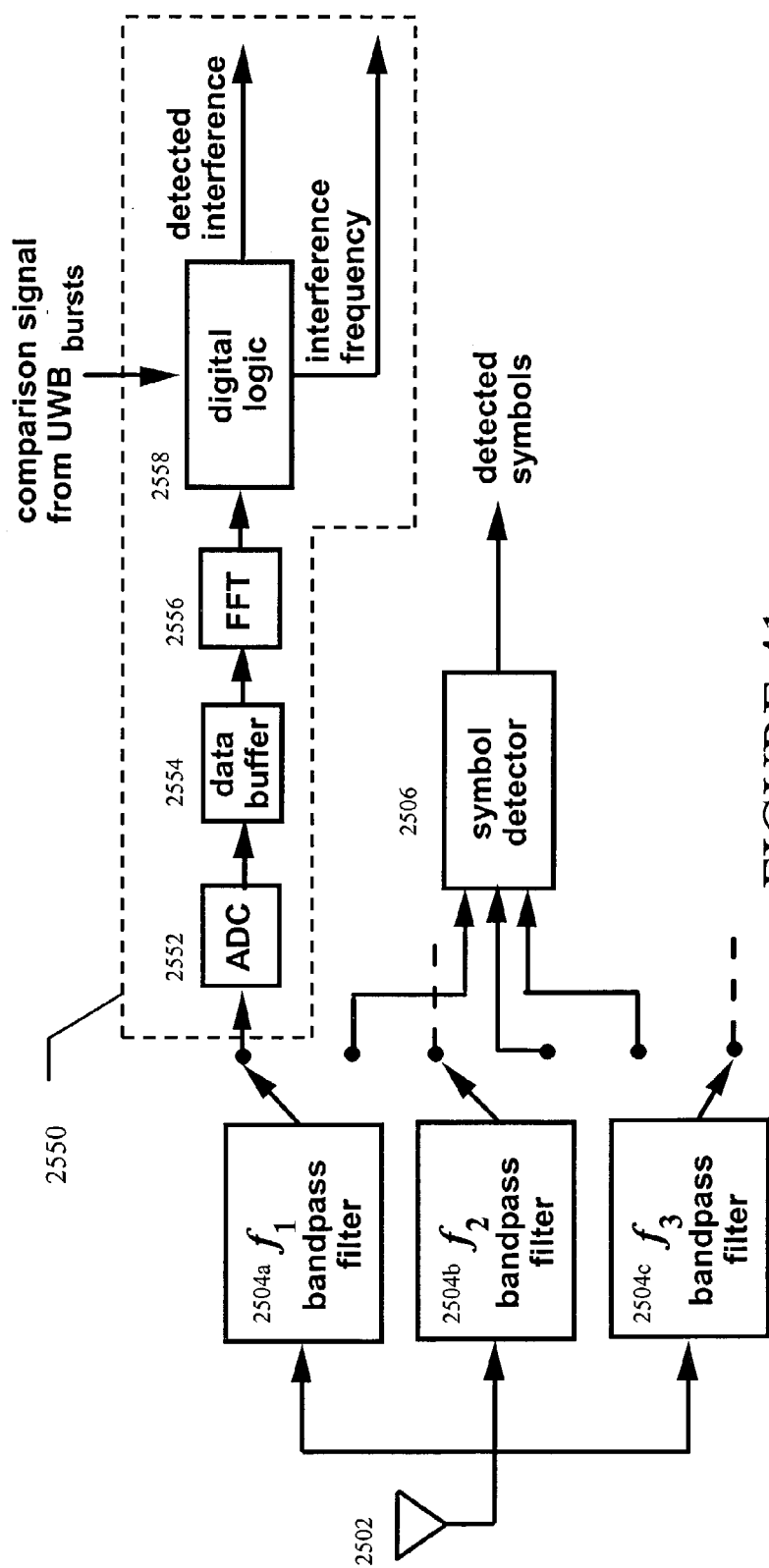
FIG. 41 illustrates a method for detection and characterization of narrowband interference in each signaling frequency band using digital signal processing.

FIG. 41 illustrates a method for detection and characterization of narrowband interference in each signaling frequency band using digital signal processing. Similar to the embodiment of FIG. 29, the output of bandpass filters 2504 is switched between the input of the symbol detector 2506 and an interference detector 2550. A switch sends the signal into an ADC 2552 to digitize during the interval in between the expected symbol (e.g., in between clusters of bursts). The data rate for the ADC 2552 can be limited to slightly more than twice the bandwidth of the signaling band. Data is stored in a buffer 2554, then an FFT 2556 is applied to compute the spectrum directly. Alternatively, the ADC 2552 and digital FFT 2556 could be replaced by an optical FFT process. Digital logic 2558 is applied to determine the frequency or frequencies at which narrowband interference sources are present. For example, a threshold value can be computed from energy calculations performed during the interval signaling is expected. A frequency(s) for which the spectrum exceeds this threshold would be designated a narrowband interference frequency(s). The interference detector 2550 outputs the detected interference, as well as the center frequency (interference frequency) of the interference.

Figure 42:
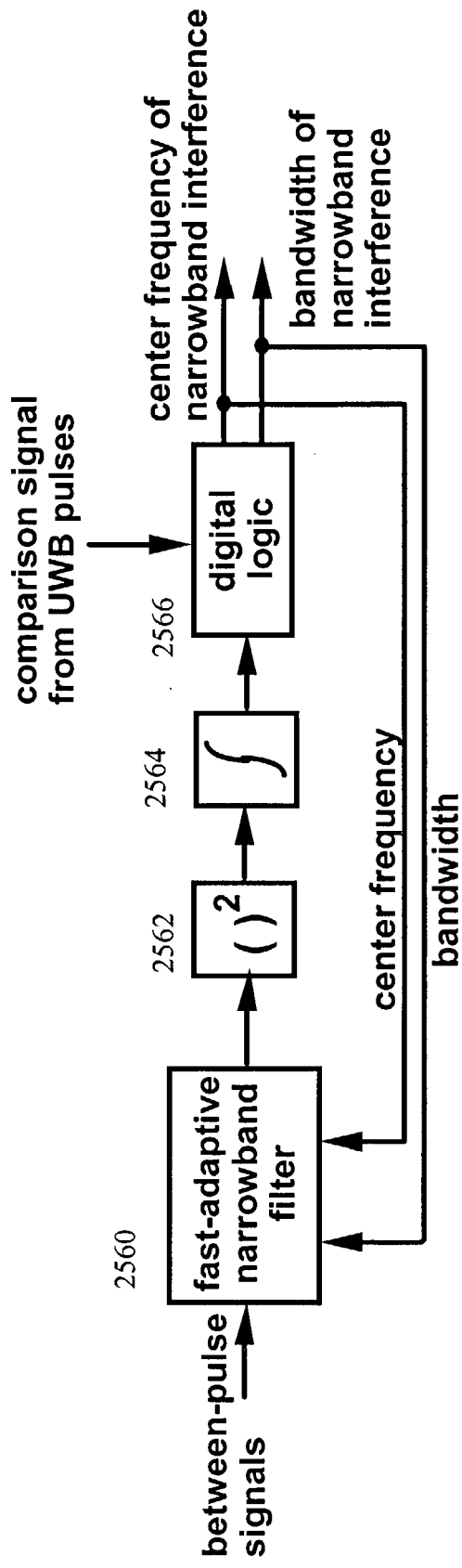
FIG. 42 shows a block diagram of an alternative embodiment of the interference detector of FIG. 41.

FIG. 42 shows a block diagram of an alternative embodiment of the interference detector of FIG. 41 to both detect and characterize a narrowband interference source. Filter 2560 is coupled to a square block 2562, which is coupled to an integrator 2564, which is coupled to digital logic 2566. The output of the digital logic 2566 is fed back to the filter 2560. The fast adaptive narrowband filter 2560 represents a high-Q filter which can adapt its center frequency or its bandwidth or both based on signals fed from digital logic

Figure 43:
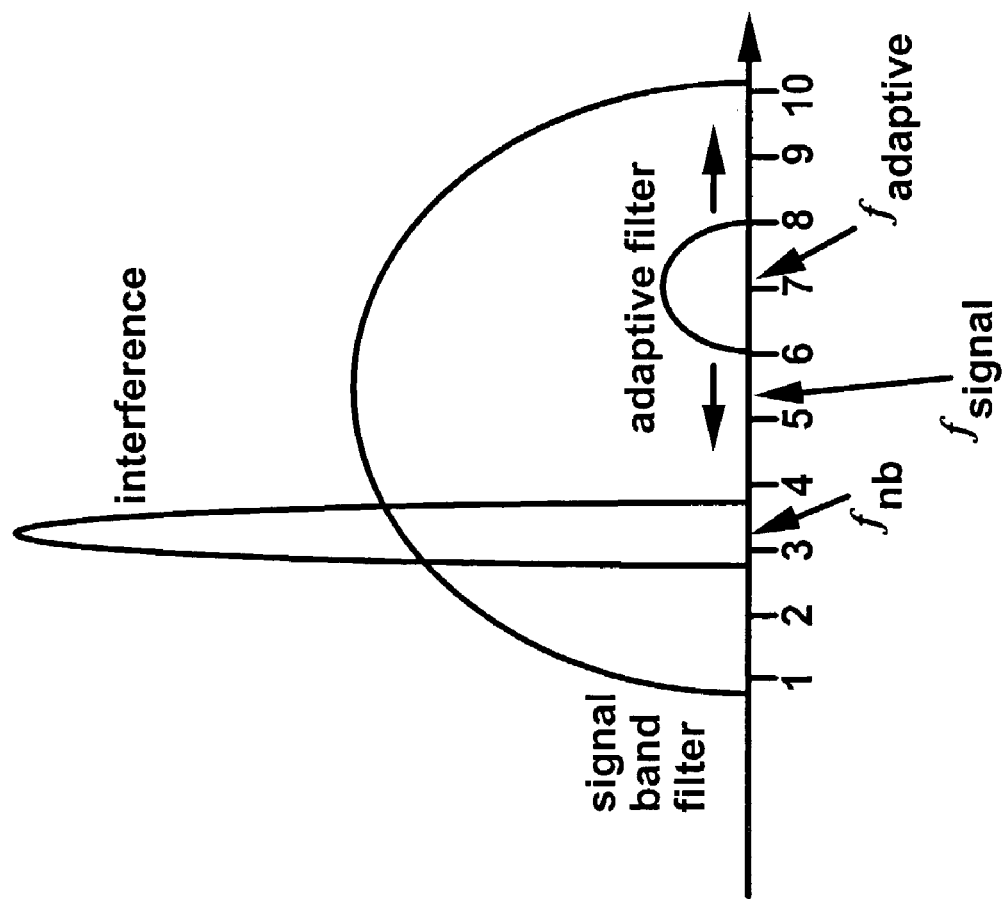
FIG. 43 illustrates a narrowband interference source within a signaling band for one of the frequency bursts used in a wideband signaling scheme.

2566. FIG. 43 illustrates a narrowband interference source at $f_{nb}$ within the signaling band for one of the frequency bursts used in the ultra-wideband signaling. The signal band filter shown is centered at the signaling frequency $f_{signal}$ and attenuates this signal a small amount, depending on the relative location of the narrowband and signaling frequencies. The center frequency $f_{signal}$ of the adaptive filter is moved according to the input specified by the digital logic. Upon each movement, a calculation of signal energy through the adaptive filter 2560 is performed in FIG. 42 (e.g., by blocks 2562 and 2564) and this value is passed to the digital logic 2566. The logic used to determine how to modify the adaptive filter center frequency and bandwidth is also based on a comparison signal which provides an estimate of signal energy intended to be received during intervals of burst reception.

Various designs can be used to implement a filter circuit which can have its bandwidth controlled by a voltage signal. For example, a (active) state variable filter can be constructed to maintain constant center frequency while changing bandwidth with a voltage controlled resistor; a so-called biquad filter can be constructed to maintain a fixed bandwidth while changing center frequency with a voltage controlled resistor; a filter with programmable center frequency and bandwidth can be constructed using both voltage controlled resistors and capacitors (e.g. varactor diodes).

Figure 44:
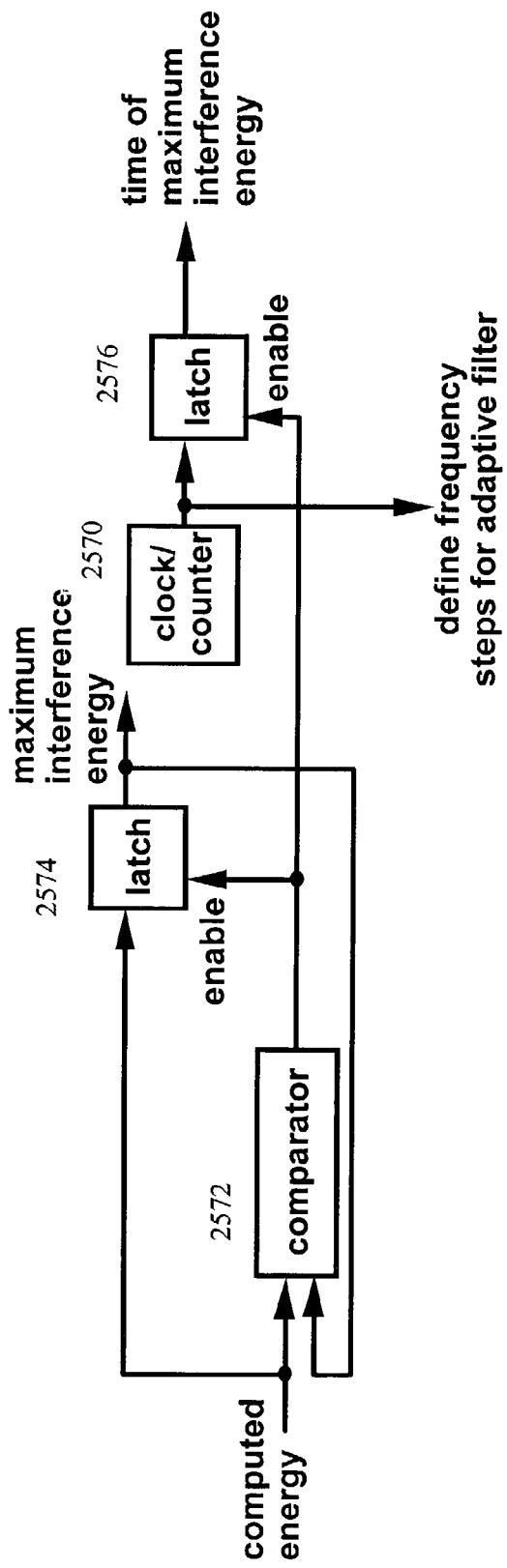
FIG. 44 illustrates a method for identifying the narrowband interference center frequency within the resolution of the selected frequency step size.

A number of algorithms can be used within the digital logic 2566 block to define the center frequency and bandwidth for the adaptive bandpass filter 2560. For example, a systematic search of a discrete number of center frequencies (e.g. see numbering 1 through 10 in FIG. 43) can be used to find a center frequency with maximum energy content. A more precise estimate of center frequency can then be obtained by maximizing energy received (again, as measured by the energy calculation circuit) subject to a one-frequency-step constraint on frequency change. With sufficient processing power (e.g. with a microprocessor as the digital logic block), the entire process can be done with any number of search and optimization algorithms. Alternatively, methods with varying levels of sophistication (and correspondingly varying component counts) can be implemented using discrete logic components. FIG. 44 illustrates a crude method for identifying the narrowband interference center frequency within the resolution of the selected frequency step size (e.g. steps 1 to 10 in FIG. 6). A clock and counter 2570 is used to step the center frequencies of the adaptive filter over the signaling band. At each center frequency, a comparator 2572 determines whether the newly computed energy (from blocks 2562 and 2564) is the new maximum and, if so, updates both the max value of energy (stored in latch 2574) and the current setting from the clock/counter 2570 used to define the stepping in frequency. The time value stored in the 2nd latch 2576 defines the frequency at which the maximum energy occurred. Variations on this approach can be used to find the top N most interfering frequencies in case there exists more than one narrowband interference source.

Other variations on this algorithm are possible. For example, a cruder initial search of frequencies is possible with a broader bandwidth adaptive filter response. This can be followed by a finer search over the subband selected as being interfering by narrowing the bandwidth of the adaptive filter. Alternatively, a search for peak energy response can be done by using a finer variation of center frequency with the broader fixed bandwidth filter response.

Figure 45:
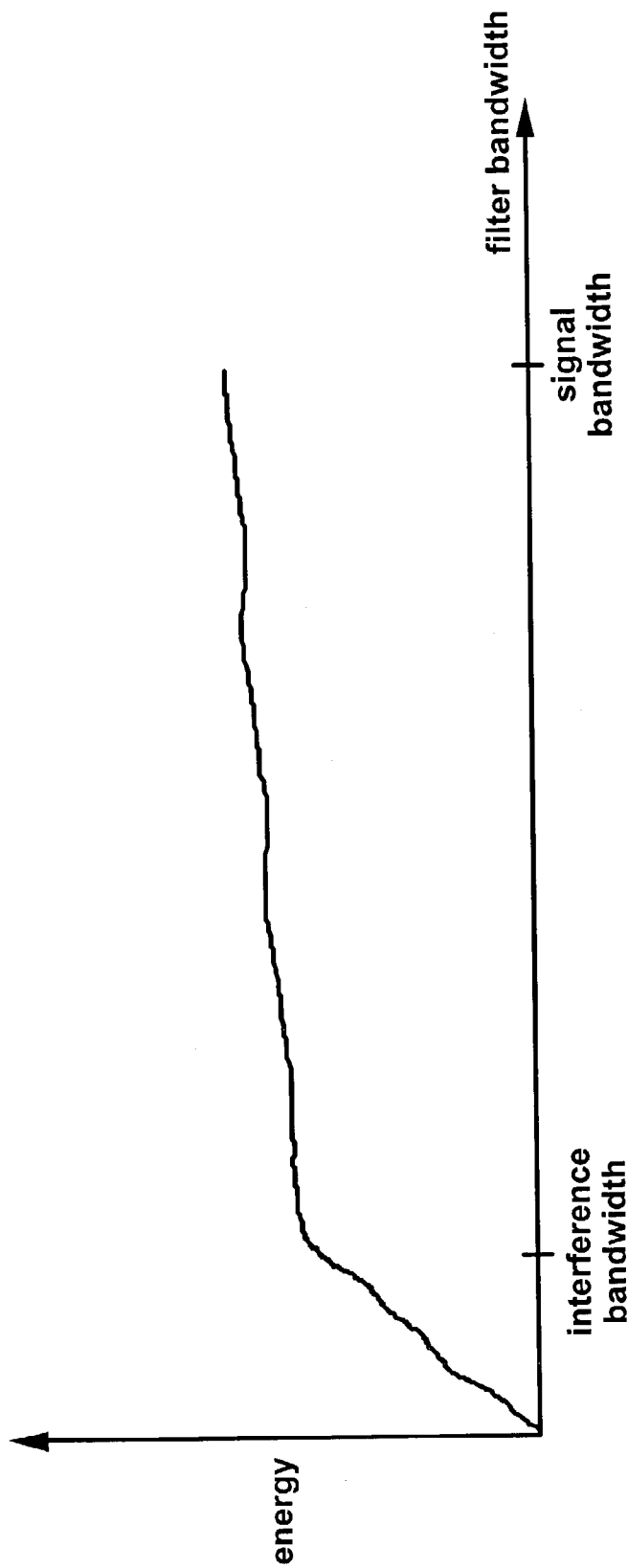
FIG. 45 shows an illustration of a technique for determining a center frequency of a detected interference.

The bandwidth of the interference can be determined in a number of ways. One way is to simply select a fixed bandwidth which is typical of standard broadband communications channels. This bandwidth is still a relatively small fraction of the UWB signaling bandwidth. Alternatively, if there is sufficient processing power in the digital logic block, then once the interference center frequency is found the bandwidth can be increased until a significant change in slope of the bandwidth versus energy curve is detected. FIG. 45 shows an illustration of this approach. While the bandwidth of the adaptive filter is less than the interference bandwidth, increases in adaptive filter bandwidth will show large increases in received energy. Once the adaptive filter captures all of the narrowband interference, the energy increase will be due only to the desired signal energy and thus will increase much more slowly.

The foregoing presentation of the described embodiments is provided to enable any person skilled in the art to make or use the invention as claimed. Various modifications to these embodiments are possible, and the generic principles presented herein may be applied to other embodiments as well. Communications and implementation principles as described herein may be applied to communications over wired, wireless (e.g. guided and/or free space), and/or optical (e.g. guided (for example, in a fiber) and/or free space) transmission channels, at frequencies including but not limited to radio frequency, microwave, millimeter-wave, and optical.

It is further noted that although many of the embodiments described herein are in the context of a multi-band system transmitting and receiving wideband and/or ultra-wideband signaling in multiple wideband and/or ultra-wideband frequency bands, the methods and corresponding apparatus presented herein may be implemented in systems using narrowband signaling. For example, systems using signaling in which the bandwidth of the multiple frequency bands is less than 2%, typically significantly less than 2% of the center frequency of the respective frequency band.

The invention may be implemented in part or in whole as a hard-wired circuit and/or as a circuit configuration fabricated into an application-specific integrated circuit. The invention may also be implemented in part or in whole as a firmware program loaded into non-volatile storage (e.g. ROM or flash or battery-backup RAM) or a software program loaded from or into a data storage medium (for example, a read-only or rewritable medium such as a semiconductor or ferromagnetic memory (e.g. ROM, programmable ROM, dynamic RAM, static RAM, or flash RAM); or a magnetic, optical, or phase-change medium (e.g. a floppy, hard, or CD or DVD disk)) as machine-readable code, such code being instructions executable by an array of logic elements such as a microprocessor or other digital signal processing unit or an FPGA.

In some cases, for example, the design architecture for a receiver including interference detection and compensation methods according to an embodiment of the invention may be realized in an integrated circuit device, such as an application-specific integrated circuit (ASIC). Such a design may be implemented as a stand-alone packaged device, or embedded as a core in a larger system ASIC. Features of an architecture according to certain such embodiments of the invention lend themselves well to an ASIC implementation that enables low cost, low power, and/or high volume production. Embodiments of the invention may include designs that are scalable with evolving semiconductor technologies, enabling increased performance objectives and expanded applications. In some cases an entire such architecture may be implemented in a single semiconductor process, although even in these cases it may be possible to transfer the design to multiple semiconductor technologies rather than to depend on a single semiconductor process.

Many of the functional blocks illustrated herein are capable of performing steps as illustrated in many of the flow diagrams. It should be understood that the functional blocks may be discrete processing components or may be integrated with other functional blocks in physical structure. It is further understood that the order of operation of many functional blocks may be altered and still properly perform the functionality specified therein.

Thus, the present invention is not intended to be limited to the embodiments shown above but rather is to be accorded the widest scope consistent with the principles and novel features disclosed in any fashion herein.

What is claimed is:

1. A method of operation in a multi-frequency band system in the presence of an interference, the method comprising:

receiving signaling in a plurality of wideband frequency sub-bands, each wideband frequency sub-band having a different center frequency, wherein a bandwidth of each wideband frequency sub-band is at least 2 percent of a center frequency of the wideband frequency sub-band;

detecting an interfering signal having signal energy in a portion of a respective sub-band of the wideband frequency sub-bands;

deciding to discontinue use of the respective sub-band; and instructing a transmitting device transmitting the signaling to transmit subsequent signaling in any except the respective sub-band of the plurality of wideband frequency sub-bands.

2. The method of claim 1 wherein the receiving step comprises:

receiving the signaling in the plurality of the wideband frequency sub-bands, wherein a symbol is encoded in the time dependence of the signaling across the plurality of the wideband frequency sub-bands, the symbol corresponding to data.

3. The method of claim 1 wherein the detecting step comprises:

estimating an error in signaling received in the respective sub-band; and declaring the narrowband interfering signal in the respective sub-band based on the error.

4. The method of claim 1 wherein the detecting step comprises:

tracking symbol errors occurring in the respective sub-band; and declaring the interfering signal in the respective sub-band based on the symbol errors.

5. The method of claim 4 wherein the detecting step further comprises:

estimating a probability that the symbol errors in the respective sub-band are due to the interfering signal;

wherein the declaring step comprises:

declaring the interfering signal in the respective sub-band based on the probability.

6. The method of claim 1 wherein the detecting step comprises:

determining the presence of excess signal energy within the respective sub-band during a time period when signaling is not to be received in the respective sub-band; and declaring the narrowband interfering signal in the respective sub-band based on the presence of the excess signal energy.

7. The method of claim 1 wherein the instructing step comprises:

instructing the transmitting device to transmit the subsequent signaling in any sub-band except the respective sub-band of the plurality of wideband frequency sub-bands, replacing the respective sub-band with an additional wideband frequency sub-band.

8. The method of claim 1 wherein the instructing step comprises:

instructing the transmitting device to transmit the subsequent signaling in any sub-band except the respective sub-band of the plurality of wideband frequency sub-bands, the respective sub-band not replaced with an additional sub-band.

9. The method of claim 1 further comprising:

determining that the respective sub-band no longer includes the interfering signal; and instructing the transmitting device to transmit the subsequent signaling in any sub-band of the plurality of ultra-wideband frequency sub-bands.

10. The method of claim 1 further comprising:

maintaining channel state information including two or more of available sub-bands, sub-bands in use, and interfered sub-bands.

11. The method of claim 10 further comprising:

updating the channel state information in response to the detecting the interference step.

12. The method of claim 11 wherein the instructing the transmitting device step comprises:

transmitting the channel state information having been updated to the transmitting device.

13. The method of claim 10 wherein the channel state information further includes one or more of a modulation type, a coding rate, a data rate and a sub-band bandwidth.

14. The method of claim 1 wherein the instructing the transmitting device step comprises:

transmitting channel state information identifying the respective sub-band as including the interfering signal to the transmitting device in the respective sub-band including the interfering signal.

15. The method of claim 14 wherein the transmitting the channel state information comprises:

transmitting a first signal in the respective sub-band including the interfering signal during a first symbol period;

transmitting a second signal in the respective sub-band including the interfering signal during a second symbol period; and transmitting a third signal in an available sub-band during the second symbol period;

wherein the transmitting device is able to determine which sub-bands of the plurality of wideband frequency sub-bands to transmit the subsequent signaling in.

16. The method of claim 1 wherein the instructing the transmitting device step comprises:

transmitting channel state information to the transmitting device, the channel state information comprising available sub-bands out of the plurality of wideband frequency sub-bands.

17. The method of claim 1 wherein the instructing the transmitting device step comprises:

transmitting channel state information to the transmitting device, the channel state information comprising sub-bands in use out of the plurality of wideband frequency sub-bands.

18. The method of claim 1 wherein the instructing the transmitting device step comprises:

transmitting channel state information to the transmitting device, the channel state information comprising interfered sub-bands out of the plurality of wideband frequency sub-bands.

19. The method of claim 1 wherein the receiving the signaling comprises:

receiving the signaling in a plurality of ultra-wideband frequency sub-bands, wherein the bandwidth of each ultra-wideband frequency sub-band is at least 20 percent of the center frequency of the ultra-wideband frequency sub-band.

20. A multi-frequency band receiver for operating in the presence of an interference, the receiver comprising:

a signal detector configured to receive signaling in a plurality of wideband frequency sub-bands, each wideband frequency sub-band having a different center frequency, wherein a bandwidth of each wideband frequency sub-band is at least 2 percent of a center frequency of the wideband frequency sub-band;

an interference detector coupled to the signal detector and configured to detect an interfering signal having signal energy in a portion of a respective sub-band of the wideband frequency sub-bands; and an interference compensator coupled to the interference detector and configured to decide to discontinue use of the respective sub-band;

the interference compensator configured to determine that subsequent signaling is to be transmitted by a transmitting device in any sub-band except the respective sub-band of the plurality of wideband frequency sub-bands.

21. The receiver of claim 20 wherein the signal detector is configured to receive the signaling in a plurality of ultra-wideband frequency sub-bands, wherein a bandwidth of each wideband frequency sub-band is at least 20 percent of a center frequency of the ultra-wideband frequency sub-band.

22. The receiver of claim 20 wherein the signal detector is configured to receive the signaling, wherein a symbol is encoded in the time dependence of the signaling across the plurality of the wideband frequency sub-bands, the symbol corresponding to data.

23. A method of communicating channel state information to a transmitting device, the method comprising:

obtaining channel configuration information, the channel configuration information indicating that a respective sub-band of a plurality of wideband frequency sub-bands includes an interfering signal having signal energy in a portion of a respective sub-band, wherein signaling occurs over the plurality of wideband frequency sub-bands between a transmitting device and a receiving device, wherein each wideband frequency sub-band has a different center frequency, wherein a bandwidth of each wideband frequency sub-band is at least 2 percent of a center frequency of the wideband frequency sub-band;

transmitting a first signal in the respective sub-band including the interfering signal during a first symbol period to the transmitting device; transmitting a second signal in the respective sub-band including the interfering signal during a second symbol period to the transmitting device; and transmitting a third signal in an available sub-band not presently being used for the signaling during the second symbol period to the transmitting device;

wherein the transmitting device is able to determine which sub-bands of the plurality of wideband frequency sub-bands to transmit the subsequent signaling in, based upon receipt of the first signal, the second signal and the third signal.

24. The method of claim 1 wherein the signaling comprises at least one symbol distributed over two or more of the plurality of wideband frequency sub-bands.

25. The method of claim 1 wherein the signaling in the plurality of wideband frequency sub-bands is from the transmitting device and together represents a communication.

26. The receiver of claim 20 wherein the signaling comprises at least one symbol distributed over two or more of the plurality of wideband frequency sub-bands.

27. The receiver of claim 20 wherein the signaling in the plurality of wideband frequency sub-bands is from the transmitting device and together represents a communication.

28. The method of claim 23 wherein the subsequent signaling comprises at least one symbol is distributed over at least two of the plurality of wideband frequency sub-bands.

29. The method of claim 23 wherein the subsequent signaling comprises signaling in the plurality of wideband frequency sub-bands from the transmitting device and together represents a communication.

* * * * *